US011041891B2

(12) United States Patent
Mizusaki

(10) Patent No.: US 11,041,891 B2
(45) Date of Patent: Jun. 22, 2021

(54) LIQUID CRYSTAL DEVICE, METHOD FOR MEASURING RESIDUAL DC VOLTAGE IN LIQUID CRYSTAL DEVICE, METHOD FOR DRIVING LIQUID CRYSTAL DEVICE, AND METHOD FOR MANUFACTURING LIQUID CRYSTAL DEVICE

(71) Applicant: Sharp Kabushiki Kaisha, Sakai (JP)

(72) Inventor: Masanobu Mizusaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 116 days.

(21) Appl. No.: 16/464,312

(22) PCT Filed: Nov. 17, 2017

(86) PCT No.: PCT/JP2017/041529
§ 371 (c)(1),
(2) Date: May 28, 2019

(87) PCT Pub. No.: WO2018/101089
PCT Pub. Date: Jun. 7, 2018

(65) Prior Publication Data

US 2019/0383863 A1 Dec. 19, 2019

(30) Foreign Application Priority Data

Nov. 29, 2016 (JP) ............................ JP2016-230994

(51) Int. Cl.
*H01Q 3/34* (2006.01)
*H01Q 1/36* (2006.01)
(Continued)

(52) U.S. Cl.
CPC ......... *G01R 19/2503* (2013.01); *G01R 19/25* (2013.01); *H01L 27/12* (2013.01);
(Continued)

(58) Field of Classification Search
CPC ............ H01Q 1/364; H01Q 3/34; H01Q 1/36; H01Q 13/22; G01R 19/2503; G01R 19/25;
(Continued)

(56) References Cited

U.S. PATENT DOCUMENTS 7,466,269 B2 12/2008 Haziza
7,847,894 B2 * 12/2010 Rho .................. G02F 1/133555 349/114
(Continued)

FOREIGN PATENT DOCUMENTS

JP 2002-217640 A 8/2002
JP 2007-116573 A 5/2007
(Continued)

OTHER PUBLICATIONS

Stevenson et al., "Rethinking Wireless Communications: Advanced Antenna Design using LCD Technology", SID 2015 Digest, 55.2, 2015, pp. 827-830.
(Continued)

*Primary Examiner* — Hai V Tran
(74) *Attorney, Agent, or Firm* — Keating & Bennett, LLP

(57) ABSTRACT

A method for measuring a residual DC voltage in a liquid crystal device including an active region having a plurality of liquid crystal capacitors and a plurality of TFTs, and a non-active region positioned outside the active region and having at least one monitoring capacitor, in which the plurality of liquid crystal capacitors and the at least one monitoring capacitor include a liquid crystal layer. The method includes: generating a V-I curve by applying a positive and negative symmetrical triangular wave voltage measuring, in the V-I curve, a voltage Vmax having a maximum absolute value where a current value reaches a positive maximum value or minimum value, and a voltage Vmin having a maximum absolute value where a current
(Continued)

value reaches a negative minimum value or maximum value, and measuring one-half of the sum of the voltage Vmax and the voltage Vmin as the residual DC voltage.

8 Claims, 33 Drawing Sheets

(51) Int. Cl.
*G01R 19/25* (2006.01)
*H01L 27/12* (2006.01)
*H01Q 13/22* (2006.01)

(52) U.S. Cl.
CPC ...... *H01L 27/1255* (2013.01); *H01L 27/1259* (2013.01); *H01Q 1/36* (2013.01); *H01Q 1/364* (2013.01); *H01Q 3/34* (2013.01); *H01Q 13/22* (2013.01)

(58) Field of Classification Search
CPC .. H01L 27/1255; H01L 27/1259; H01L 27/12
USPC .......................................................... 343/703
See application file for complete search history.

(56) References Cited

U.S. PATENT DOCUMENTS

| | | | | |
|---|---|---|---|---|
| 8,208,081 | B2 * | 6/2012 | Kitayama | G09G 3/3614 349/38 |
| 10,637,141 | B2 * | 4/2020 | Inukai | H01Q 1/38 |
| 10,903,247 | B2 * | 1/2021 | Takahashi | G02F 1/1368 |
| 2002/0153920 | A1 * | 10/2002 | Lee | G09G 3/006 324/760.01 |
| 2012/0092577 | A1 | 4/2012 | Shi et al. | |
| 2012/0138922 | A1 | 6/2012 | Yamazaki et al. | |
| 2012/0194399 | A1 | 8/2012 | Bily et al. | |
| 2013/0320334 | A1 | 12/2013 | Yamazaki et al. | |
| 2014/0286076 | A1 | 9/2014 | Aoki et al. | |
| 2015/0255029 | A1 * | 9/2015 | Niikura | G06F 3/044 345/98 |
| 2018/0337446 | A1 * | 11/2018 | Nakazawa | H01Q 21/0087 |
| 2019/0190162 | A1 * | 6/2019 | Ohtake | G02F 1/1343 |

FOREIGN PATENT DOCUMENTS

| | | | |
|---|---|---|---|
| JP | 2007-295044 | A | 11/2007 |
| JP | 2009-538565 | A | 11/2009 |
| JP | 2012-134475 | A | 7/2012 |
| JP | 2013-539949 | A | 10/2013 |
| JP | 2014-007399 | A | 1/2014 |
| JP | 2014-209727 | A | 11/2014 |
| WO | 2007/139736 | A2 | 12/2007 |
| WO | 2012/050614 | A1 | 4/2012 |
| WO | 2014/149341 | A1 | 9/2014 |
| WO | 2015/126550 | A1 | 8/2015 |
| WO | 2015/126578 | A1 | 8/2015 |
| WO | 2016/057539 | A1 | 4/2016 |
| WO | 2016/130383 | A1 | 8/2016 |
| WO | 2016/141340 | A1 | 9/2016 |
| WO | 2016/141342 | A1 | 9/2016 |

OTHER PUBLICATIONS

Ando et al., "A Radial Line Slot Antenna for 12 GHz Satellite TV Reception", IEEE Transactions on Antennas and Propagation, vol. AP-33, No. 12, Dec. 1985, pp. 1347-1353.

Wittek et al., "Liquid Crystals for Smart Antennas and Other Microwave Applications", SID 2015 Digest, 55.1, 2015, pp. 824-826.

Kuki, "Novel RF Functional Devices Using Liquid Crystal", Polymer, vol. 55, Aug. 2006, pp. 599-602.

Nakazawa et al., "TFT Substrate, Scanning Antenna Using Same, and Method for Manufacturing TFT Substrate", U.S. Appl. No. 15/542,488, filed Jul. 10, 2017.

* cited by examiner

FIG. 2
(a)
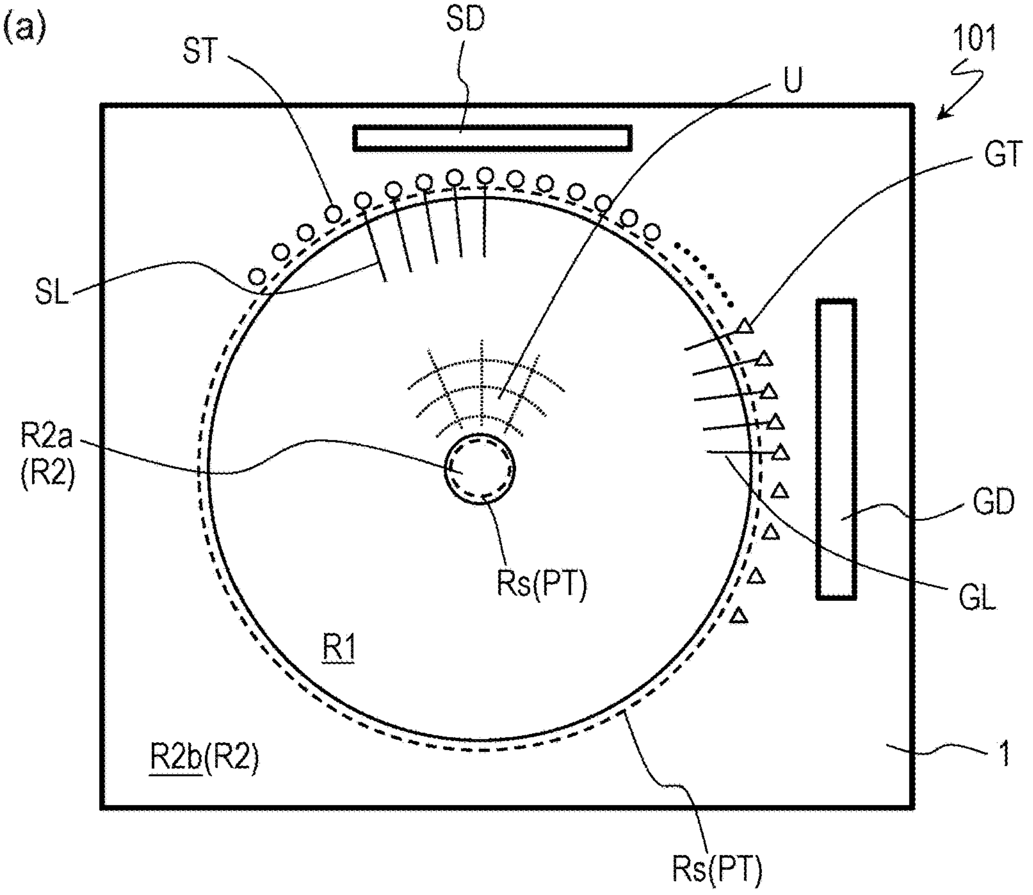
(b)
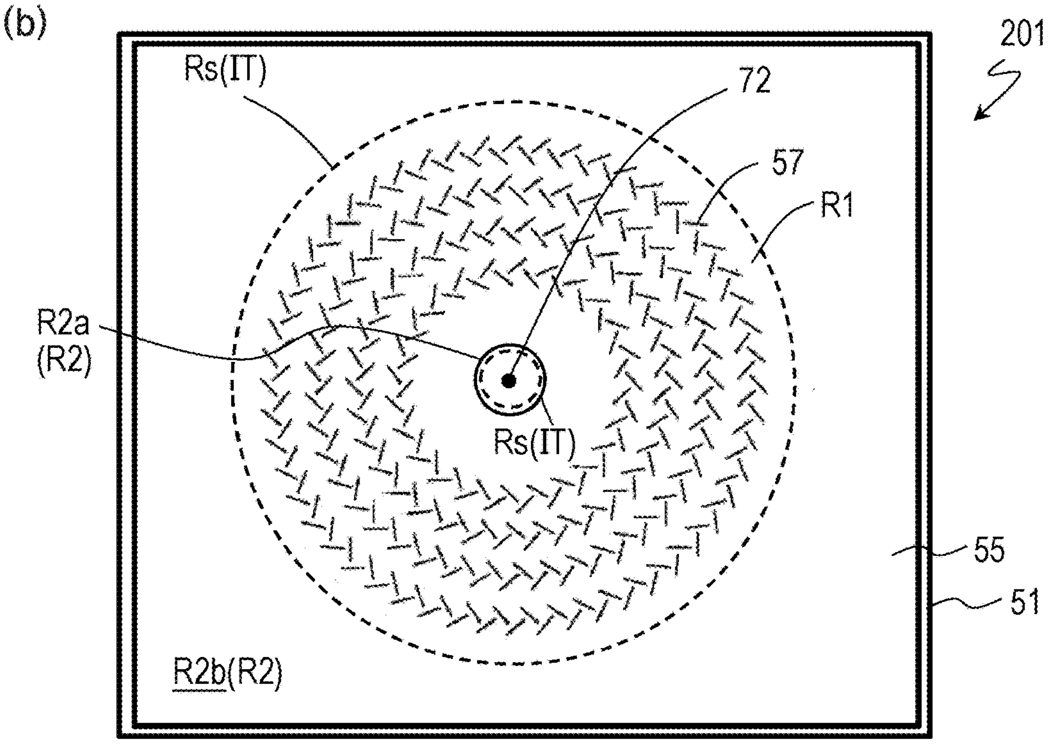

FIG. 5

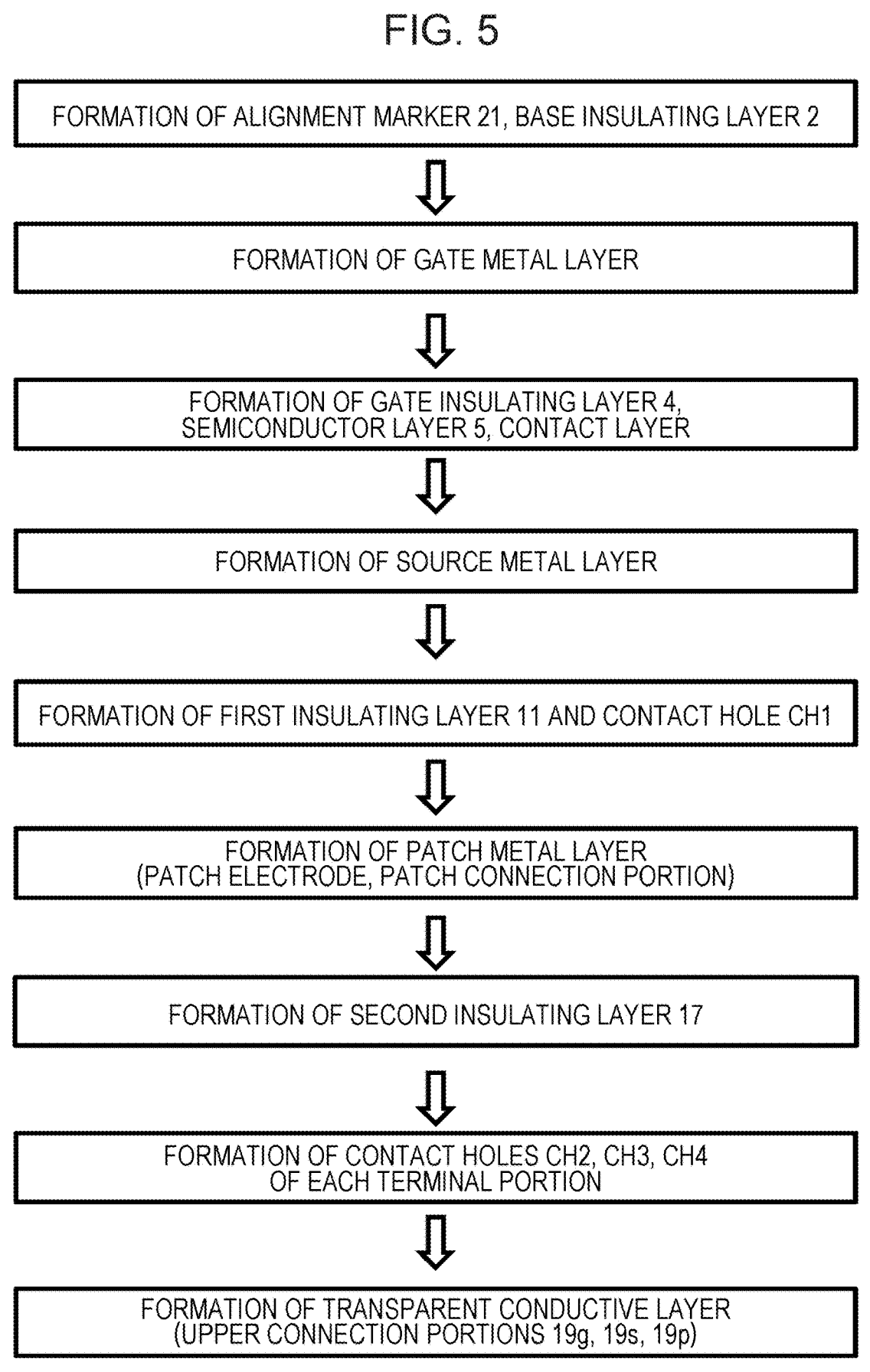

FORMATION OF ALIGNMENT MARKER 21, BASE INSULATING LAYER 2

⇩

FORMATION OF GATE METAL LAYER

⇩

FORMATION OF GATE INSULATING LAYER 4, SEMICONDUCTOR LAYER 5, CONTACT LAYER

⇩

FORMATION OF SOURCE METAL LAYER

⇩

FORMATION OF FIRST INSULATING LAYER 11 AND CONTACT HOLE CH1

⇩

FORMATION OF PATCH METAL LAYER (PATCH ELECTRODE, PATCH CONNECTION PORTION)

⇩

FORMATION OF SECOND INSULATING LAYER 17

⇩

FORMATION OF CONTACT HOLES CH2, CH3, CH4 OF EACH TERMINAL PORTION

⇩

FORMATION OF TRANSPARENT CONDUCTIVE LAYER (UPPER CONNECTION PORTIONS 19g, 19s, 19p)

(a)

(b)

FIG. 35
(a)
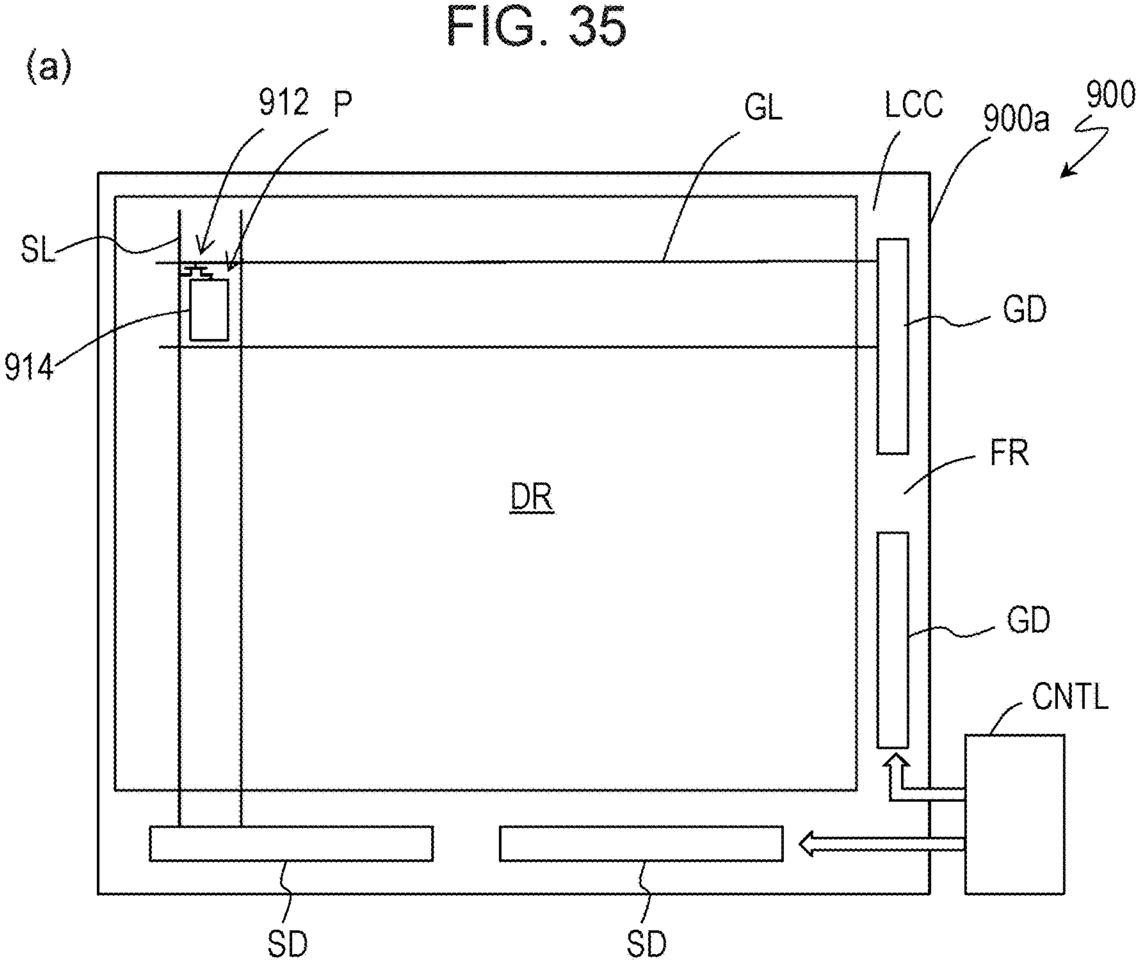
(b)
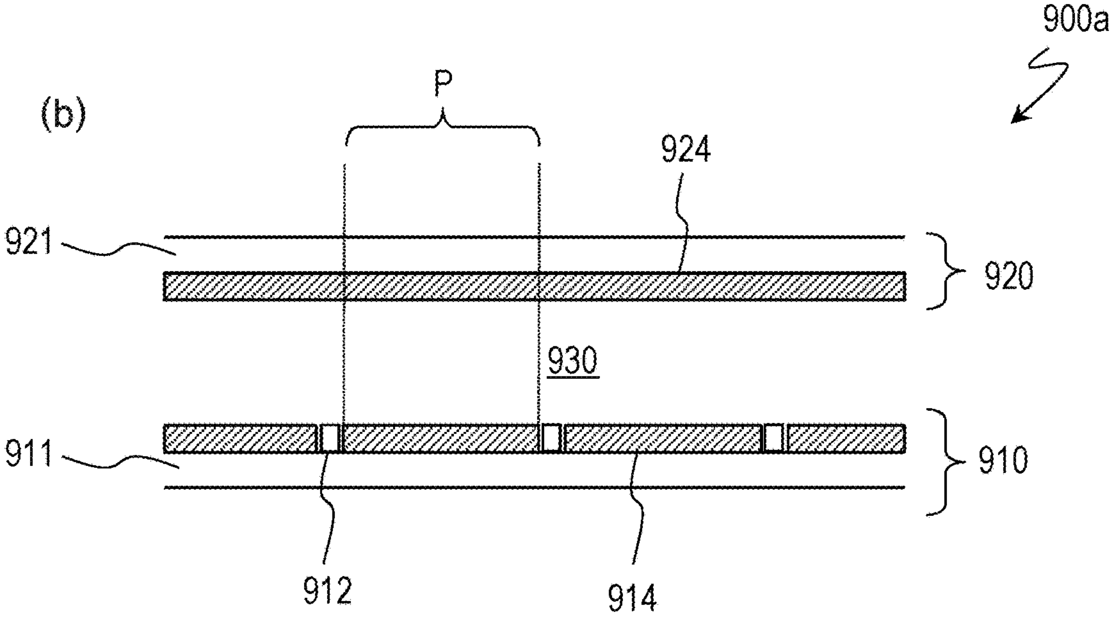

LIQUID CRYSTAL DEVICE, METHOD FOR MEASURING RESIDUAL DC VOLTAGE IN LIQUID CRYSTAL DEVICE, METHOD FOR DRIVING LIQUID CRYSTAL DEVICE, AND METHOD FOR MANUFACTURING LIQUID CRYSTAL DEVICE

TECHNICAL FIELD

The present invention relates to a liquid crystal device, a method for driving a liquid crystal device, and a method for manufacturing a liquid crystal device. Liquid crystal devices broadly include devices having liquid crystal capacitors, for example, a scanned antenna (also referred to as a "liquid crystal array antenna") in which an antenna unit (also referred to as an "element antenna") has a liquid crystal capacitor, and a liquid crystal display device.

BACKGROUND ART

Antennas for mobile communication and satellite broadcasting are required to have a function of being able to change beam direction (referred to as "beam scanning" or "beam steering"). A phased array antenna provided with an antenna unit is known as an antenna having such a function (referred to below as a "scanned antenna"). However, the phased array antenna of the related art is expensive, which is an obstacle to widespread use as a consumer product. In particular, as the number of antenna units increases, the cost rises remarkably.

Therefore, scanned antennas using the large dielectric anisotropy (birefringence) of a liquid crystal material (including a nematic liquid crystal and a polymer dispersed liquid crystal) have been proposed (refer to PTLs 1 to 5 and NPL 1). Since the dielectric constant of the liquid crystal material has frequency variance, in the present specification, the dielectric constant in the frequency band of microwaves (also referred to as "dielectric constant with respect to microwaves") is denoted as the "dielectric constant M (E)" in particular.

PTL 3 and NPL 1 describe that it is possible to obtain an inexpensive scanned antenna by using the technology of a liquid crystal display device (referred to below as "LCD").

CITATION LIST

Patent Literature

PTL 1: Japanese Unexamined Patent Application Publication No. 2007-116573

PTL 2: Japanese Unexamined Patent Application Publication No. 2007-295044

PTL 3: Japanese Unexamined Patent Application Publication (Translation of PCT Application) No. 2009-538565

PTL 4: Japanese Unexamined Patent Application Publication (Translation of PCT Application) No. 2013-539949

PTL 5: International Publication No. 2015/126550

Non Patent Literature

NPL 1: R. A. Stevenson et al., "Rethinking Wireless Communications: Advanced Antenna Design using LCD Technology", SID 2015 DIGEST, pp. 827-830.

NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY OF INVENTION

Technical Problem

Although the idea of realizing an inexpensive scanned antenna by applying LCD technology as described above is known, there is no literature specifically describing a structure of a scanned antenna using LCD technology, a manufacturing method thereof, and a driving method thereof.

Therefore, one embodiment according to the present invention has an object of providing a scanned antenna which is able to be mass-produced using the LCD manufacturing technology of the related art and a manufacturing method thereof. Another embodiment of the present invention has an object of suppressing deterioration in the characteristics or reliability of a liquid crystal device having a relatively large change in residual DC voltage of, for example, a scanned antenna or the like. Yet another embodiment of the present invention has an object of providing a method for electrically and quantitatively measuring residual DC voltages.

Solution to Problem

According to an embodiment of the present invention, there is provided a method for measuring a residual DC voltage in a liquid crystal device including a first substrate, a second substrate, a liquid crystal layer provided between the first substrate and the second substrate, a seal portion surrounding the liquid crystal layer, an active region having a plurality of liquid crystal capacitors and a plurality of TFTs each connected to one of the plurality of liquid crystal capacitors, and a non-active region positioned in a region outside the active region and having at least one monitoring capacitor, the plurality of liquid crystal capacitors and the at least one monitoring capacitor including the liquid crystal layer, the method including a step of generating a V-I curve by applying a positive and negative symmetrical triangular wave voltage to one of a pair of electrodes of the at least one monitoring capacitor and measuring a current flowing through the other of the pair of electrodes; a step of measuring, in the V-I curve, a voltage Vmax having a maximum absolute value where a current value reaches a positive maximum value or minimum value, and a voltage Vmin having a maximum absolute value where a current value reaches a negative minimum value or maximum value; and a step of measuring one-half of the sum of the voltage Vmax and the voltage Vmin as the residual DC voltage.

In one embodiment, an area of a portion of the liquid crystal layer included in the at least one monitoring capacitor is 25 $mm^2$ or more.

In one embodiment, the at least one monitoring capacitor is arranged at a position closer to the seal portion than the active region.

In one embodiment, the at least one monitoring capacitor includes two monitoring capacitors arranged to face each other with the active region in between.

In one embodiment, the liquid crystal device is a scanned antenna, the scanned antenna has a plurality of antenna units, and each of the plurality of antenna units has one corresponding liquid crystal capacitor in the plurality of liquid crystal capacitors.

According to another embodiment of the present invention, there is provided a method for measuring a residual DC voltage in a liquid crystal device including a first substrate, a second substrate, a liquid crystal layer provided between the first substrate and the second substrate, a seal portion surrounding the liquid crystal layer, a plurality of liquid crystal capacitors, and a plurality of TFTs each connected to one of the plurality of liquid crystal capacitors, the plurality of liquid crystal capacitors including the liquid crystal layer, the method including a step of generating a V-I curve for a group of two or more liquid crystal capacitors adjacent to each other out of the plurality of liquid crystal capacitors by applying positive and negative symmetrical triangular wave voltages to all of one of electrodes of the two or more liquid crystal capacitors of the group and measuring a current flowing through the other of the electrodes; a step of measuring, in the V-I curve, a voltage Vmax having a maximum absolute value where a current value reaches a positive maximum value or minimum value, and a voltage Vmin having a maximum absolute value where a current value reaches a negative minimum value or maximum value; and a step of measuring one-half of the sum of the voltage Vmax and the voltage Vmin as the residual DC voltage.

In the method for measuring a residual DC voltage according to any of the above, a frequency of the triangular wave voltage is 0.01 Hz or more and 100 Hz or less.

In the method for measuring a residual DC voltage according to any of the above, an absolute value of an amplitude of the triangular wave voltage is 1 V or more and 10 V or less.

According to an embodiment of the present invention, there is provided a method for driving a liquid crystal device including a first substrate, a second substrate, a liquid crystal layer provided between the first substrate and the second substrate, a seal portion surrounding the liquid crystal layer, an active region having a plurality of liquid crystal capacitors and a plurality of TFTs each connected to one of the plurality of liquid crystal capacitors, and a non-active region positioned in a region outside the active region and having at least one monitoring capacitor, the plurality of liquid crystal capacitors and the at least one monitoring capacitor including the liquid crystal layer, the method including a step (a) of generating a V-I curve by applying a positive and negative symmetrical triangular wave voltage to one of a pair of electrodes of the at least one monitoring capacitor and measuring a current flowing through the other of the pair of electrodes, a step (b) of measuring, in the V-I curve, a voltage Vmax having a maximum absolute value where a current value reaches a positive maximum value or minimum value, and a voltage Vmin having a maximum absolute value where a current value reaches a negative minimum value or maximum value, a step (c) of measuring one-half of the sum of the voltage Vmax and the voltage Vmin as the residual DC voltage; and a step (d) of setting a common voltage to be supplied to the plurality of liquid crystal capacitors so as to offset the residual DC voltage.

In one embodiment, in the method for driving a liquid crystal device, the steps (a) to (d) are repeated a plurality of times, and the second and subsequent steps (d) include a step (ds1) of measuring a difference between a previous residual DC voltage and a present residual DC voltage, and a step (ds2) of shifting the common voltage so as to offset the difference.

In one embodiment, the method for driving a liquid crystal device further includes a step of applying, to the at least one monitoring capacitor, during a period in which the step (a) is not being performed, while a voltage is being applied to any of the plurality of liquid crystal capacitors, a voltage having an average value or a maximum value of the voltage applied to the plurality of liquid crystal capacitors.

According to an embodiment of the present invention, there is provided a liquid crystal device including a first substrate; a second substrate; a liquid crystal layer provided between the first substrate and the second substrate; a seal portion surrounding the liquid crystal layer; an active region having a plurality of liquid crystal capacitors and a plurality of TFTs each connected to one of the plurality of liquid crystal capacitors; a non-active region positioned in a region outside the active region and having at least one monitoring capacitor, the plurality of liquid crystal capacitors and the at least one monitoring capacitor including the liquid crystal layer; and a driving circuit for supplying a predetermined voltage to the plurality of liquid crystal capacitors and an rDC voltage measurement circuit, in which the driving circuit and the rDC voltage measurement circuit are configured to execute a step (a) of generating a V-I curve by applying a positive and negative symmetrical triangular wave voltage to one of a pair of electrodes of the at least one monitoring capacitor and measuring a current flowing through the other of the pair of electrodes; a step (b) of measuring, in the V-I curve, a voltage Vmax having a maximum absolute value where a current value reaches a positive maximum value or minimum value, and a voltage Vmin having a maximum absolute value where a current value reaches a negative minimum value or maximum value, a step (c) of measuring one-half of the sum of the voltage Vmax and the voltage Vmin as the residual DC voltage; and a step (d) of setting a common voltage to be supplied to the plurality of liquid crystal capacitors so as to offset the residual DC voltage.

According to an embodiment of the present invention, there is provided a method for manufacturing a liquid crystal device including a first substrate, a second substrate, a liquid crystal layer provided between the first substrate and the second substrate, a seal portion surrounding the liquid crystal layer, an active region having a plurality of liquid crystal capacitors and a plurality of TFTs each connected to one of the plurality of liquid crystal capacitors, and a non-active region positioned in a region outside the active region and having at least one monitoring capacitor, the plurality of liquid crystal capacitors and the at least one monitoring capacitor including the liquid crystal layer, the method including a step of stabilizing a residual DC voltage of the liquid crystal device, in which the step of stabilizing includes a step (A) of applying an AC voltage whose polarity is inverted to one of a pair of electrodes of each of the at least one monitoring capacitor and the plurality of liquid crystal capacitors in the active region and applying a DC voltage to the other of the pair of electrodes, a step (B) of generating a V-I curve by applying a positive and negative symmetrical triangular wave voltage to the one of the pair of electrodes of the at least one monitoring capacitor and measuring a current flowing through the other of the pair of electrodes after the step (A); a step (C) of measuring, in the V-I curve, a voltage Vmax having a maximum absolute value where a current value reaches a positive maximum value or minimum value, and a voltage Vmin having a maximum absolute value where a current value reaches a negative minimum value or maximum value, a step (D) of measuring one-half of the sum of the voltage Vmax and the voltage Vmin as the residual DC voltage; and a step (E) of setting a common voltage to be supplied to the plurality of liquid crystal capacitors so as to offset the residual DC voltage, the steps (A) to (E) are repeated a plurality of times in the step of stabilizing, the second and subsequent steps (E) include a step (Es1) of determining a difference between a previous residual DC voltage and a present residual DC voltage, and a step (Es2) of determining whether or not the difference is a predetermined value or less, and the steps (A) to (E) are repeated until a result of the determining in the step (Es2) is positive.

Advantageous Effects of Invention

According to embodiments of the present invention, there are provided a liquid crystal device having a liquid crystal capacitor connected via a TFT, a method for measuring a residual DC voltage in a liquid crystal device, a method for driving a liquid crystal device, and a method for manufacturing a liquid crystal device. According to an embodiment of the present invention, there is provided a scanned antenna which is able to be mass produced using LCD manufacturing technology of the related art and a manufacturing method thereof.

BRIEF DESCRIPTION OF DRAWINGS

FIG. 2(*a*) and FIG. 2(*b*) are schematic plan views showing a TFT substrate 101 and a slot substrate 201 in the scanned antenna 1000, respectively.

FIG. 5 is a view showing an example of manufacturing steps of the TFT substrate 101.

FIG. 35(*a*) is a schematic diagram showing the structure of an LCD 900 of the related art and FIG. 35(*b*) is a schematic cross-sectional view of an LCD panel 900*a*.

DESCRIPTION OF EMBODIMENTS

Figure 1:
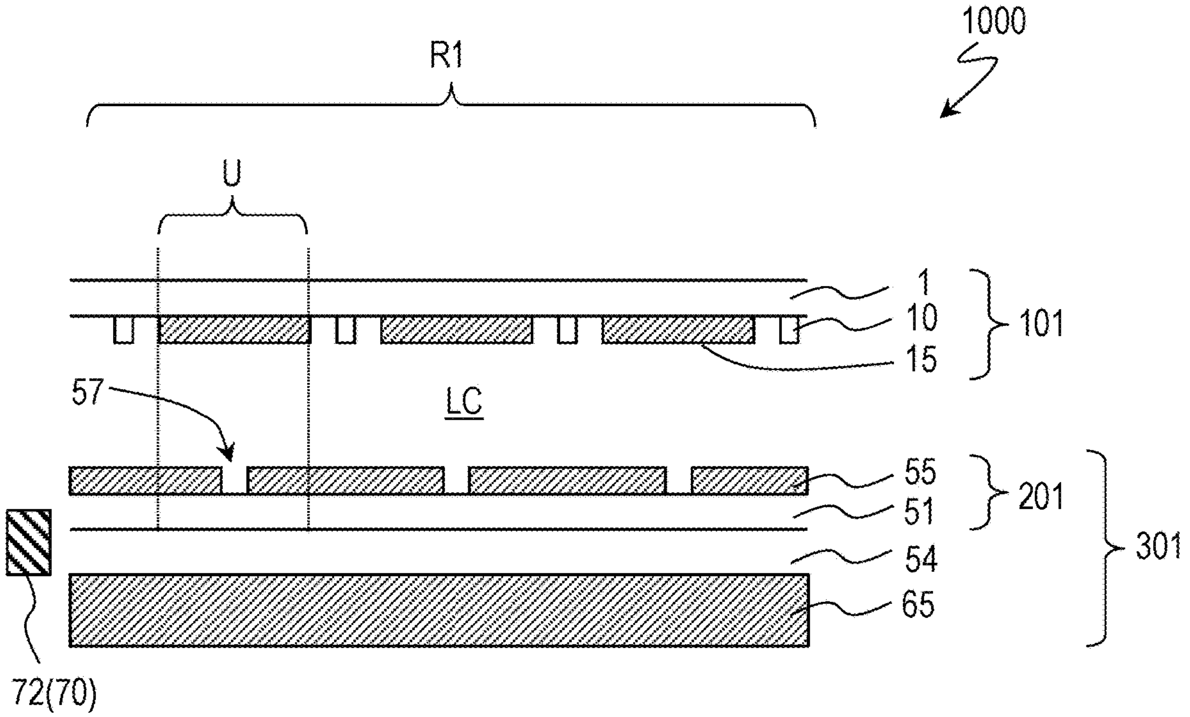
FIG. 1 is a cross-sectional view schematically showing a part of a scanned antenna 1000 of a first embodiment.

A description will be given below of a scanned antenna and a manufacturing method thereof according to embodiments of the present invention with reference to the drawings. In the following description, first, a structure and method for manufacturing a known TFT type LCD (referred to below as a "TFT-LCD") will be described. However, descriptions of matters well-known in the LCD technical field may be omitted. For basic technology of TFT-LCD, refer to, for example, Liquid Crystals, Applications and Uses, Vol. 1-3 (Editor: Birenda Bahadur, Publisher: World Scientific Pub Co Inc), and the like. For the sake of reference, all the contents of the invention of the documents described above are incorporated herein.

Referring to FIG. 35(*a*) and FIG. 35(*b*), description will be given of the structure and operation of a typical transmissive TFT-LCD (simply referred to below as "LCD") 900. Here, a vertical electric field mode (for example, TN mode or vertical alignment mode) LCD 900, in which a voltage is applied in the thickness direction of the liquid crystal layer, is exemplified. The frame frequency (typically twice the polarity inversion frequency) of the voltage applied to the liquid crystal capacitor of the LCD is, for example, 240 Hz, even at quadruple speed driving, and the dielectric constant E of the liquid crystal layer as the dielectric layer of the liquid crystal capacitor of the LCD is different from the dielectric constant M ($\varepsilon_M$) for microwaves (for example, satellite broadcasting, Ku band (12 to 18 GHz), K band (18 to 26 GHz), and Ka band (26 to 40 GHz)).

As schematically shown in FIG. 35(*a*), the transmissive LCD 900 is provided with a liquid crystal display panel 900*a*, a control circuit CNTL, a backlight (not shown), a power supply circuit (not shown), and the like. The liquid crystal display panel 900*a* includes a liquid crystal display cell LCC and a driving circuit including a gate driver GD and a source driver SD. For example, the driving circuit may be mounted on a TFT substrate 910 of the liquid crystal display cell LCC, or a part or the whole of the driving circuit may be integrated (monolithically integrated) with the TFT substrate 910.

FIG. 35(*b*) is a schematic cross-sectional view of the liquid crystal display panel (referred to below as "LCD panel") 900*a* of the LCD 900. The LCD panel 900*a* has the TFT substrate 910, a counter substrate 920, and a liquid crystal layer 930 provided therebetween. Both the TFT substrate 910 and the counter substrate 920 have transparent substrates 911 and 921 such as glass substrates. As the transparent substrates 911 and 921, in addition to a glass substrate, a plastic substrate may be used. The plastic substrate is formed of, for example, a transparent resin (for example, polyester) and glass fiber (for example, nonwoven fabric).

The display region DR of the LCD panel 900*a* is formed of pixels P arranged in a matrix. A frame region FR which does not contribute to the display is formed around the display region DR. The liquid crystal material is sealed in the display region DR by a seal portion (not shown) formed so as to surround the display region DR. The seal portion is formed by curing a sealing material including, for example, an ultraviolet curable resin and a spacer (for example, resin beads or silica beads), and bonding and fixing the TFT substrate 910 and the counter substrate 920 to each other. The spacer in the sealing material controls the gap between the TFT substrate 910 and the counter substrate 920, that is, the thickness of the liquid crystal layer 930, to be constant. In order to suppress in-plane variation in the thickness of the liquid crystal layer 930, columnar spacers are formed using an ultraviolet curable resin on the light-shielded portions (for example, on the wires) in the display region DR. In recent years, as seen in LCD panels for liquid crystal televisions and smart phones, the width of the frame region FR not contributing to the display is very narrow.

In the TFT substrate 910, a TFT 912, a gate bus line (scanning line) GL, a source bus line (display signal line) SL, a pixel electrode 914, a storage capacitor electrode (not shown), and a CS bus line (storage capacitor line) (not shown) are formed on the transparent substrate 911. The CS bus line is provided parallel to the gate bus line. Alternatively, the gate bus line of the next stage may be used as a CS bus line (CS on gate structure).

The pixel electrode 914 is covered with an alignment film (for example, a polyimide film) for controlling the alignment of the liquid crystal. The alignment film is provided so as to be in contact with the liquid crystal layer 930. The TFT substrate 910 is often arranged on the backlight side (the side opposite to the observer).

The counter substrate 920 is often arranged on the observer side of the liquid crystal layer 930. The counter substrate 920 has a color filter layer (not shown), a counter electrode 924, and an alignment film (not shown) on the transparent substrate 921. Since the counter electrode 924 is provided in common to the plurality of pixels P forming the display region DR, the counter electrode 924 is also called a common electrode. The color filter layer includes a color filter (for example, a red filter, a green filter, and a blue filter) provided for each pixel P, and a black matrix (light shielding layer) for shielding light unnecessary for the display. The black matrix is arranged, for example, between the pixels P in the display region DR so as to shield the frame region FR.

The pixel electrode 914 of the TFT substrate 910, the counter electrode 924 of the counter substrate 920, and the liquid crystal layer 930 therebetween form a liquid crystal capacitor Clc. Individual liquid crystal capacitors correspond to pixels. In order to hold the voltage applied to the liquid crystal capacitor Clc (that is, to increase the voltage holding ratio), a storage capacitor CS electrically connected in parallel with the liquid crystal capacitor Clc is formed. Typically, the storage capacitor CS is formed by an electrode having the same potential as the pixel electrode 914, an inorganic insulating layer (for example, a gate insulating layer ($SiO_2$ layer)), and a storage capacitor electrode connected to the CS bus line. Typically, the same common voltage as the counter electrode 924 is supplied from the CS bus line.

Factors responsible for decreasing the voltage (effective voltage) applied to the liquid crystal capacitor Clc are (1) factors based on the CR time constant which is the product of the capacitor value $C_{clc}$ of the liquid crystal capacitor Clc and the resistance value R, and (2) interfacial polarization due to ionic impurities included in the liquid crystal material, and/or alignment polarization of liquid crystal molecules, or the like. Among these, the contribution of the liquid crystal capacitor Clc according to the CR time constant is large, and providing the storage capacitor CS electrically connected in parallel to the liquid crystal capacitor Clc makes it possible to increase the CR time constant. Here, the volume resistivity of the liquid crystal layer 930 which is the dielectric layer of the liquid crystal capacitor Clc exceeds the order of $10^{12}$ Ω·cm in a case of a commonly used nematic liquid crystal material.

When the TFT 912 selected by the scanning signal supplied from the gate driver GD to the gate bus line GL is turned on, the display signal supplied to the pixel electrode 914 is the display signal which is supplied to the source bus line SL which is connected to the TFT 912. Accordingly, the TFT 912 connected to a certain gate bus line GL are turned on at the same time, and at that time, corresponding display signals are supplied from the source bus lines SL connected to the respective TFTs 912 of the pixels P in that row. By sequentially performing this operation from the first row (for example, the uppermost row of the display surface) to the mth row (for example, the lowermost row of the display surface), one image (frame) is written and displayed in the display region DR formed of m rows of pixel rows. When the pixels P are arranged in a matrix of m rows and n columns, at least one and at least n in total source bus lines SL corresponding to each pixel column are provided.

Such scanning is referred to as line sequential scanning, the time from when one pixel row is selected until the next row is selected is called a horizontal scanning period (1 H), and the time from when a certain row is selected until the same row is selected again is called a vertical scanning period (1 V) or a frame. In general, 1 V (or 1 frame) is obtained by adding a blanking period to a period m·H for selecting all m pixel rows.

For example, in a case where the input video signal is an NTSC signal, 1 V (=1 frame) of the LCD panel of the related art was 1⁄60 sec (16.7 msec). An NTSC signal is an interlaced signal, the frame frequency is 30 Hz, and the field frequency is 60 Hz, but since it is necessary to supply display signals to all the pixels in each field in the LCD panel, driving is carried out at 1 V=(1⁄60) sec (driven at 60 Hz). In recent years, in order to improve the display characteristics of moving images, there are also LCD panels driven at double speed driving (120 Hz driving, 1 V=(1⁄120) sec) and at quadruple speed for 3D display (240 Hz driving, 1 V=(1⁄240) sec).

When a DC voltage is applied to the liquid crystal layer 930, the effective voltage decreases and the luminance of the pixel P decreases. Since the above-described interface polarization and/or alignment polarization contribute to the decrease in the effective voltage, it is difficult to completely prevent the decrease even if the storage capacitor CS is provided. For example, when a display signal corresponding to a certain intermediate gradation is written into all the pixels in every frame, the luminance changes for each frame and is observed as flicker. In addition, when a DC voltage is applied to the liquid crystal layer 930 over a long time, electrolysis of the liquid crystal material may occur. In addition, impurity ions segregate on one side of the electrode, an effective voltage is not applied to the liquid crystal layer, and the liquid crystal molecules may stop moving. In order to prevent the above, the LCD panel 900*a* uses so-called AC driving. Typically, frame inversion driving is performed in which the polarity of the display signal is inverted every frame (every vertical scanning period). For example, in LCD panels of the related art, polarity inversion is performed every 1⁄60 sec (polarity inversion period is 30 Hz).

In order to evenly distribute pixels having different polarities of applied voltages even within one frame, dot inversion driving, line inversion driving, or the like is performed. This is because it is difficult to completely match the size of the effective voltage applied to the liquid crystal layer between the positive polarity and the negative polarity. For example, if the volume resistivity of the liquid crystal material exceeds an order of $10^{12}$ Ω·cm, flickering is hardly visible if dot inversion or line inversion driving is performed every 1⁄60 sec.

The scanning signal and the display signal in the LCD panel 900*a* are supplied from the gate driver GD and the source driver SD to the gate bus line GL and the source bus line SL, respectively, based on the signals supplied from the control circuit CNTL to the gate driver GD and the source driver SD. For example, the gate driver GD and the source driver SD are each connected to corresponding terminals provided on the TFT substrate 910. For example, the gate driver GD and the source driver SD may be mounted as a driver IC in the frame region FR of the TFT substrate 910, or may be monolithically formed in the frame region FR of the TFT substrate 910.

The counter electrode 924 of the counter substrate 920 is electrically connected to a terminal (not shown) of the TFT substrate 910 via a conductive portion (not shown) called a transfer. The transfer is formed, for example, so as to overlap with the seal portion, or by imparting conductivity to a part of the seal portion. This is in order to narrow the frame region FR. A common voltage is directly or indirectly supplied from the control circuit CNTL to the counter electrode 924. Typically, the common voltage is also supplied to the CS bus line as described above.

[Basic Structure of Scanned Antenna]

In a scanned antenna using antenna units using the anisotropy (birefringence) of a liquid crystal material with a large dielectric constant M ($\varepsilon_M$), the voltage to be applied to each liquid crystal layer of antenna units associated with pixels of an LCD panel is controlled and the effective dielectric constant M ($\varepsilon_M$) of the liquid crystal layer in each antenna unit is changed to form a two-dimensional pattern in antenna units with different electrostatic capacitors (corresponding to the display of an image on the LCD). Retardation is imparted to electromagnetic waves (for example, microwaves) to be emitted from an antenna or to be received by an antenna according to the electrostatic capacitor of each antenna unit to give a strong directivity in a specific direction (beam scanning) corresponding to the two-dimensional pattern formed by the antenna units having different electrostatic capacitors. For example, the electromagnetic waves to be emitted from the antenna are obtained by integrating spherical waves obtained as a result of input electromagnetic waves being incident to each antenna unit and scattered in each antenna unit, while taking the retardation to be imparted by each antenna unit into consideration. It is also possible to consider each antenna unit as functioning as a "phase shifter". Refer to PTLs 1 to 4 and NPLs 1 and 2 for the basic structure and operating principles of a scanned antenna using a liquid crystal material. NPL 2 discloses the basic structure of a scanned antenna in which spiral slots are arranged. All the inventions of PTLs 1 to 4 and NPLs 1 and 2 are incorporated in the present specification by reference.

Although the antenna units in the scanned antenna according to the embodiment of the present invention are similar to the pixels of an LCD panel, the structure of the antenna units differs from the structure of the pixels of the LCD panel and the arrangement of the plurality of antenna units also differs from the arrangement of the pixels in the LCD panel. A description will be given of the basic structure of the scanned antenna according to an embodiment of the present invention with reference to FIG. 1 showing the scanned antenna 1000 of the first embodiment which will be described in detail below. The scanned antenna 1000 is a radial inline slot antenna in which the slots are arranged in concentric circles; however, the scanned antenna according to the embodiment of the present invention is not limited thereto and, for example, the arrangement of the slots may be various known arrangements. In particular, for the slot and/or antenna unit arrangements, the entire invention of PTL 5 is incorporated into the present specification for reference.

FIG. 1 is a cross-sectional view schematically showing a portion of the scanned antenna 1000 of the present embodiment, and schematically showing a portion of a cross-section along the radial direction from a power supply pin 72 (refer to FIG. 2(*b*)) provided in the vicinity of the center of the slots arranged in concentric circles.

The scanned antenna 1000 is provided with the TFT substrate 101, the slot substrate 201, a liquid crystal layer LC arranged therebetween, and a reflective conductive plate 65 arranged to face the slot substrate 201 via an air layer 54. The scanned antenna 1000 transmits and receives microwaves from the TFT substrate 101 side.

The TFT substrate 101 has a dielectric substrate 1, which is a glass substrate or the like, a plurality of patch electrodes 15 formed on the dielectric substrate 1, and a plurality of TFTs 10. Each of the patch electrodes 15 is connected to the corresponding TFT 10. Each of the TFTs 10 is connected to a gate bus line and a source bus line.

The slot substrate 201 has a dielectric substrate 51, which is a glass substrate or the like, and a slot electrode 55 formed on the liquid crystal layer LC side of the dielectric substrate 51. The slot electrode 55 has a plurality of the slots 57.

The reflective conductive plate 65 is arranged to face the slot substrate 201 via the air layer 54. Instead of the air layer 54, it is possible to use a layer formed of a dielectric body having a small dielectric constant M with respect to microwaves (for example, a fluorine resin such as PTFE). The slot electrode 55 and the reflective conductive plate 65 function as a waveguide 301 along with the dielectric substrate 51 and the air layer 54 therebetween.

Figure 17:
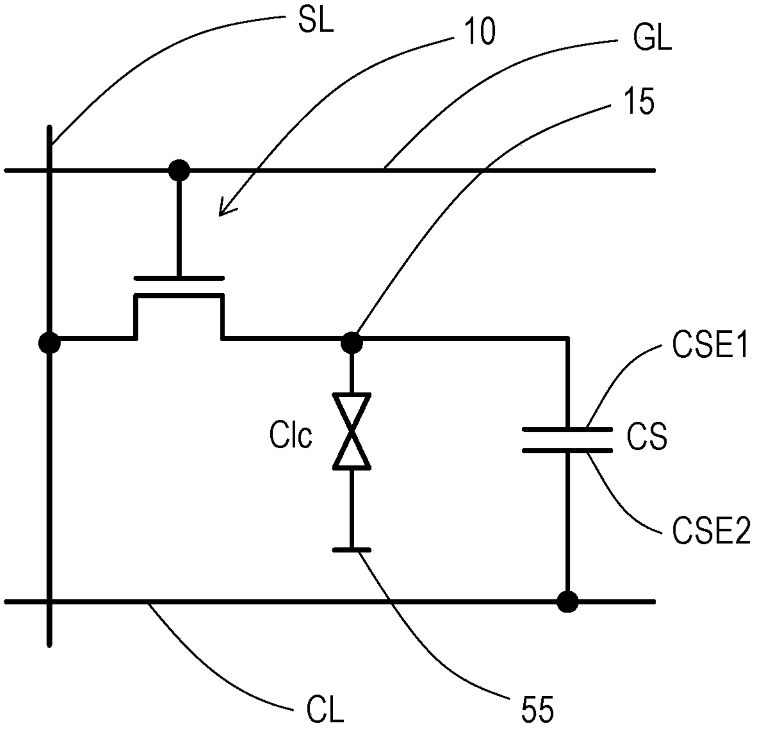
FIG. 17 is a diagram showing an equivalent circuit of one antenna unit of the scanned antenna according to the embodiment of the present invention.

The patch electrode 15, a portion of the slot electrode 55 including the slots 57, and the liquid crystal layer LC therebetween form the antenna unit U. In each antenna unit U, one patch electrode 15 faces a portion of the slot electrode 55 including one slot 57 with a liquid crystal layer LC interposed therebetween, thereby forming a liquid crystal capacitor. The structure in which the patch electrode 15 and the slot electrode 55 face each other with the liquid crystal layer LC interposed therebetween is similar to the structure in which the pixel electrode 914 and the counter electrode 924 of the LCD panel 900*a* shown in FIG. 35 face each other via the liquid crystal layer 930. That is, the antenna unit U of the scanned antenna 1000 and the pixel P of the LCD panel 900*a* have similar configurations. In addition, the antenna unit has a configuration similar to the pixel P in the LCD panel 900*a* in the point of having a storage capacitor (refer to FIG. 13(*a*) and FIG. 17) electrically connected in parallel with the liquid crystal capacitor. However, the scanned antenna 1000 has many differences from the LCD panel 900*a*.

First, the performance required for the dielectric substrates 1 and 51 of the scanned antenna 1000 is different from the performance required for the substrate of the LCD panel.

Generally, a transparent substrate transparent to visible light is used for the LCD panel and, for example, it is possible to use a glass substrate or a plastic substrate. A semiconductor substrate may be used in a reflective LCD panel since the substrate on the rear side does not need transparency. On the other hand, the dielectric substrates 1 and 51 for antennas preferably have a small dielectric loss with respect to microwaves (the dielectric loss tangent with respect to microwaves is expressed as tan $\delta_M$). The tan $\delta_M$ of the dielectric substrates 1 and 51 is preferably approximately 0.03 or less, and more preferably 0.01 or less. Specifically, it is possible to use a glass substrate or a plastic substrate. The glass substrate is superior to the plastic substrate in dimensional stability and heat resistance, and is suitable for forming circuit elements such as TFTs, wiring, and electrodes using LCD technology. For example, in a case where the material forming the waveguide is air and glass, since the dielectric loss of the glass is larger, from the viewpoint that it is possible to reduce the waveguide loss when the glass is thinner, the glass is preferably 400 μm or less, and more preferably 300 μm or less. There is no particular lower limit as long as handling is possible without breaking in the manufacturing process.

The conductive material used for the electrodes is also different. In many cases, an ITO film is used as a transparent conductive film for a pixel electrode and a counter electrode of an LCD panel. However, ITO has a large tan $\delta_M$ with respect to microwaves and use thereof as a conductive layer in an antenna is not possible. The slot electrode 55 functions as a wall of the waveguide 301 together with the reflective conductive plate 65. Accordingly, in order to suppress the transmission of microwaves in the wall of the waveguide 301, the thickness of the wall of the waveguide 301, that is, the thickness of the metal layer (Cu layer or Al layer), is preferably large. It is known that if the thickness of the metal layer is three times the skin depth, the electromagnetic waves are attenuated to 1/20 (−26 dB), and if the thickness of the metal layer is 5 times, the electromagnetic waves are attenuated to 1/150 (−43 dB). Therefore, if the thickness of the metal layer is five times the skin depth, it is possible to reduce the electromagnetic wave transmittance to 1%. For example, for microwaves of 10 GHz, if a Cu layer having a thickness of 3.3 μm or more and an Al layer having a thickness of 4.0 μm or more are used, it is possible to reduce the microwaves to 1/150. In addition, for microwaves of 30 GHz, if a Cu layer having a thickness of 1.9 μm or more and an Al layer having a thickness of 2.3 μm or more are used, it is possible to reduce the microwaves to 1/150. In this manner, the slot electrode 55 is preferably formed of a comparatively thick Cu layer or Al layer. There is no particular upper limit to the thickness of the Cu layer or the Al layer, and it is possible to appropriately set the thickness in consideration of the film forming time and cost. Using a Cu layer obtains the advantage of being thinner than when using an Al layer. As for the forming of the relatively thick Cu layer or Al layer, it is also possible to adopt not only the thin film deposition methods used in LCD manufacturing processes but also other methods such as bonding Cu foil or Al foil to a substrate. The thickness of the metal layer is, for example, 2 μm or more and 30 μm or less. In a case where the thin film deposition method is used for the formation, the thickness of the metal layer is preferably 5 μm or less. As the reflective conductive plate 65, for example, it is possible to use an aluminum plate, a copper plate, or the like having a thickness of several mm.

Since the patch electrode 15 does not form the waveguide 301 in the manner of the slot electrode 55, it is possible to use a Cu layer or an Al layer having a small thickness for the patch electrode 15, rather than the slot electrode 55. However, the resistance thereof is preferably low in order to avoid loss turning into heat when the vibration of free electrons in the vicinity of the slots 57 of the slot electrode 55 induces the vibration of free electrons in the patch electrode 15. From the viewpoint of mass production, it is preferable to use an Al layer rather than a Cu layer, and the thickness of the Al layer is preferably 0.3 μm or more and 2 μm or less, for example.

In addition, the arrangement pitch of the antenna units U is largely different from the pixel pitch. For example, when considering an antenna for microwaves of 12 GHz (Ku band), the wavelength λ is, for example, 25 mm. Then, as described in PTL 4, since the pitch of the antenna unit U is λ/4 or less and/or λ/5 or less, the wavelength λ is 6.25 mm or less and/or 5 mm or less. This is greater than the pixel pitch of the LCD panel by ten times or more. Accordingly, the lengths and widths of the antenna units U are also approximately ten times greater than the lengths and widths of the pixels of the LCD panel.

Naturally, it is possible for the arrangement of the antenna units U to be different from the arrangement of the pixels in the LCD panel. Here, an example in which the antenna units U are arranged in concentric circles (for example, refer to Japanese Unexamined Patent Application Publication No. 2002-217640) is shown, but, without being limited thereto, the antenna units U may be arranged in a spiral, for example, as described in NPL 2. Furthermore, the antenna units U may be arranged in a matrix as described in PTL 4.

The characteristics required for the liquid crystal material of the liquid crystal layer LC of the scanned antenna 1000 are different from the characteristics required for the liquid crystal material of an LCD panel. The display of an LCD panel is performed by changing the refractive index of the liquid crystal layer of the pixels to impart retardation to the polarized light of visible light (wavelength 380 nm to 830 nm) to change the polarization state (for example, rotating the polarization axis direction of linearly polarized light or changing the degree of circular polarization of circularly polarized light). In contrast, the scanned antenna 1000 according to the embodiment changes the phase of the microwaves to be excited (re-radiated) from each patch electrode by changing the electrostatic capacitor value of the liquid crystal capacitor of the antenna unit U. Accordingly, in the liquid crystal layer, the anisotropy ($\Delta\varepsilon_M$) of the dielectric constant M ($\varepsilon_M$) with respect to microwaves is preferably large and tan $\delta_M$ is preferably small. For example, it is possible to suitably use the liquid crystal material described in M. Wittek et al., SID 2015 DIGEST pp. 824-826 in which $\Delta\varepsilon_M$ is 4 or more and tan $\delta_M$ is 0.02 or less (both values of 19 Gz). In addition, it is possible to use the liquid crystal material described in Kuki, Polymer 55 vol. August issue pp. 599-602 (2006) in which $\Delta\varepsilon_M$ is 0.4 or more and tan $\delta_M$ is 0.04 or less.

In general, the dielectric constant of a liquid crystal material has a frequency variance, but the dielectric anisotropy $\Delta\varepsilon_M$ with respect to microwaves has a positive correlation with the refractive index anisotropy Δn with respect to visible light. Accordingly, the liquid crystal material for an antenna unit for microwaves is preferably a material having a large refractive index anisotropy Δn with respect to visible light in other words. The refractive index anisotropy Δn of the liquid crystal material for LCD is evaluated by the refractive index anisotropy with respect to light at 550 nm. Here too, when Δn (birefringence) for light at 550 nm is used as an index, a nematic liquid crystal having Δn of 0.3 or more, preferably 0.4 or more, is used for an antenna unit for microwaves. Δn has no particular upper limit. However, since a liquid crystal material having a large Δn tends to have a strong polarity, there is a concern that the reliability may be deteriorated. From the viewpoint of reliability, Δn is preferably 0.4 or less. The thickness of the liquid crystal layer is, for example, 1 μm to 500 μm.

A more detailed description will be given below of the structure and method of manufacturing the scanned antenna according to an embodiment of the present invention.

First Embodiment

First, reference will be made to FIG. 1 and FIG. 2. FIG. 1 is a schematic partial cross-sectional view of the vicinity of the center of the scanned antenna 1000 as detailed above, and FIG. 2(*a*) and FIG. 2(*b*) are plan views of the TFT substrate 101 and the slot substrate 201 in the scanned antenna 1000.

The scanned antenna 1000 has a plurality of antenna units U arranged two-dimensionally and, in the scanned antenna 1000 exemplified here, the plurality of antenna units are arranged in concentric circles. In the following description, the region of the TFT substrate 101 and the region of the slot substrate 201 corresponding to the antenna units U are referred to as the "antenna unit region", and the same reference character U as the antenna unit is added thereto. In addition, as shown in FIG. 2(*a*) and FIG. 2(*b*), in the TFT substrate 101 and the slot substrate 201, a region defined by a plurality of two-dimensionally arranged antenna unit regions is referred to as a "transmission/reception region R1" and a region outside the transmission/reception region R1 is referred to as a "non-transmission/reception region R2". In the non-transmission/reception region R2, a terminal portion, a driving circuit, and the like are provided.

FIG. 2(*a*) is a schematic plan view showing the TFT substrate 101 in the scanned antenna 1000.

In the illustrated example, the transmission/reception region R1 has a donut shape when viewed from the normal line direction of the TFT substrate 101. The non-transmission/reception region R2 includes a first non-transmission/reception region R2*a* positioned at the center of the transmission/reception region R1 and a second non-transmission/reception region R2*b* positioned at the periphery of the transmission/reception region R1. The outer diameter of the transmission/reception region R1 is, for example, 200 mm to 1500 mm, and is set according to the communication volume or the like.

A plurality of gate bus lines GL and a plurality of source bus lines SL supported by the dielectric substrate 1 are provided in the transmission/reception region R1 of the TFT substrate 101, and the antenna unit region U is defined by these wires. The antenna unit regions U are, for example, arranged in concentric circles in the transmission/reception region R1. Each of the antenna unit regions U includes a TFT and a patch electrode electrically connected to the TFT. The source electrode and the gate electrode of the TFT are electrically connected to the source bus line SL and the gate bus line GL, respectively. In addition, the drain electrode is electrically connected to the patch electrode.

In the non-transmission/reception region R2 (R2*a* and R2*b*), a seal region Rs is arranged to surround the transmission/reception region R1. A sealing material (not shown) is applied to the seal region Rs. The sealing material bonds the TFT substrate 101 and the slot substrate 201 to each other and also encloses a liquid crystal between the substrates 101 and 201.

A gate terminal portion GT, a gate driver GD, a source terminal portion ST, and a source driver SD are provided outside the seal region Rs in the non-transmission/reception region R2. Each of the gate bus lines GL is connected to the gate driver GD via the gate terminal portion GT. Each of the source bus lines SL is connected to the source driver SD via the source terminal portion ST. In this example, the source driver SD and the gate driver GD are formed on the dielectric substrate 1, but one or both of these drivers may be provided on another dielectric substrate.

In the non-transmission/reception region R2, a plurality of transfer terminal portions PT are also provided. The transfer terminal portion PT is electrically connected to the slot electrode 55 (FIG. 2(*b*)) of the slot substrate 201. In the present specification, a connection portion between the transfer terminal portion PT and the slot electrode 55 is referred to as a "transfer portion". As shown in the drawing, the transfer terminal portion PT (transfer portion) may be arranged in the seal region Rs. In such a case, resin-containing conductive particles may be used as the sealing material. Due to this, liquid crystal is enclosed between the TFT substrate 101 and the slot substrate 201, and it is possible to secure the electrical connection between the transfer terminal portion PT and the slot electrode 55 of the slot substrate 201. In this example, the transfer terminal portion PT is arranged in both the first non-transmission/reception region R2*a* and the second non-transmission/reception region R2*b*, but may be arranged in only one thereof.

Here, the transfer terminal portion PT (transfer portion) may not be arranged in the seal region Rs. For example, the transfer terminal portion PT may be arranged outside the seal region Rs in the non-transmission/reception region R2.

FIG. 2(*b*) is a schematic plan view showing the slot substrate 201 in the scanned antenna 1000, and showing the surface of the slot substrate 201 on the liquid crystal layer LC side.

In the slot substrate 201, the slot electrode 55 is formed on the dielectric substrate 51 across the transmission/reception region R1 and the non-transmission/reception region R2.

In the transmission/reception region R1 of the slot substrate 201, a plurality of the slots 57 are arranged in the slot electrode 55. The slots 57 are arranged corresponding to the antenna unit region U on the TFT substrate 101. In the illustrated example, in the plurality of the slots 57, a pair of the slots 57 extending in a direction substantially orthogonal to each other are arranged in concentric circles so as to form a radial inline slot antenna. Having slots which are substantially orthogonal slots to each other makes it possible for the scanned antenna 1000 to transmit and receive circularly polarized waves.

A plurality of terminal portions IT of the slot electrodes 55 are provided in the non-transmission/reception region R2. The terminal portion IT is electrically connected to the transfer terminal portion PT (FIG. 2(*a*)) of the TFT substrate 101. In this example, the terminal portion IT is arranged in the seal region Rs, and is electrically connected to the corresponding transfer terminal portion PT by a sealing material containing conductive particles.

In addition, in the first non-transmission/reception region R2*a*, the power supply pin 72 is arranged on the rear surface side of the slot substrate 201. Microwaves enter into the waveguide 301 formed by the slot electrode 55, the reflective conductive plate 65, and the dielectric substrate 51 by the power supply pin 72. The power supply pin 72 is connected to a power supply device 70. Power supply is performed from the center of the concentric circle in which the slots 57 are arranged. The power supply method may be either a direct-coupled feeding method or an electromagnetic coupling method, and it is possible to adopt a known feeding structure.

FIG. 2(*a*) and FIG. 2(*b*) show an example in which the seal region Rs is provided so as to surround a comparatively narrow region including the transmission/reception region R1, but the present invention is not limited thereto. In particular, the seal region Rs provided outside the transmission/reception region R1 may be provided, for example, in the vicinity of the side of the dielectric substrate 1 and/or the dielectric substrate 51 so as to have a certain distance or more from the transmission/reception region R1. Naturally, for example, the terminal portion and the driving circuit provided in the non-transmission/reception region R2 may be formed outside the seal region Rs (that is, the side where there is no liquid crystal layer). Forming the seal region Rs at a position separated from the transmission/reception region R1 at a certain distance or more makes it possible to suppress the influence of impurities (particularly ionic impurities) included in the sealing material (particularly curable resin) deteriorating the antenna characteristics.

A more detailed description will be given below of each constituent element of the scanned antenna 1000 with reference to the drawings.

<Structure of TFT Substrate 101>

Antenna Unit Region U

Figure 3:
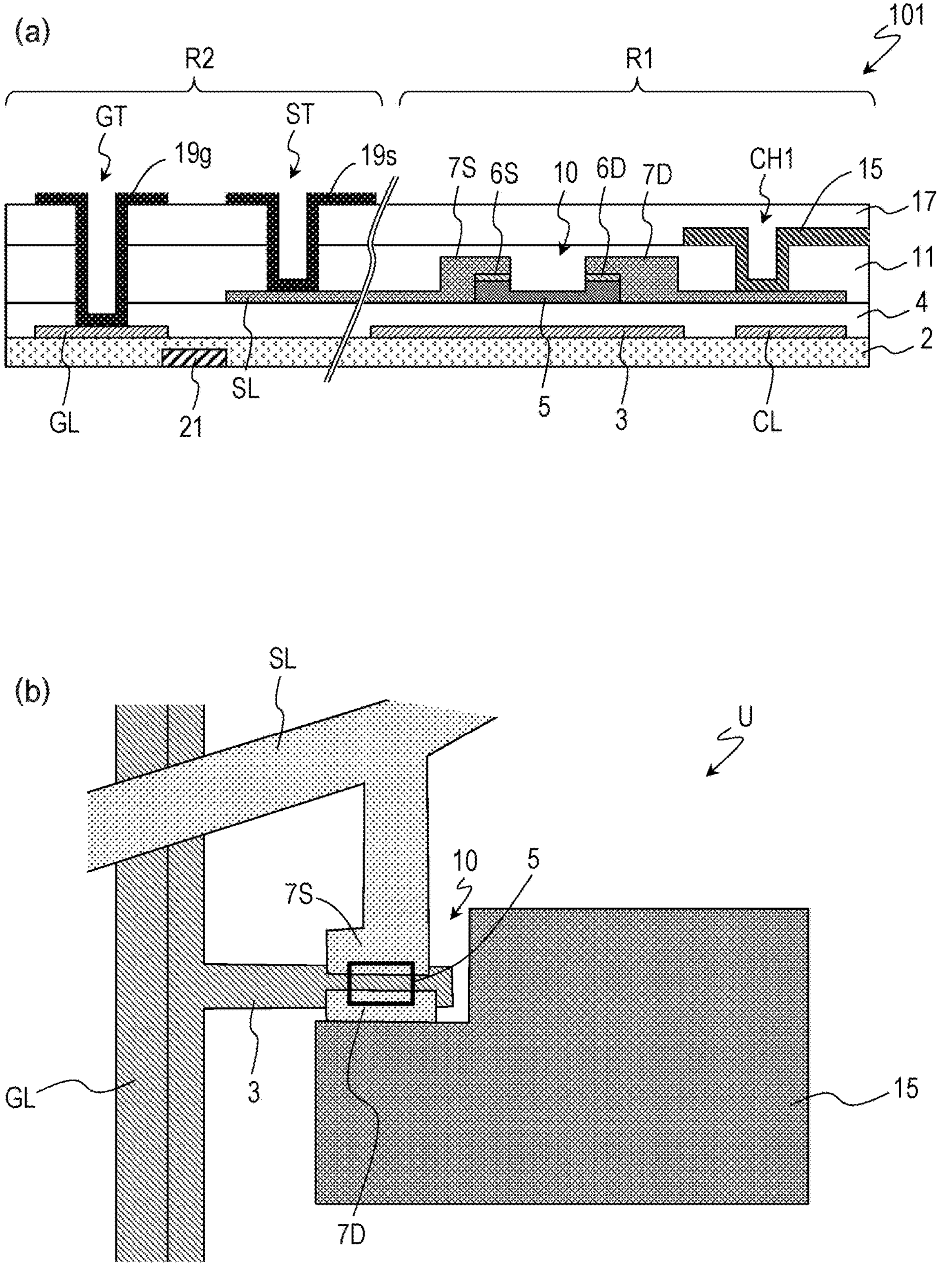
FIG. 3(*a*) and FIG. 3(*b*) are a cross-sectional view and a plan view schematically showing an antenna unit region U of the TFT substrate 101, respectively.

FIGS. 3(*a*) and 3(*b*) are a cross-sectional view and a plan view schematically showing the antenna unit region U of the TFT substrate 101, respectively.

Each of the antenna unit regions U is provided with a dielectric substrate (not shown), the TFT 10 supported on the dielectric substrate, a first insulating layer 11 covering the TFT 10, the patch electrode 15 formed on the first insulating layer 11 and electrically connected to the TFT 10, and a second insulating layer 17 covering the patch electrode 15. The TFT 10 is arranged, for example, in the vicinity of the intersection of the gate bus line GL and the source bus line SL.

The TFT 10 is provided with a gate electrode 3, an island-shaped semiconductor layer 5, a gate insulating layer 4 arranged between the gate electrode 3 and the semiconductor layer 5, a source electrode 7S, and a drain electrode 7D. The structure of the TFT 10 is not particularly limited. In this example, the TFT 10 is a channel etch type TFT having a bottom gate structure.

The gate electrode 3 is electrically connected to the gate bus line GL, and a scanning signal is supplied from the gate bus line GL. The source electrode 7S is electrically connected to the source bus line SL, and a data signal is supplied from the source bus line SL. The gate electrode 3 and the gate bus line GL may be formed of the same conductive film (gate conductive film). The source electrode 7S, the drain electrode 7D, and the source bus line SL may be formed from the same conductive film (source conductive film). The gate conductive film and the source conductive film are, for example, metal films. In this specification, a layer formed using a gate conductive film may be referred to as a "gate metal layer", and a layer formed using a source conductive film may be referred to as a "source metal layer".

The semiconductor layer 5 is arranged so as to overlap the gate electrode 3 via the gate insulating layer 4. In the illustrated example, a source contact layer 6S and a drain contact layer 6D are formed on the semiconductor layer 5. The source contact layer 6S and the drain contact layer 6D are respectively arranged on both sides of a region (channel region) in which a channel is formed in the semiconductor layer 5. The semiconductor layer 5 may be an intrinsic amorphous silicon (i-a-Si) layer and the source contact layer 6S and the drain contact layer 6D may be an n+ type amorphous silicon (n+-a-Si) layer.

The source electrode 7S is provided so as to contact the source contact layer 6S and is connected to the semiconductor layer 5 via the source contact layer 6S. The drain electrode 7D is provided so as to contact the drain contact layer 6D and is connected to the semiconductor layer 5 via the drain contact layer 6D.

The first insulating layer 11 has a contact hole CH1 reaching the drain electrode 7D of the TFT 10.

The patch electrode 15 is provided on the first insulating layer 11 and in the contact hole CH1, and is in contact with the drain electrode 7D in the contact hole CH1. The patch electrode 15 includes a metal layer. The patch electrode 15 may be a metal electrode formed only from a metal layer. The material of the patch electrode 15 may be the same as that of the source electrode 7S and the drain electrode 7D. However, the thickness of the metal layer of the patch electrode 15 (the thickness of the patch electrode 15 in a case where the patch electrode 15 is a metal electrode) is set so as to be larger than the thickness of the source electrode 7S and the drain electrode 7D. The thickness of the metal layer in the patch electrode 15 is set to 0.3 μm or more, for example, in a case of being formed of an Al layer.

A CS bus line CL may be provided using the same conductive film as the gate bus line GL. The CS bus line CL may be arranged so as to overlap the drain electrode (or extended portion of the drain electrode) 7D via the gate insulating layer 4 and may form the storage capacitor CS having the gate insulating layer 4 as a dielectric layer.

An alignment mark (for example, a metal layer) 21 and a base insulating film 2 covering the alignment mark 21 may be formed on the dielectric substrate side from the gate bus line GL. Regarding the alignment mark 21, in a case of preparing, for example, m TFT substrates from one glass substrate, when the number of photomasks is n (n<m), the steps need to be divided into a plurality of exposure steps for each. In this manner, when the number (n) of photomasks is smaller than the number (m) of TFT substrates 101 prepared from one glass substrate 1, the alignment mark 21 is used for alignment of the photomasks. It is possible to omit the alignment mark 21.

In the present embodiment, the patch electrode 15 is formed in a layer different from the source metal layer. Due to this, the following advantage is obtained.

Since the source metal layer is usually formed using a metal film, it is also possible to consider forming a patch electrode in the source metal layer. However, the patch electrode preferably has low resistance to an extent that does not hinder the vibration of electrons and, for example, is formed of a comparatively thick Al layer having a thickness of 0.3 μm or more. From the viewpoint of antenna performance, the patch electrode is preferably thick. However, depending on the structure of the TFT, for example, if a patch electrode having a thickness exceeding 1 μm is formed in a source metal layer, there is a problem in that it is not possible to obtain a desired patterning accuracy. For example, there may be a problem in that it is not possible to control the gap between the source electrode and the drain electrode (corresponding to the channel length of the TFT) with high accuracy. In contrast, in the present embodiment, since the patch electrode 15 is formed separately from the source metal layer, it is possible to control the thickness of the source metal layer and the thickness of the patch electrode 15 independently. Accordingly, it is possible to form the patch electrode 15 having a desired thickness while ensuring controllability when forming the source metal layer.

In the present embodiment, it is possible to set the thickness of the patch electrode 15 with a high degree of freedom separately from the thickness of the source metal layer. Since it is not necessary for the size of the patch electrode 15 to be strictly controlled to the extent of the source bus line SL or the like, the line width shift (deviation from the design value) may be increased by thickening the patch electrode 15. Here, a case where the thickness of the patch electrode 15 is equal to the thickness of the source metal layer is not excluded.

The patch electrode 15 may include a Cu layer or an Al layer as a main layer. The performance of the scanned antenna is correlated with the electric resistance of the patch electrode 15, and the thickness of the main layer is set so as to obtain a desired resistance. From the viewpoint of electrical resistance, there is a possibility it will be possible to make the thickness of the patch electrode 15 smaller in the Cu layer than in the Al layer.

Figure 4:
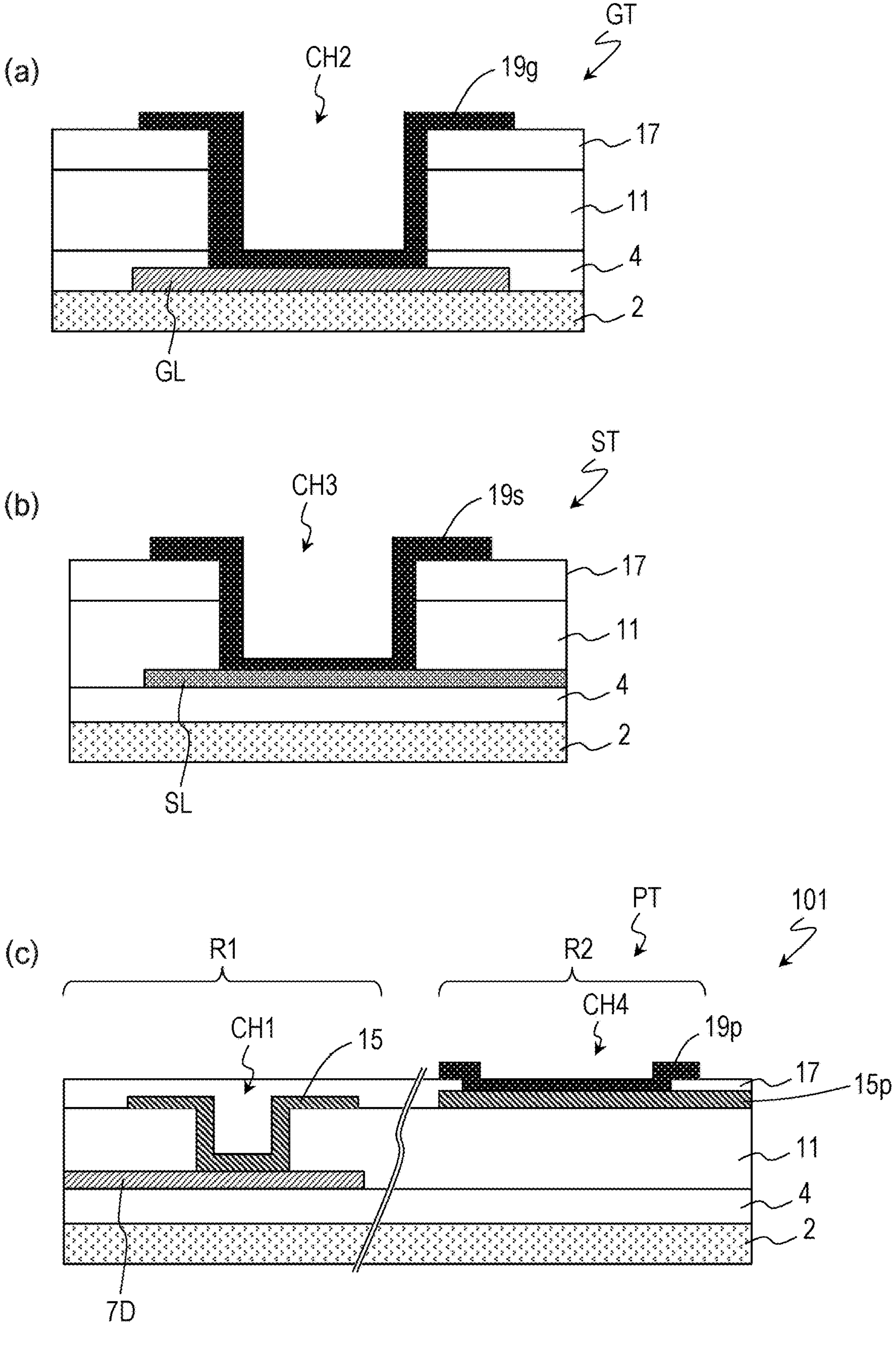
FIG. 4(*a*) to FIG. 4(*c*) are cross-sectional views schematically showing a gate terminal portion GT, a source terminal portion ST, and a transfer terminal portion PT of the TFT substrate 101, respectively.

Gate Terminal Portion GT, Source Terminal Portion ST, and Transfer Terminal Portion PT FIG. 4(*a*) to FIG. 4(*c*) are cross-sectional views schematically showing the gate terminal portion GT, the source terminal portion ST, and the transfer terminal portion PT, respectively.

The gate terminal portion GT is provided with a gate bus line GL formed on the dielectric substrate, an insulating layer covering the gate bus line GL, and an upper connection portion 19*g* for the gate terminal. The gate terminal upper connection portion 19*g* is in contact with the gate bus line GL in the contact hole CH2 formed in the insulating layer. In this example, the insulating layer covering the gate bus line GL includes the gate insulating layer 4, the first insulating layer 11, and the second insulating layer 17 from the dielectric substrate side. The gate terminal upper connection portion 19*g* is, for example, a transparent electrode formed of a transparent conductive film provided on the second insulating layer 17.

The source terminal portion ST is provided with a source bus line SL formed on the dielectric substrate (here, on the gate insulating layer 4), an insulating layer covering the source bus line SL, and a source terminal upper connection portion 19*s*. The source terminal upper connection portion 19*s* is in contact with the source bus line SL in the contact hole CH3 formed in the insulating layer. In this example, the insulating layer covering the source bus line SL includes the first insulating layer 11 and the second insulating layer 17. The source terminal upper connection portion 19*s* is, for example, a transparent electrode formed of a transparent conductive film provided on the second insulating layer 17.

The transfer terminal portion PT has a patch connection portion 15*p* formed on the first insulating layer 11, the second insulating layer 17 covering the patch connection portion 15*p*, and a transfer terminal upper connection portion 19*p*. The transfer terminal upper connection portion 19*p* is in contact with the patch connection portion 15*p* in the contact hole CH4 formed in the second insulating layer 17. The patch connection portion 15*p* is formed of the same conductive film as the patch electrode 15. The upper connection portion for transfer terminal (also referred to as upper transparent electrode) 19*p* is, for example, a transparent electrode formed of a transparent conductive film provided on the second insulating layer 17. In the present embodiment, the upper connection portions 19*g*, 19*s*, and 19*p* of each terminal portion are formed of the same transparent conductive film.

In the present embodiment, there is an advantage in that it is possible for the contact holes CH2, CH3, and CH4 of each terminal portion to be simultaneously formed by an etching step after forming the second insulating layer 17. The detailed manufacturing process will be described below.

<Method for Manufacturing TFT Substrate 101>

It is possible to manufacture the TFT substrate 101 by the following method, for example. FIG. 5 is a view illustrating manufacturing steps of the TFT substrate 101.

First, a metal film (for example, a Ti film) is formed on a dielectric substrate and patterned to form the alignment mark 21. As the dielectric substrate, for example, it is possible to use a glass substrate, a plastic substrate (resin substrate) having heat resistance, or the like. Next, the base insulating film 2 is formed so as to cover the alignment mark 21. As the base insulating film 2, for example, an $SiO_2$ film is used.

Subsequently, a gate metal layer including the gate electrode 3 and the gate bus line GL is formed on the base insulating film 2.

It is possible to integrally form the gate electrode 3 with the gate bus line GL. Here, a gate conductive film (thickness: 50 nm or more and 500 nm or less, for example), which is not-shown, is formed on the dielectric substrate by a sputtering method or the like. Next, the gate conductive film is patterned to obtain the gate electrode 3 and the gate bus line GL. The material of the gate conductive film is not particularly limited. It is possible to appropriately use a film including a metal such as aluminum (Al), tungsten (W), molybdenum (Mo), tantalum (Ta), chromium (Cr), titanium (Ti), copper (Cu) or an alloy thereof or a metal nitride thereof. Here, a laminated film is formed by laminating MoN (thickness: 50 nm, for example), Al (thickness: 200 nm, for example), and MoN (thickness: 50 nm, for example) in this order as a gate conductive film.

Next, the gate insulating layer 4 is formed so as to cover the gate metal layer. It is possible to form the gate insulating layer 4 by a CVD method or the like. As the gate insulating layer 4, it is possible to appropriately use a silicon oxide ($SiO^2$) layer, a silicon nitride (SiNx) layer, a silicon oxynitride (SiOxNy; x>y) layer, a silicon nitride oxide (SiNxOy; x>y) layer, and the like. The gate insulating layer 4 may have a laminated structure. Here, a SiNx layer (thickness: 410 nm, for example) is formed as the gate insulating layer 4.

Next, the semiconductor layer 5 and a contact layer are formed on the gate insulating layer 4. Here, the island-shaped semiconductor layer 5 and a contact layer are obtained by forming and patterning an intrinsic amorphous silicon film (thickness: 125 nm, for example) and an n+ type amorphous silicon film (thickness: 65 nm, for example) in this order. The semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5 and the source/drain electrodes.

Next, a source conductive film (thickness: 50 nm or more and 500 nm or less, for example) is formed on the gate insulating layer 4 and the contact layer and patterned to form a source metal layer including the source electrode 7S, the drain electrode 7D, and the source bus line SL. At this time, the contact layer is also etched, and the source contact layer 6S and the drain contact layer 6D separated from each other are formed.

The material of the source conductive film is not particularly limited. It is possible to appropriately use a film including a metal such as aluminum (Al), tungsten (W), molybdenum (Mo), tantalum (Ta), chromium (Cr), titanium (Ti), copper (Cu), an alloy thereof, or a metal nitride thereof. Here, a laminated film is formed as a source conductive film by laminating MoN (thickness: 30 nm, for example), Al (thickness: 200 nm, for example), and MoN (thickness: 50 nm, for example) in this order. Alternatively, a laminated film may be formed as a source conductive film in which Ti (thickness: 30 nm, for example), MoN (thickness: 30 nm, for example), Al (thickness: 200 nm, for example), and MoN (thickness: 50 nm, for example) are laminated in this order.

Here, for example, a source conductive film is formed by a sputtering method, and patterning (source/drain isolation) of a source conductive film is performed by wet etching. Thereafter, a portion of the contact layer positioned on the region to be the channel region of the semiconductor layer 5 is removed by, for example, dry etching to form a gap portion, and the source contact layer 6S and the drain contact layer 6D are separated. At this time, in the gap portion, the vicinity of the surface of the semiconductor layer 5 is also etched (over-etching).

In a case of using, for example, a laminated film in which a Ti film and an Al film are laminated in this order as a source conductive film, an Al film is patterned by wet etching, for example, using an aqueous solution of phosphoric acid nitric acid nitric acid, then the Ti film and a contact layer (n+ type amorphous silicon layer) 6 may be simultaneously patterned by dry etching. Alternatively, it is also possible to etch collectively the source conductive film and the contact layer. However, in a case of simultaneously etching the source conductive film or the underlying layer and the contact layer 6, it may be difficult to control the distribution of the etching amount of the semiconductor layer 5 (the amount of excavation of the gap portion) in the entire substrate. On the other hand, as described above, when etching is performed in a separate etching step from the source/drain separation and the formation of the gap portion, it is possible to more easily control the etching amount of the gap portion.

Next, the first insulating layer 11 is formed so as to cover the TFT 10. In this example, the first insulating layer 11 is arranged to be in contact with the channel region of the semiconductor layer 5. In addition, by known photolithography, the contact hole CH1 reaching the drain electrode 7D is formed in the first insulating layer 11.

The first insulating layer 11 may be an inorganic insulating layer formed of, for example, a silicon oxide ($SiO_2$) film, a silicon nitride (SiNx) film, a silicon oxynitride (SiOxNy; x>y) film, a silicon nitride oxide (SiNxOy; x>y), and the like. Here, as the first insulating layer 11, for example, an SiNx layer with a thickness of 330 nm, is formed by a CVD method.

Next, a conductive film for a patch is formed on the first insulating layer 11 and in the contact hole CH1 and patterned. Due to this, the patch electrode 15 is formed in the transmission/reception region R1, and the patch connection portion 15*p* is formed in the non-transmission/reception region R2. The patch electrode 15 is in contact with the drain electrode 7D in the contact hole CH1. In this specification, the layer including the patch electrode 15 and the patch connection portion 15*p* formed from the conductive film for a patch may be referred to as a "patch metal layer".

As the material of the conductive film for a patch, it is possible to use the same material as the gate conductive film or the source conductive film. However, the patch conductive film is set to be thicker than the gate conductive film and the source conductive film. Due to this, by reducing the sheet resistance of the patch electrode, it is possible to reduce the loss in which the vibration of free electrons in the patch electrode changes to heat. A suitable thickness of the patch conductive film is, for example, 0.3 μm or more. If the thickness is thinner than this, there is a possibility that the sheet resistance will become 0.10 Ω/sq or more and the loss will become large. The thickness of the conductive film for a patch is, for example, 3 μm or less, and more preferably 2 μm or less. If the thickness is thicker than this, warpage of the substrate may occur due to thermal stress during the process. If the warpage is large, problems may occur such as transport trouble, chipping of the substrate, cracking of the substrate, and the like in the mass production process.

Here, as a conductive film for a patch, a laminated film (MoN/Al/MoN) is formed in which MoN (thickness: 50 nm, for example), Al (thickness: 1000 nm, for example), and MoN (thickness: 50 nm, for example) are laminated in this order. Alternatively, a laminated film (MoN/Al/MoN/Ti) may be formed in which Ti (thickness: 50 nm, for example), MoN (thickness: 50 nm, for example), Al (thickness: 2000 nm, for example), and MoN (thickness: 50 nm, for example) are laminated in this order. Alternatively, a laminated film (MoN/Al/MoN/Ti) may be formed in which Ti (thickness: 50 nm, for example), MoN (thickness: 50 nm, for example), Al (thickness: 500 nm, for example), and MoN (thickness: 50 nm, for example) are laminated in this order. Alternatively, a laminated film (Ti/Cu/Ti) in which a Ti film, a Cu film, and a Ti film are laminated in this order, or a laminated film (Cu/Ti) in which a Ti film and a Cu film are laminated in this order may be used.

Next, a second insulating layer (thickness: 100 nm or more and 300 nm or less, for example) 17 is formed on the patch electrode 15 and the first insulating layer 11. The second insulating layer 17 is not particularly limited, and it is possible to appropriately use a silicon oxide ($SiO_2$) film, a silicon nitride (SiNx) film, a silicon oxynitride (SiOxNy; x>y) film, a silicon nitride oxide (SiNxOy; x>y) film and the like. Here, as the second insulating layer 17, for example, a SiNx layer having a thickness of 200 nm is formed.

Thereafter, the inorganic insulating film (the second insulating layer 17, the first insulating layer 11, and the gate insulating layer 4) is collectively etched by dry etching using, for example, a fluorine-based gas. In the etching, the patch electrode 15, the source bus line SL, and the gate bus line GL function as an etch stop. Due to this, a contact hole CH2 reaching the gate bus line GL is formed in the second insulating layer 17, the first insulating layer 11, and the gate insulating layer 4, and a contact hole CH3 reaching the source bus line SL is formed in the second insulating layer 17 and the first insulating layer 11. In addition, a contact hole CH4 reaching the patch connection portion 15*p* is formed in the second insulating layer 17.

In this example, since the inorganic insulating film is etched collectively, the side surfaces of the second insulating layer 17, the first insulating layer 11 and the gate insulating layer 4 are aligned with each other on the side wall of the obtained contact hole CH2, and the side walls of the second insulating layer 17 and the first insulating layer 11 are aligned with the side wall of the contact hole CH3. In this specification, "the side surfaces are aligned" for two or more different layers in the contact hole includes not only cases where the side faces exposed in the contact hole in these layers are flush in the vertical direction and cases where inclined surfaces such as a tapered shape are continuously formed. It is possible to obtain such a configuration, for example, by etching these layers using the same mask, or by etching one layer with another layer as a mask, or the like.

Next, a transparent conductive film (thickness: 50 nm or more and 200 nm or less) is formed on the second insulating layer 17 and in the contact holes CH2, CH3, and CH4 by, for example, a sputtering method. For example, it is possible to use an ITO (indium tin oxide) film, an IZO film, a ZnO film (a zinc oxide film), or the like as the transparent conductive film. Here, an ITO film having a thickness of, for example, 100 nm is used as the transparent conductive film.

Next, the transparent conductive film is patterned to form the gate terminal upper connection portion 19*g*, the source terminal upper connection portion 19*s*, and the transfer terminal upper connection portion 19*p*. The gate terminal upper connection portion 19*g*, the source terminal upper connection portion 19*s*, and the transfer terminal upper connection portion 19*p* are used for protecting the electrodes or wiring exposed at each terminal portion. In this manner, the gate terminal portion GT, the source terminal portion ST, and the transfer terminal portion PT are obtained.

<Structure of Slot Substrate 201>

Next, a more detailed description will be given of the structure of the slot substrate 201.

Figure 6:
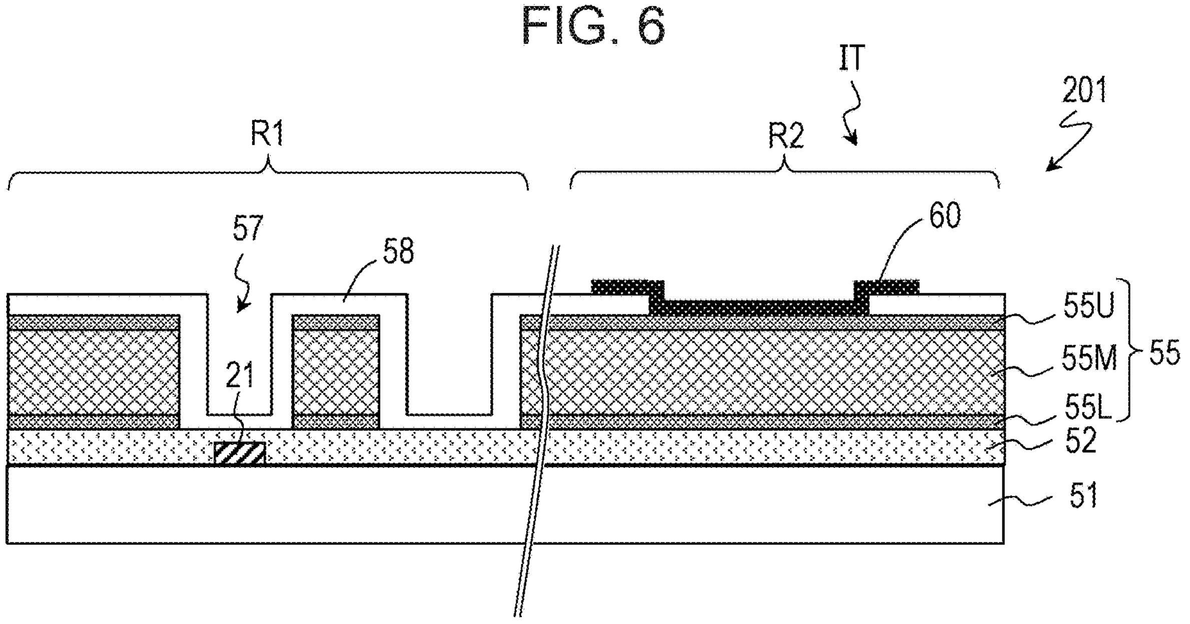
FIG. 6 is a cross-sectional view schematically showing an antenna unit region U and a terminal portion IT in the slot substrate 201.

FIG. 6 is a cross-sectional view schematically showing the antenna unit region U and the terminal portion IT in the slot substrate 201.

The slot substrate 201 is provided with the dielectric substrate 51 having a front surface and a rear surface, a third insulating layer 52 formed on the surface of the dielectric substrate 51, the slot electrode 55 formed on the third insulating layer 52, and a fourth insulating layer 58 covering the slot electrode 55. The reflective conductive plate 65 is arranged on the rear surface of the dielectric substrate 51 to face the dielectric substrate 51 via the dielectric layer (air layer) 54. The slot electrode 55 and the reflective conductive plate 65 function as walls of the waveguide 301.

In the transmission/reception region R1, a plurality of the slots 57 are formed in the slot electrode 55. The slots 57 are openings penetrating the slot electrode 55. In this example, one slot 57 is arranged in each antenna unit region U.

The fourth insulating layer 58 is formed on the slot electrode 55 and in the slots 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, thus, it is possible to increase the reliability. When the slot electrode 55 is formed of a Cu layer, Cu may elute into the liquid crystal layer LC. In addition, when the slot electrode 55 is formed of an Al layer by using a thin film deposition technique, a void may be included in the Al layer. It is possible for the fourth insulating layer 58 to prevent the liquid crystal material from entering the void of the Al layer. When the slot electrode 55 is manufactured by pasting an aluminum foil on the dielectric substrate 51 with an adhesive and carrying out patterning thereon, it is possible to avoid the problem of voids in the Al layer.

The slot electrode 55 includes a main layer 55M such as a Cu layer and an Al layer. The slot electrode 55 may have a laminated structure including the main layer 55M and an upper layer 55U and a lower layer 55L arranged with the main layer 55M interposed therebetween. The thickness of the main layer 55M is set in consideration of the skin effect according to the material, and may be, for example, 2 μm or more and 30 μm or less. The thickness of the main layer 55M is typically larger than the thicknesses of the upper layer 55U and the lower layer 55L.

In the illustrated example, the main layer 55M is a Cu layer, the upper layer 55U and the lower layer 55L are Ti layers. Arranging the lower layer 55L between the main layer 55M and the third insulating layer 52 makes it possible to improve the adhesion between the slot electrode 55 and the third insulating layer 52. In addition, providing the upper layer 55U makes it possible to suppress corrosion of the main layer 55M (for example, Cu layer).

Since the reflective conductive plate 65 forms the wall of the waveguide 301, the reflective conductive plate 65 preferably has a thickness that is three times or more the skin depth, and more preferably five times or more. For the reflective conductive plate 65, for example, it is possible to use an aluminum plate, a copper plate, or the like having a thickness of several millimeters manufactured by being cut out.

In the non-transmission/reception region R2, a terminal portion IT is provided. The terminal portion IT is provided with the slot electrode 55, the fourth insulating layer 58 covering the slot electrode 55, and an upper connection portion 60. The fourth insulating layer 58 has an opening reaching the slot electrode 55. The upper connection portion 60 is in contact with the slot electrode 55 in the opening. In the present embodiment, the terminal portion IT is arranged in the seal region Rs and connected to the transfer terminal portion on the TFT substrate by a seal resin containing conductive particles (transfer portion).

Figure 7:
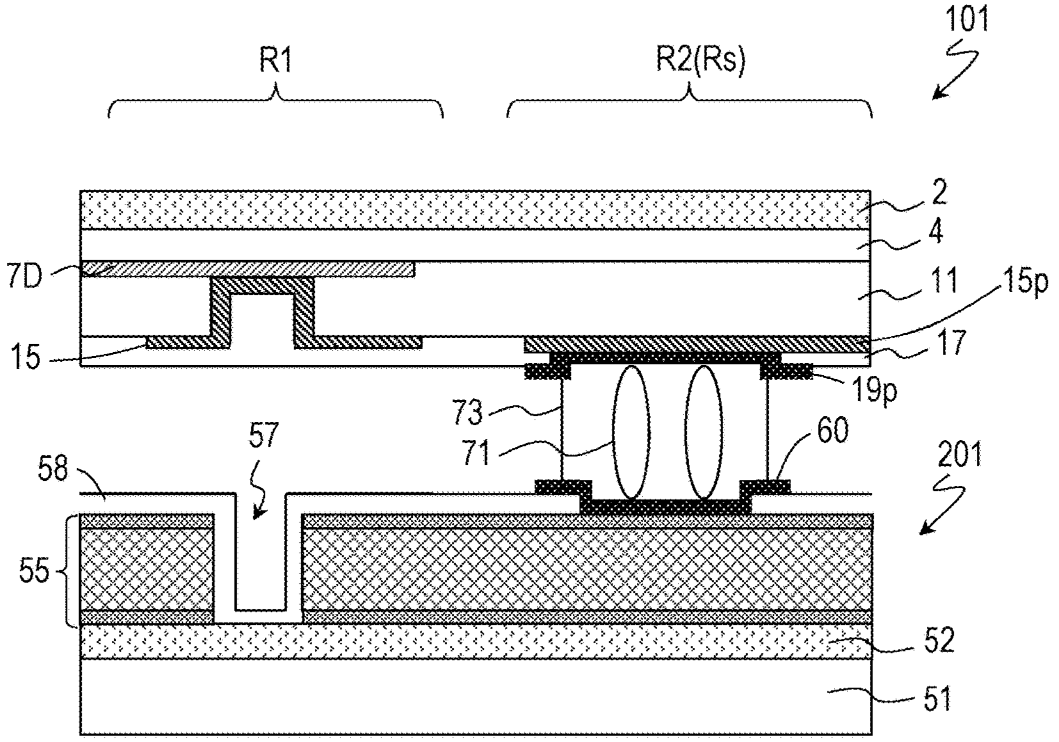
FIG. 7 is a schematic cross-sectional view for illustrating a transfer portion in the TFT substrate 101 and the slot substrate 201.

Transfer Portion FIG. 7 is a schematic cross-sectional view for illustrating a transfer portion which connects a transfer terminal portion PT of the TFT substrate 101 and the terminal portion IT of the slot substrate 201. In FIG. 7, the same reference numerals are attached to the same constituent elements as in FIG. 1 to FIG. 4.

In the transfer portion, the upper connection portion 60 of the terminal portion IT is electrically connected to the transfer terminal upper connection portion 19*p* of the transfer terminal portion PT in the TFT substrate 101. In the present embodiment, the upper connection portion 60 and the transfer terminal upper connection portion 19*p* are connected via a resin (sealing resin) 73 (may also be referred to as a "seal portion 73") including conductive beads 71.

Each of the upper connection portions 60 and 19*p* is a transparent conductive layer such as an ITO film or an IZO film, and an oxide film may be formed on the surface thereof. When an oxide film is formed, there is a possibility that it may not be possible to secure the electrical connection between the transparent conductive layers and the contact resistance may be high. On the other hand, in the present embodiment, since these transparent conductive layers are adhered via a resin including conductive beads (for example, Au beads) 71, even when the surface oxide film is formed, the conductive beads pierce through (penetrating) the surface oxide film, making it possible to suppress an increase in the contact resistance. The conductive beads 71 may penetrate not only the surface oxide film but also the upper connection portions 60 and 19*p* which are transparent conductive layers and directly contact the patch connection portion 15*p* and the slot electrode 55.

The transfer portion may be arranged both at the center portion and the peripheral portion of the scanned antenna 1000 (that is, inside and outside of the donut-like transmission/reception region R1 as viewed from the normal direction of the scanned antenna 1000) or may be arranged in only one of the above. The transfer portion may be arranged in the seal region Rs in which the liquid crystal is enclosed, or may be arranged outside (the opposite side to the liquid crystal layer) the seal region Rs.

<Method for Manufacturing Slot Substrate 201>

It is possible to manufacture the slot substrate 201 by the following method, for example.

First, the third insulating layer (thickness: 200 nm, for example) 52 is formed on the dielectric substrate. As the dielectric substrate, it is possible to use a substrate such as a glass substrate or a resin substrate having a high transmittance with respect to electromagnetic waves (the dielectric constant $\varepsilon_M$ and the dielectric loss tan $\delta_M$ are small). The dielectric substrate is preferably as thin as possible to suppress attenuation of electromagnetic waves. For example, after the constituent elements such as the slot electrode 55 are formed on the surface of the glass substrate by a process described below, the glass substrate may be thinned from the rear side. Due to this, it is possible to reduce the thickness of the glass substrate to 500 μm or less, for example.

In a case where a resin substrate is used as the dielectric substrate, the constituent elements such as the TFT may be formed directly on the resin substrate, or may be formed on the resin substrate by the transfer method. According to the transfer method, for example, a resin film (for example, a polyimide film) is formed on a glass substrate, constituent elements are formed on the resin film by a process described below, and then the resin film in which the constituent elements are formed and the glass substrate are separated. In general, the dielectric constant $\varepsilon_M$ and the dielectric loss tan $\delta_M$ of resin are smaller than that of glass. The thickness of the resin substrate is, for example, 3 μm to 300 μm. Besides polyimide, for example, it is also possible to use a liquid crystal polymer as the resin material.

The third insulating layer 52 is not particularly limited, and, for example, it is possible to appropriately use a silicon oxide ($SiO_2$) film, a silicon nitride (SiNx) film, a silicon oxynitride (SiOxNy; x>y) film, a silicon nitride oxide (SiNxOy; x>y) film, and the like.

Next, a metal film is formed on the third insulating layer 52, and this is patterned to obtain the slot electrode 55 having the plurality of the slots 57. As the metal film, a Cu film (or Al film) having a thickness of 2 μm to 5 μm may be used. Here, a laminated film in which a Ti film, a Cu film, and a Ti film are laminated in this order is used. Alternatively, a laminated film in which Ti (thickness: 50 nm, for example) and Cu (thickness: 5000 nm, for example) are laminated in this order may be formed.

Thereafter, a fourth insulating layer (thickness: 100 nm or 200 nm, for example) 58 is formed on the slot electrode 55 and in the slot 57. The material of the fourth insulating layer 58 may be the same as the material of the third insulating layer. Thereafter, in the non-transmission/reception region R2, an opening portion reaching the slot electrode 55 is formed in the fourth insulating layer 58.

Next, a transparent conductive film is formed on the fourth insulating layer 58 and in the opening portion of the fourth insulating layer 58, and is patterned to form the upper connection portion 60 in contact with the slot electrode 55 in the opening portion. Due to this, a terminal portion IT is obtained.

<Material and Structure of TFT 10>

In the present embodiment, a TFT with the semiconductor layer 5 as an active layer is used as a switching element arranged in each pixel. The semiconductor layer 5 is not limited to an amorphous silicon layer and may be a polysilicon layer or an oxide semiconductor layer.

In a case where an oxide semiconductor layer is used, the oxide semiconductor included in the oxide semiconductor layer may be an amorphous oxide semiconductor or may be a crystalline oxide semiconductor having a crystalline portion. Examples of the crystalline oxide semiconductor include a polycrystalline oxide semiconductor, a microcrystalline oxide semiconductor, a crystalline oxide semiconductor in which the c-axis is oriented substantially perpendicularly to the layer surface, and the like.

The oxide semiconductor layer may have a laminated structure of two or more layers. In a case where the oxide semiconductor layer has a laminated structure, the oxide semiconductor layer may include an amorphous oxide semiconductor layer and a crystalline oxide semiconductor layer. Alternatively, a plurality of crystalline oxide semiconductor layers having different crystal structures may be included. In addition, a plurality of amorphous oxide semiconductor layers may be included. In a case where the oxide semiconductor layer has a two-layer structure including an upper layer and a lower layer, the energy gap of the oxide semiconductor included in the upper layer is preferably larger than the energy gap of the oxide semiconductor included in the lower layer. However, in a case where the difference in energy gap between these layers is relatively small, the energy gap of the lower layer oxide semiconductor may be larger than the energy gap of the upper layer oxide semiconductor.

The material, structure, and film forming method of the amorphous oxide semiconductor and each of the above-described crystalline oxide semiconductors, the configuration of an oxide semiconductor layer having a laminated structure, and the like are described in, for example, Japanese Unexamined Patent Application Publication No. 2014-007399. All the disclosed content of Japanese Unexamined Patent Application Publication No. 2014-007399 is incorporated in the present specification by reference.

The oxide semiconductor layer may include, for example, at least one type of metal element selected from In, Ga, and Zn. In the present embodiment, the oxide semiconductor layer includes, for example, an In—Ga—Zn—O-based semiconductor (for example, indium gallium zinc oxide). Here, the In—Ga—Zn—O-based semiconductor is a ternary oxide of In (indium), Ga (gallium), and Zn (zinc), and the ratio (composition ratio) of In, Ga, and Zn is not particularly limited and includes, for example, In:Ga:Zn=2:2:1, In:Ga:Zn=1:1:1, In:Ga:Zn=1:1:2, and the like. It is possible to form such an oxide semiconductor layer from an oxide semiconductor film including an In—Ga—Zn—O-based semiconductor.

The In—Ga—Zn—O-based semiconductor may be amorphous or may be crystalline. As a crystalline In—Ga—Zn—O-based semiconductor, a crystalline In—Ga—Zn—O-based semiconductor in which the c-axis is oriented substantially perpendicular to the layer surface is preferable.

Here, the crystal structures of crystalline In—Ga—Zn—O-based semiconductors are disclosed in, for example, Japanese Unexamined Patent Application Publication No. 2014-007399, Japanese Unexamined Patent Application Publication No. 2012-134475, and Japanese Unexamined Patent Application Publication No. 2014-209727, and the like described above. All of the disclosed content of Japanese Unexamined Patent Application Publication No. 2012-134475 and Japanese Unexamined Patent Application Publication No. 2014-209727 are incorporated in the present specification by reference. Since a TFT having an In—Ga—Zn—O-based semiconductor layer has high mobility (more than 20 times compared with an a-Si TFT) and low leak current (less than 1/100th compared with an a-Si TFT), such a TFT is preferably used as a driving TFT (for example, a TFT included in a driving circuit to be provided in a non-transmission/reception region) and as a TFT to be provided in each antenna unit region.

Instead of the In—Ga—Zn—O-based semiconductor, the oxide semiconductor layer may include another oxide semiconductor. For example, an In—Sn—Zn—O-based semiconductor (for example, $In_2O_3$—$SnO_2$—ZnO; InSnZnO) may be included. The In—Sn—Zn—O-based semiconductor is a ternary oxide of In (indium), Sn (tin), and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, or the like.

In the example shown in FIG. 3, the TFT 10 is a channel etch type TFT having a bottom gate structure. In the "channel etch type TFT", no etch stop layer is formed on the channel region, and the lower surface of the end portion of the source and drain electrodes on the channel side is arranged to be in contact with the upper surface of the semiconductor layer. The channel etch type TFT is formed, for example, by forming a conductive film for a source/drain electrode on a semiconductor layer and performing source/drain separation. In the source/drain separation step, the surface portion of the channel region may be etched.

Here, the TFT 10 may be an etch stop type TFT in which an etch stop layer is formed on a channel region. In the etch stop type TFT, the lower surface of the end portion of the source and drain electrodes on the channel side is positioned, for example, on the etch stop layer. An etch stop type TFT is formed by, for example, forming an etch stop layer covering a portion to be a channel region in a semiconductor layer, then forming a conductive film for a source/drain electrode on a semiconductor layer and an etch stop layer, and performing a source/drain separation.

In addition, the TFT 10 has a top contact structure in which the source and drain electrodes are in contact with the top surface of the semiconductor layer, but the source and drain electrodes may be arranged to be in contact with the lower surface of the semiconductor layer (bottom contact structure). Further, the TFT 10 may have a bottom gate structure having a gate electrode on the dielectric substrate side of the semiconductor layer, or a top gate structure having a gate electrode above the semiconductor layer.

Second Embodiment

A description will be given of the scanned antenna of the second embodiment with reference to the drawings. The TFT substrate of the scanned antenna of the present embodiment is different from the TFT substrate 101 shown in FIG. 2 in that a transparent conductive layer which is an upper connection portion of each terminal portion is provided between the first insulating layer and the second insulating layer of the TFT substrate.

Figure 8:
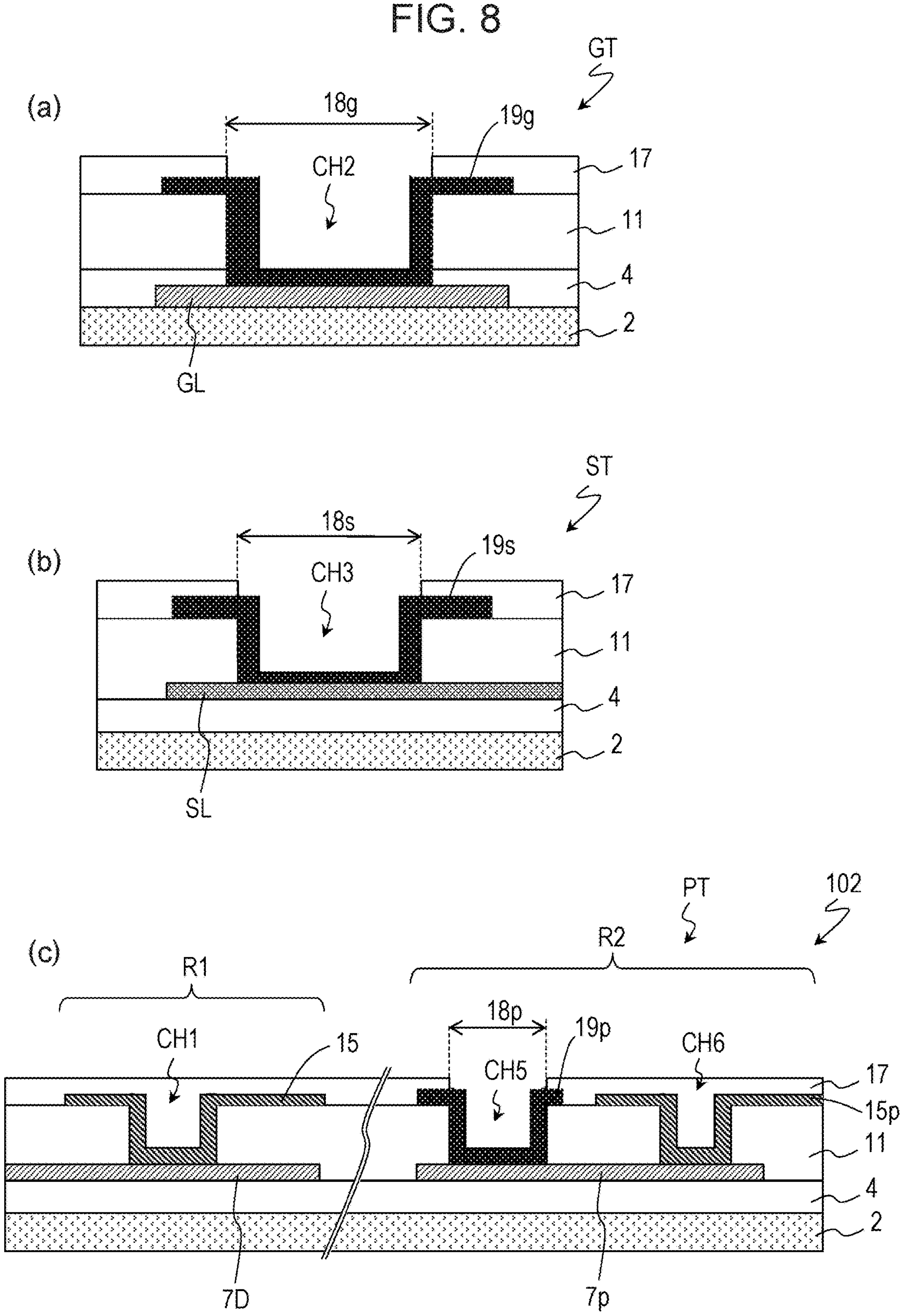
FIG. 8(*a*) to FIG. 8(*c*) are cross-sectional views showing a gate terminal portion GT, a source terminal portion ST, and a transfer terminal portion PT of a TFT substrate 102 in a second embodiment, respectively.

FIG. 8(*a*) to FIG. 8(*c*) are cross-sectional views showing the gate terminal portion GT, the source terminal portion ST, and the transfer terminal portion PT of the TFT substrate 102 in the present embodiment, respectively. Constituent elements which are the same as those in FIG. 4 are denoted by the same reference numerals, and description thereof will be omitted. Since the cross-sectional structure of the antenna unit region U is the same as that of the above-described embodiment (FIG. 3) and illustration and explanation thereof will be omitted.

The gate terminal portion GT in the present embodiment is provided with a gate bus line GL formed on a dielectric substrate, an insulating layer covering the gate bus line GL, and the upper connection portion 19_g_ for the gate terminal. The gate terminal upper connection portion 19_g_ is in contact with the gate bus line GL in the contact hole CH2 formed in the insulating layer. In this example, the insulating layer covering the gate bus line GL includes the gate insulating layer 4 and the first insulating layer 11. The second insulating layer 17 is formed on the gate terminal upper connection portion 19_g_ and the first insulating layer 11. The second insulating layer 17 has an opening portion 18_g_ which exposes a part of the gate terminal upper connection portion 19_g_. In this example, the opening portion 18_g_ of the second insulating layer 17 may be arranged so as to expose the entire contact hole CH2.

The source terminal portion ST is provided with a source bus line SL formed on the dielectric substrate (here, on the gate insulating layer 4), an insulating layer covering the source bus line SL, and a source terminal upper connection portion 19_s_. The source terminal upper connection portion 19_s_ is in contact with the source bus line SL in the contact hole CH3 formed in the insulating layer. In this example, the insulating layer covering the source bus line SL includes only the first insulating layer 11. The second insulating layer 17 extends on the source terminal upper connection portion 19_s_ and the first insulating layer 11. The second insulating layer 17 has an opening portion 18_s_ exposing a part of the source terminal upper connection portion 19_s_. The opening portion 18_s_ of the second insulating layer 17 may be arranged so as to expose the entire contact hole CH3.

The transfer terminal portion PT has a source connection wiring 7_p_ formed from the same conductive film (source conductive film) as the source bus line SL, the first insulating layer 11 extending over the source connection wiring 7_p_, and a transfer terminal upper connection portion 19_p_ and the patch connection portion 15_p_ formed on the first insulating layer 11.

The first insulating layer 11 is provided with contact holes CH5 and CH6 for exposing the source connection wiring 7_p_. The transfer terminal upper connection portion 19_p_ is arranged on the first insulating layer 11 and in the contact hole CH5 and is in contact with the source connection wiring 7_p_ in the contact hole CH5. The patch connection portion 15_p_ is arranged on the first insulating layer 11 and in the contact hole CH6 and is in contact with the source connection wiring 7_p_ in the contact hole CH6. The transfer terminal upper connection portion 19_p_ is a transparent electrode formed of a transparent conductive film. The patch connection portion 15_p_ is formed of the same conductive film as the patch electrode 15. Here, the upper connection portions 19_g_, 19_s_, and 19_p_ of the respective terminal portions may be formed of the same transparent conductive film.

The second insulating layer 17 extends on the transfer terminal upper connection portion 19_p_, the patch connection portion 15_p_, and the first insulating layer 11. The second insulating layer 17 has an opening portion 18_p_ exposing a part of the transfer terminal upper connection portion 19_p_. In this example, the opening portion 18_p_ of the second insulating layer 17 is arranged so as to expose the entire contact hole CH5. On the other hand, the patch connection portion 15_p_ is covered with the second insulating layer 17.

In this manner, in the present embodiment, the transfer terminal upper connection portion 19_p_ of the transfer terminal portion PT and the patch connection portion 15_p_ are electrically connected by the source connection wiring 7_p_ formed in the source metal layer. Although not shown, in the same manner as in the embodiment described above, the transfer terminal upper connection portion 19_p_ is connected to the slot electrode of the slot substrate 201 by a sealing resin containing conductive particles.

In the embodiment described above, the contact holes CH1 to CH4 having different depths are collectively formed after the formation of the second insulating layer 17. For example, comparatively thick insulating layers (gate insulating layer 4, first insulating layer 11, and second insulating layer 17) are etched on the gate terminal portion GT, while only the second insulating layer 17 is etched in the transfer terminal portion PT. Therefore, there is a possibility that a conductive film (for example, a conductive film for a patch electrode) which is a base of a shallow contact hole may be greatly damaged during etching.

On the other hand, in the present embodiment, contact holes CH1 to CH3, CH5, and CH6 are formed before the second insulating layer 17 is formed. Since these contact holes are formed in only the first insulating layer 11 or a laminated film of the first insulating layer 11 and the gate insulating layer 4, it is possible to reduce the difference in the depth of the contact holes formed collectively, compared to previous embodiments. Therefore, it is possible to reduce damage to the conductive film which is to be the base of the contact hole. In particular, in a case where an Al film is used for the conductive film for the patch electrode, if a direct contact is made between the ITO film and the Al film, it is not possible to obtain a good contact, thus, a cap layer such as a MoN layer may be formed on an upper layer of the Al film. In such a case, it is not necessary to increase the thickness of the cap layer in consideration of damage during etching, which is advantageous.

<Method for Manufacturing TFT Substrate 102>

Figure 9:
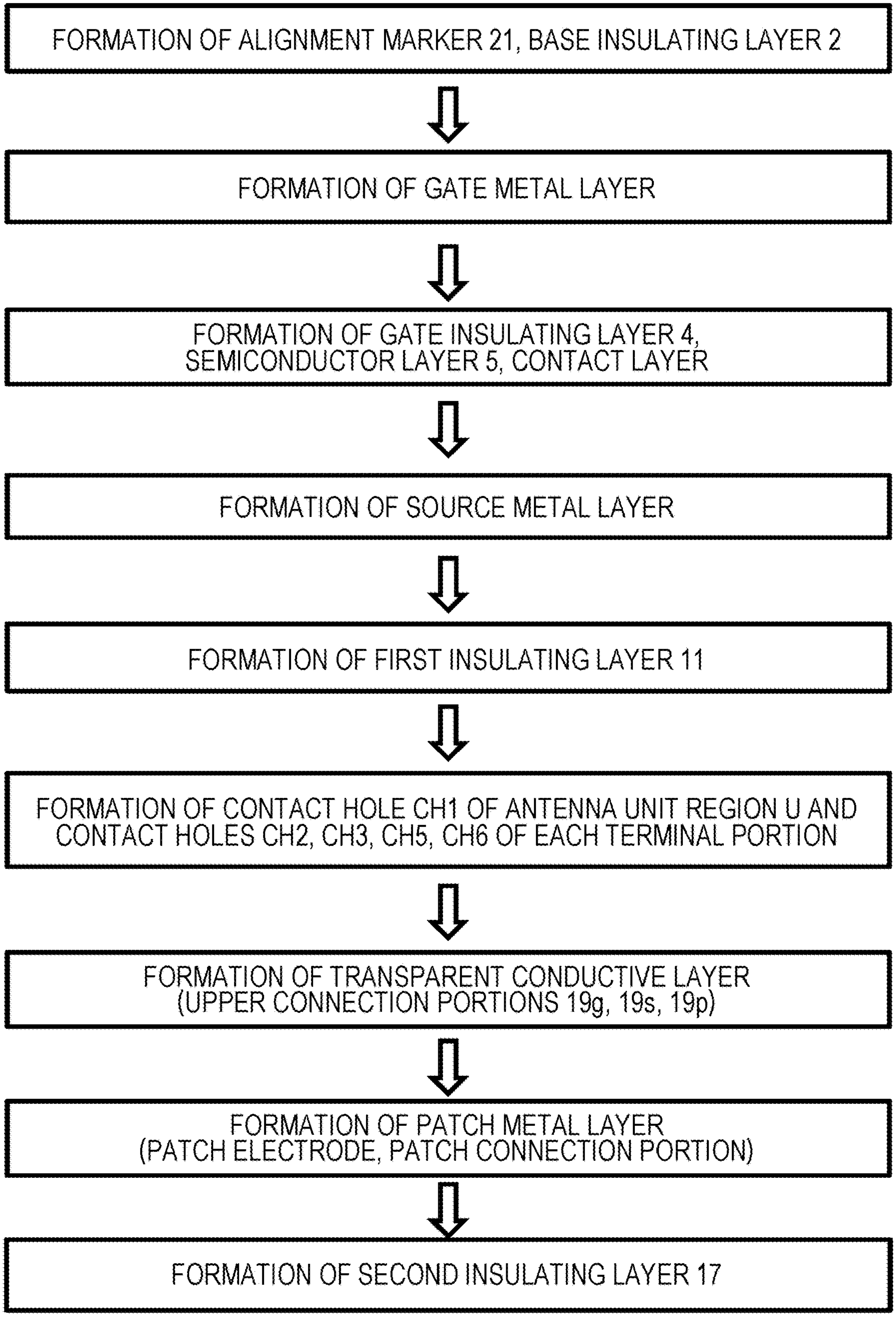
FIG. 9 is a view showing an example of manufacturing steps of the TFT substrate 102.

The TFT substrate 102 is manufactured by the following method, for example. FIG. 9 is a diagram illustrating steps of manufacturing the TFT substrate 102. In the following description, in a case where the material, thickness, formation method, and the like of each layer are the same as the TFT substrate 101 described above, description thereof will be omitted.

First, an alignment mark, a base insulating layer, a gate metal layer, a gate insulating layer, a semiconductor layer, a contact layer, and a source metal layer are formed on a dielectric substrate with the same methods as the TFT substrate 102 to obtain a TFT. In the step of forming the source metal layer, in addition to the source and drain electrodes and the source bus line, the source connection wiring 7_p_ is also formed from the source conductive film.

Next, the first insulating layer 11 is formed so as to cover the source metal layer. Thereafter, the first insulating layer 11 and the gate insulating layer 4 are collectively etched to form contact holes CH1 to CH3, CH5, and CH6. In the etching, the source bus line SL and the gate bus line GL function as an etch stop. Due to this, in the transmission/reception region R1, the contact hole CH1 reaching the drain electrode of the TFT is formed in the first insulating layer 11. In addition, in the non-transmission/reception region R2, the contact hole CH2 reaching the gate bus line GL is formed in the first insulating layer 11 and the gate insulating layer 4 and the contact hole CH3 reaching the source bus line SL and the contact holes CH5 and CH6 reaching the source connection wiring 7_p_ are formed in the first insulating layer 11. The contact hole CH5 may be arranged in the seal region Rs and the contact hole CH6 may be arranged outside the seal region Rs. Alternatively, both may be arranged outside the seal region Rs.

Next, a transparent conductive film is formed on the first insulating layer 11 and in the contact holes CH1 to CH3, CH5, and CH6, and patterned. Due to this, the gate terminal upper connection portion 19*g* in contact with the gate bus line GL in the contact hole CH2, the source terminal upper connection portion 19*s* in contact with the source bus line SL in the contact hole CH3, and the transfer terminal upper connection portion 19*p* in contact with the source connection wiring 7*p* in the contact hole CH5 are formed.

Next, a patch electrode conductive film is formed on the first insulating layer 11, on the gate terminal upper connection portion 19*g*, the source terminal upper connection portion 19*s*, and the transfer terminal upper connection portion 19*p*, and in the contact holes CH1 and CH6, and patterned. Due to this, the patch electrode 15 in contact with the drain electrode 7D in the contact hole CH1 is formed in the transmission/reception region R1 and the patch connection portion 15*p* in contact with the source connection wiring 7*p* in the contact hole CH6 is formed in the non-transmission/reception region R2. Patterning of the conductive film for a patch electrode may be performed by wet etching. Here, an etchant capable of increasing the etching selection ratio between the transparent conductive film (ITO or the like) and the patch electrode conductive film (for example, Al film) is used. Due to this, it is possible to cause the transparent conductive film to function as an etch stop when patterning the conductive film for a patch electrode. Since portions of the source bus line SL, the gate bus line GL, and the source connection wiring 7*p* exposed at the contact holes CH2, CH3, and CH5 are covered with an etch stop (transparent conductive film), these are not etched.

Subsequently, the second insulating layer 17 is formed. Thereafter, patterning of the second insulating layer 17 is performed by dry etching using a fluorine-based gas, for example. Due to this, in the second insulating layer 17, the opening portion 18*g* exposing the gate terminal upper connection portion 19*g*, the opening portion 18*s* exposing the source terminal upper connection portion 19*s*, and the opening portion 18*p* exposing the transfer terminal upper connection portion 19*p* are provided. In this manner, the TFT substrate 102 is obtained.

Third Embodiment

A description will be given of the scanned antenna of the third embodiment with reference to the drawings. The TFT substrate in the scanned antenna of the present embodiment is different from the TFT substrate 102 shown in FIG. 8 in that an upper connection portion formed of a transparent conductive film is not provided in the transfer terminal portion.

Figure 10:
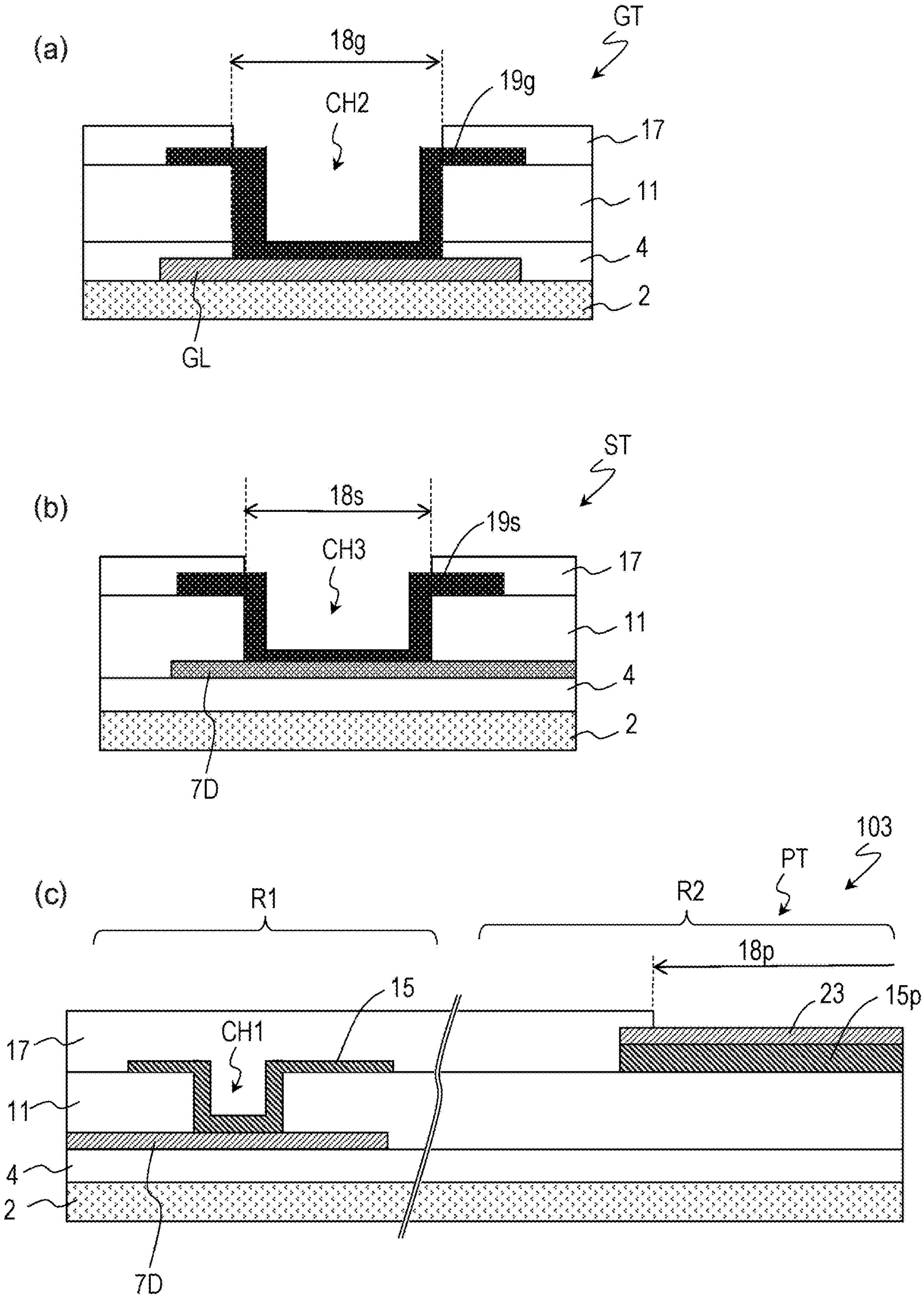
FIG. 10(*a*) to FIG. 10(*c*) are cross-sectional views showing a gate terminal portion GT, a source terminal portion ST, and a transfer terminal portion PT, of a TFT substrate 103 in a third embodiment, respectively.

FIG. 10(*a*) to FIG. 10(*c*) are cross-sectional views showing the gate terminal portion GT, the source terminal portion ST, and the transfer terminal portion PT of the TFT substrate 103 in the present embodiment, respectively. Constituent elements which as the same as those in FIG. 8 are denoted by the same reference numerals, and description thereof will be omitted. Since the structure of the antenna unit region U is the same as that of the above-described embodiment (FIG. 3), illustration and explanation thereof will be omitted.

The structures of the gate terminal portion GT and the source terminal portion ST are the same structures as those of the gate terminal portion and the source terminal portion of the TFT substrate 102 shown in FIG. 8.

The transfer terminal portion PT has the patch connection portion 15*p* formed on the first insulating layer 11 and a protective conductive layer 23 overlaid on the patch connection portion 15*p*. The second insulating layer 17 extends over the protective conductive layer 23 and has the opening portion 18*p* exposing a part of the protective conductive layer 23. On the other hand, the patch electrode 15 is covered with the second insulating layer 17.

<Method for Manufacturing TFT Substrate 103>

Figure 11:
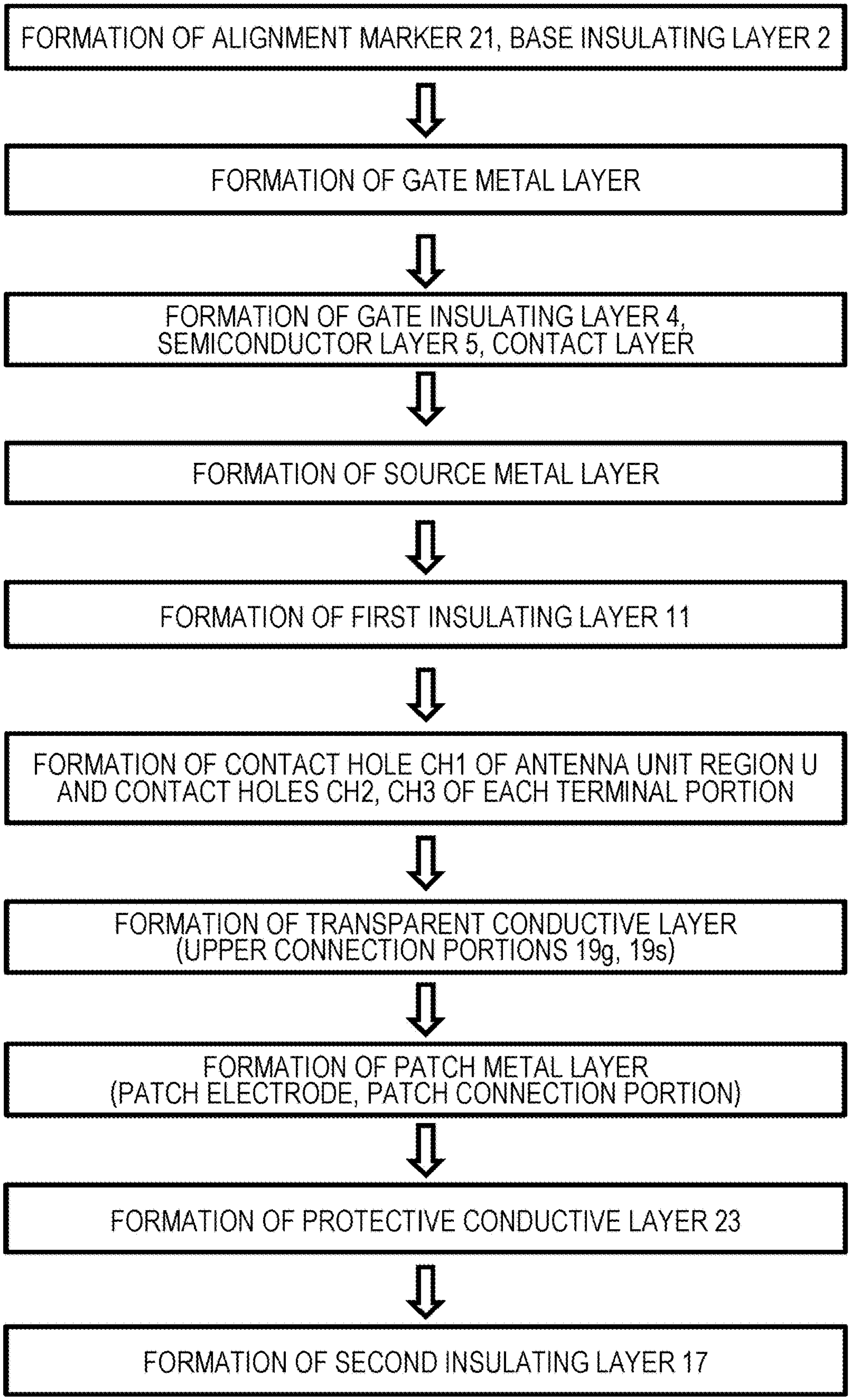
FIG. 11 is a view showing an example of manufacturing steps of the TFT substrate 103.

The TFT substrate 103 is manufactured by the following method, for example. FIG. 11 is a diagram illustrating steps of manufacturing the TFT substrate 103. In the following description, in a case where the material, thickness, formation method, and the like of each layer are the same as those of the TFT substrate 101 described above, description thereof will be omitted.

First, an alignment mark, a base insulating layer, a gate metal layer, a gate insulating layer, a semiconductor layer, a contact layer, and a source metal layer are formed on a dielectric substrate with the same method as the TFT substrate 101 to obtain a TFT.

Next, the first insulating layer 11 is formed so as to cover the source metal layer. Thereafter, the first insulating layer 11 and the gate insulating layer 4 are collectively etched to form contact holes CH1 to CH3. In the etching, the source bus line SL and the gate bus line GL function as an etch stop. Due to this, the contact hole CH1 reaching the drain electrode of the TFT is formed in the first insulating layer 11, the contact hole CH2 reaching the gate bus line GL is formed in the first insulating layer 11 and the gate insulating layer 4, and the contact hole CH3 reaching the source bus line SL is formed in the first insulating layer 11. No contact hole is formed in the region where the transfer terminal portion is formed.

Next, a transparent conductive film is formed on the first insulating layer 11 and in the contact holes CH1, CH2, and CH3, and patterned. Due to this, the gate terminal upper connection portion 19*g* in contact with the gate bus line GL is formed in the contact hole CH2 and the source terminal upper connection portion 19*s* in contact with the source bus line SL is formed in the contact hole CH3. In the region where the transfer terminal portion is formed, the transparent conductive film is removed.

Next, a patch electrode conductive film is formed on the first insulating layer 11, on the gate terminal upper connection portion 19*g* and the source terminal upper connection portion 19*s*, and in the contact hole CH1, and patterning is performed. Due to this, the patch electrode 15 in contact with the drain electrode 7D in the contact hole CH1 is formed in the transmission/reception region R1, and the patch connection portion 15*p* is formed in the non-transmission/reception region R2. In the same manner as the embodiments described above, an etchant capable of securing an etching selection ratio between a transparent conductive film (ITO or the like) and a conductive film for a patch electrode is used for patterning the patch electrode conductive film.

Subsequently, the protective conductive layer 23 is formed on the patch connection portion 15*p*. As the protective conductive layer 23, it is possible to use a Ti layer, an ITO layer, an IZO (indium zinc oxide) layer, and the like (thickness: 50 nm or more and 100 nm or less, for example). Here, a Ti layer (thickness: 50 nm, for example) is used as the protective conductive layer 23. Here, the protective conductive layer may be formed on the patch electrode 15.

Next, the second insulating layer 17 is formed. Thereafter, patterning of the second insulating layer 17 is performed by dry etching using a fluorine-based gas, for example. Due to this, the opening portion 18*g* exposing the gate terminal upper connection portion 19*g*, the opening portion 18*s* exposing the source terminal upper connection portion 19*s*, and the opening portion 18*p* exposing the protective conductive layer 23 are provided in the second insulating layer 17. In this manner, the TFT substrate 103 is obtained.

<Structure of Slot Substrate 203>

Figure 12:
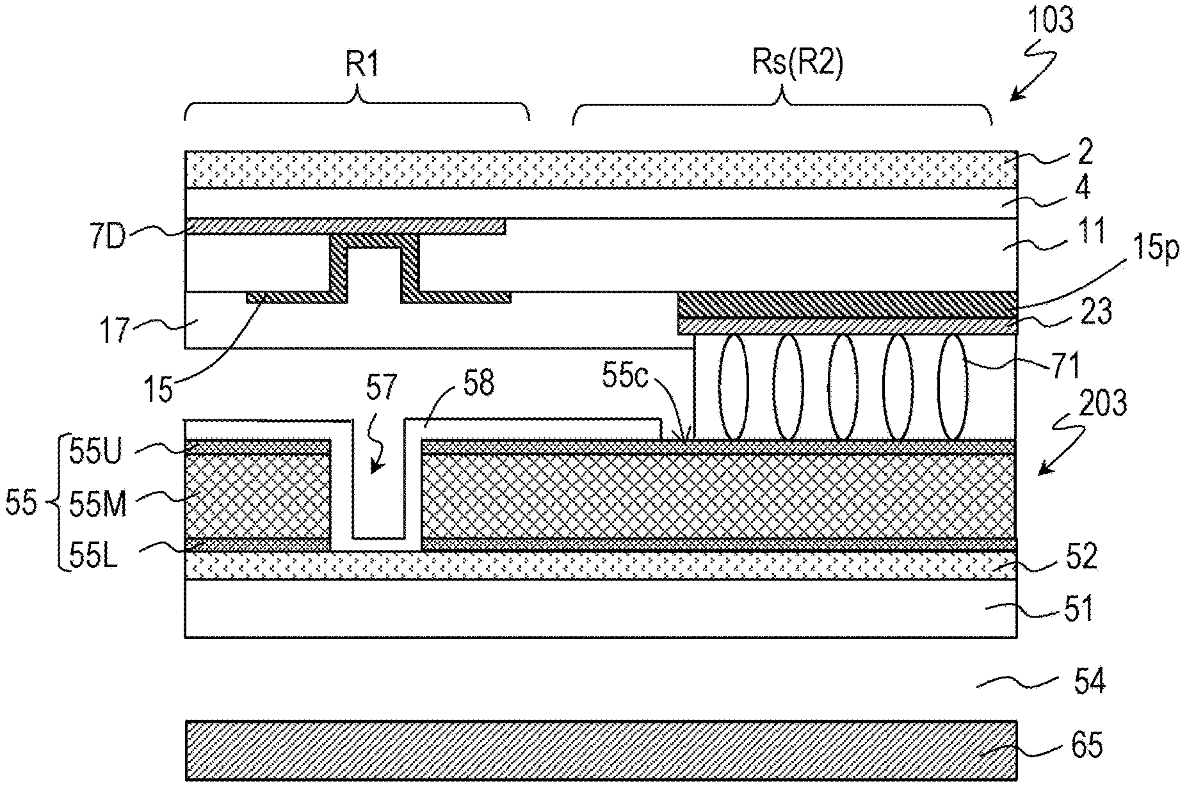
FIG. 12 is a schematic cross-sectional view for illustrating a transfer portion in the TFT substrate 103 and a slot substrate 203.

FIG. 12 is a schematic cross-sectional view for illustrating a transfer portion which connects the transfer terminal portion PT of the TFT substrate 103 and the terminal portion IT of the slot substrate 203 in the present embodiment. In FIG. 12, the same reference numerals are attached to the same constituent elements as in the above embodiment.

First, a description will be given of the slot substrate 203 in the present embodiment. The slot substrate 203 is provided with the dielectric substrate 51, the third insulating layer 52 formed on the surface of the dielectric substrate 51, the slot electrode 55 formed on the third insulating layer 52, and the fourth insulating layer 58 covering the slot electrode 55. The reflective conductive plate 65 is arranged to face the rear surface of the dielectric substrate 51 via a dielectric layer (air layer) 54. The slot electrode 55 and the reflective conductive plate 65 function as a wall of the waveguide 301.

The slot electrode 55 has a laminated structure having a Cu layer or an Al layer as the main layer 55M. In the transmission/reception region R1, the slot electrode 55 is formed with a plurality of the slots 57. The structure of the slot electrode 55 in the transmission/reception region R1 is the same as the structure of the slot substrate 201 described above with reference to FIG. 6.

In the non-transmission/reception region R2, a terminal portion IT is provided. In the terminal portion IT, an opening exposing the surface of the slot electrode 55 is provided in the fourth insulating layer 58. The exposed region of the slot electrode 55 becomes a contact surface 55*c*. As described above, in the present embodiment, the contact surface 55*c* of the slot electrode 55 is not covered with the fourth insulating layer 58.

In the transfer portion, the protective conductive layer 23 covering the patch connection portion 15*p* of the TFT substrate 103 and the contact surface 55*c* of the slot electrode 55 in the slot substrate 203 are connected via a resin (sealing resin) including the conductive beads 71.

In the same manner as in the embodiment described above, the transfer portion in the present embodiment may be arranged both in the center portion and the peripheral portion of the scanned antenna, or may be arranged in only one thereof. In addition, the transfer portion may be arranged in the seal region Rs or may be arranged outside (the opposite side to the liquid crystal layer) the seal region Rs.

In the present embodiment, no transparent conductive film is provided on the contact surface of the transfer terminal portion PT and the terminal portion IT. Therefore, it is possible to connect the protective conductive layer 23 and the slot electrode 55 of the slot substrate 203 via a sealing resin containing conductive particles.

In addition, in the present embodiment, since the difference in the depth of the contact holes formed collectively is small in comparison with the first embodiment (FIG. 3 and FIG. 4), it is possible to reduce the damage to the conductive film which is the base of the contact hole.

<Method for Manufacturing Slot Substrate 203>

The slot substrate 203 is manufactured as follows. Since the material, the thickness, and the forming method for each layer are the same as those of the slot substrate 201, description thereof will be omitted.

First, with the same method as the slot substrate 201, the third insulating layer 52 and the slot electrode 55 are formed on the dielectric substrate and a plurality of the slots 57 are formed in the slot electrode 55. Next, the fourth insulating layer 58 is formed on the slot electrode 55 and in the slot. Thereafter, the opening portion 18*p* is provided in the fourth insulating layer 58 so as to expose a region which is a contact surface of the slot electrode 55. In this manner, the slot substrate 203 is manufactured.

<Internal Heater Structure>

As described above, the dielectric anisotropy $\Delta\varepsilon_M$ of the liquid crystal material used for the antenna unit of the antenna is preferably large. However, there is a problem in that the viscosity of a liquid crystal material (nematic liquid crystal) having a large dielectric anisotropy $\Delta\varepsilon_M$ is large and the response speed is slow. In particular, when the temperature decreases, the viscosity rises. The environmental temperature of a scanned antenna mounted on a moving body (for example, a ship, an aircraft, a car) changes. Therefore, it is possible to adjust the temperature of the liquid crystal material to a certain degree or more, for example, 30° C. or higher, or 45° C. or higher, which is preferable. The set temperature is preferably set such that the viscosity of the nematic liquid crystal material is approximately 10 cP (centipoise) or less.

In addition to the structure described above, the scanned antenna according to the embodiment of the present invention preferably has an internal heater structure. As the internal heater, a resistance heating type heater using Joule heat is preferable. The material of the resistance film for the heater is not particularly limited, but it is possible to use a conductive material having comparatively high resistivity such as ITO or IZO, for example. In addition, in order to adjust the resistance value, a resistance film may be formed with thin lines or meshes of metal (for example, nichrome, titanium, chromium, platinum, nickel, aluminum, or copper). It is also possible to use thin lines or meshes of ITO, IZO, or the like. The resistance value may be set according to the required calorific value.

For example, in order to set the area (approximately 90,000 $mm^2$) of a circle having a diameter of 340 mm to 100 V AC (60 Hz) and the heating temperature of the resistance film to 30° C., the resistance value of the resistance film may be set to 139Ω, the current may be set to 0.7 A, and the power density may be set to 800 $W/m^2$. In order to make the heating temperature of the resistance film 45° C. with the same area at 100 V AC (60 Hz), the resistance value of the resistance film may be set to 82Ω, the current may be set to 1.2 A, and the power density may be set to 1350 $W/m^2$.

Figure 13:
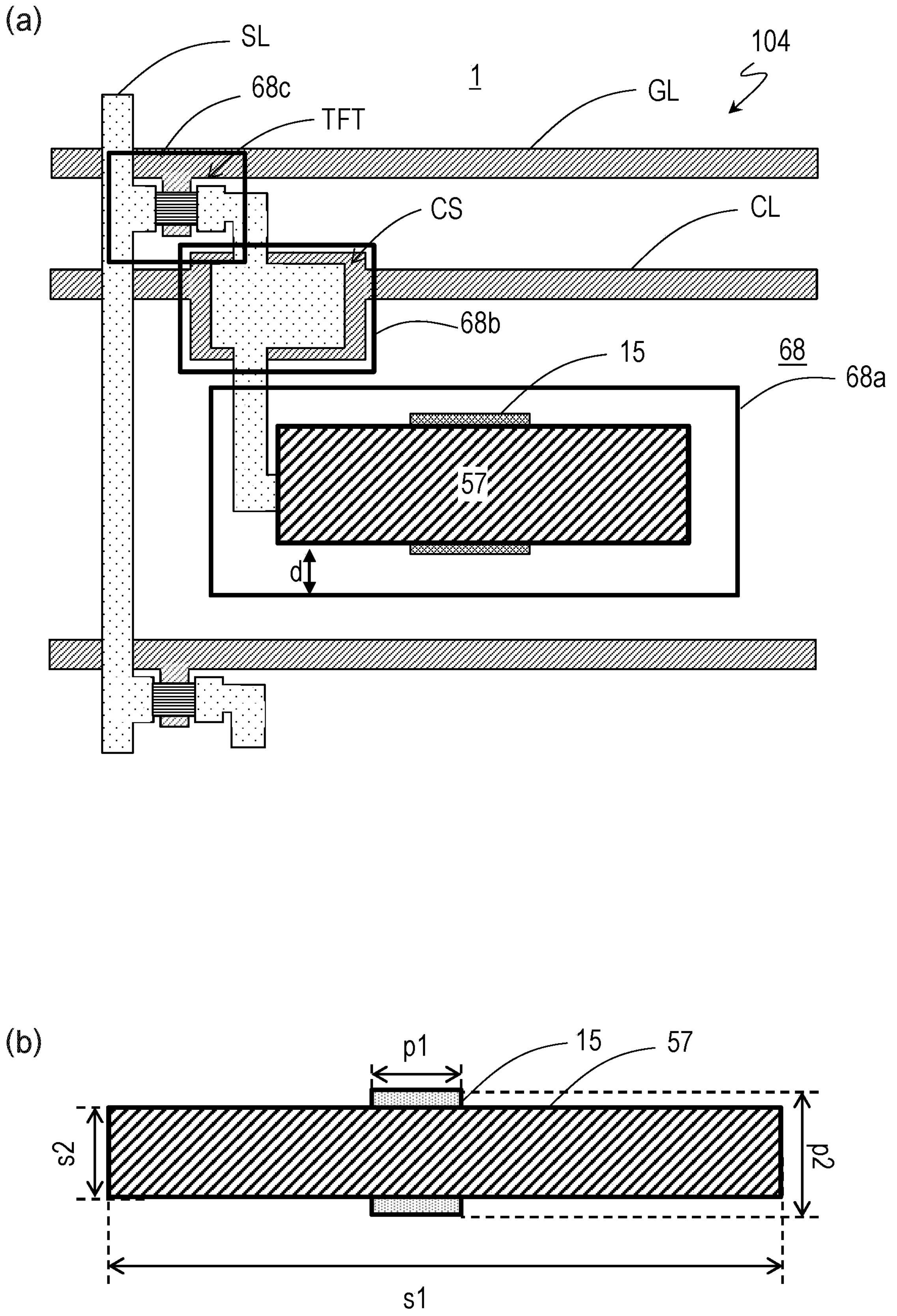
FIG. 13(*a*) is a schematic plan view of a TFT substrate 104 having a heater resistance film 68, and FIG. 13(*b*) is a schematic plan view for illustrating the sizes of a slot 57 and a patch electrode 15.

The resistance film for the heater may be provided anywhere as long as the operation of the scanned antenna is not affected, but in order to efficiently heat the liquid crystal material, the resistance film is preferably provided near the liquid crystal layer. For example, as shown in the TFT substrate 104 shown in FIG. 13(*a*), the resistance film 68 may be formed over almost the entire surface of the dielectric substrate 1. FIG. 13(*a*) is a schematic plan view of the TFT substrate 104 having the heater resistance film 68. The resistance film 68 is covered with, for example, the base insulating film 2 shown in FIG. 3. The base insulating film 2 is formed to have a sufficient dielectric strength.

The resistance film 68 preferably has opening portions 68*a*, 68*b*, and 68*c*. When the TFT substrate 104 and the slot substrate are bonded to each other, the slot 57 is positioned to face the patch electrode 15. At this time, the opening portion 68*a* is arranged such that the resistance film 68 is not present at the periphery at a distance d from the edge of the slot 57. d is, for example, 0.5 mm. In addition, the opening portion 68*b* is also preferably arranged under the storage capacitor CS and the opening portion 68*c* is preferably arranged under the TFT.

The size of the antenna unit U is, for example, 4 mm×4 mm. In addition, as shown in FIG. 13(*b*), for example, the width s2 of the slot 57 is 0.5 mm, the length s1 of the slot 57 is 3.3 mm, the width p2 of the patch electrode 15 in the width direction of the slot 57 is 0.7 mm, and the width p1 of the patch electrode 15 in the length direction of the slot is 0.5 mm. The sizes, shapes, arrangement relationships, and the like of the antenna unit U, the slot 57, and the patch electrode 15 are not limited to the examples shown in FIG. 13(*a*) and FIG. 13(*b*).

In order to further reduce the influence of the electric field from the heater resistance film 68, the shield conductive layer may be formed. The shield conductive layer is formed on almost the entire surface of the dielectric substrate 1, for example, on the base insulating film 2. It is not necessary to provide opening portions 68*a* and 68*b* in the shield conductive layer as in resistance film 68, but it is preferable to provide the opening portion 68*c*. The shield conductive layer is formed of, for example, an aluminum layer and has a ground potential.

In addition, it is preferable that the resistance value of the resistance film has a distribution such that it is possible to uniformly heat the liquid crystal layer. The temperature distribution of the liquid crystal layer preferably has a maximum temperature-minimum temperature (temperature unevenness) of, for example, 15° C. or less. When the temperature unevenness exceeds 15° C., the phase difference modulation varies within the plane, and there may be a problem that in good beam formation is not possible. In addition, when the temperature of the liquid crystal layer approaches the Tni point (for example, 125° C.), $\Delta\varepsilon_M$ is small, which is not preferable.

Figure 14:
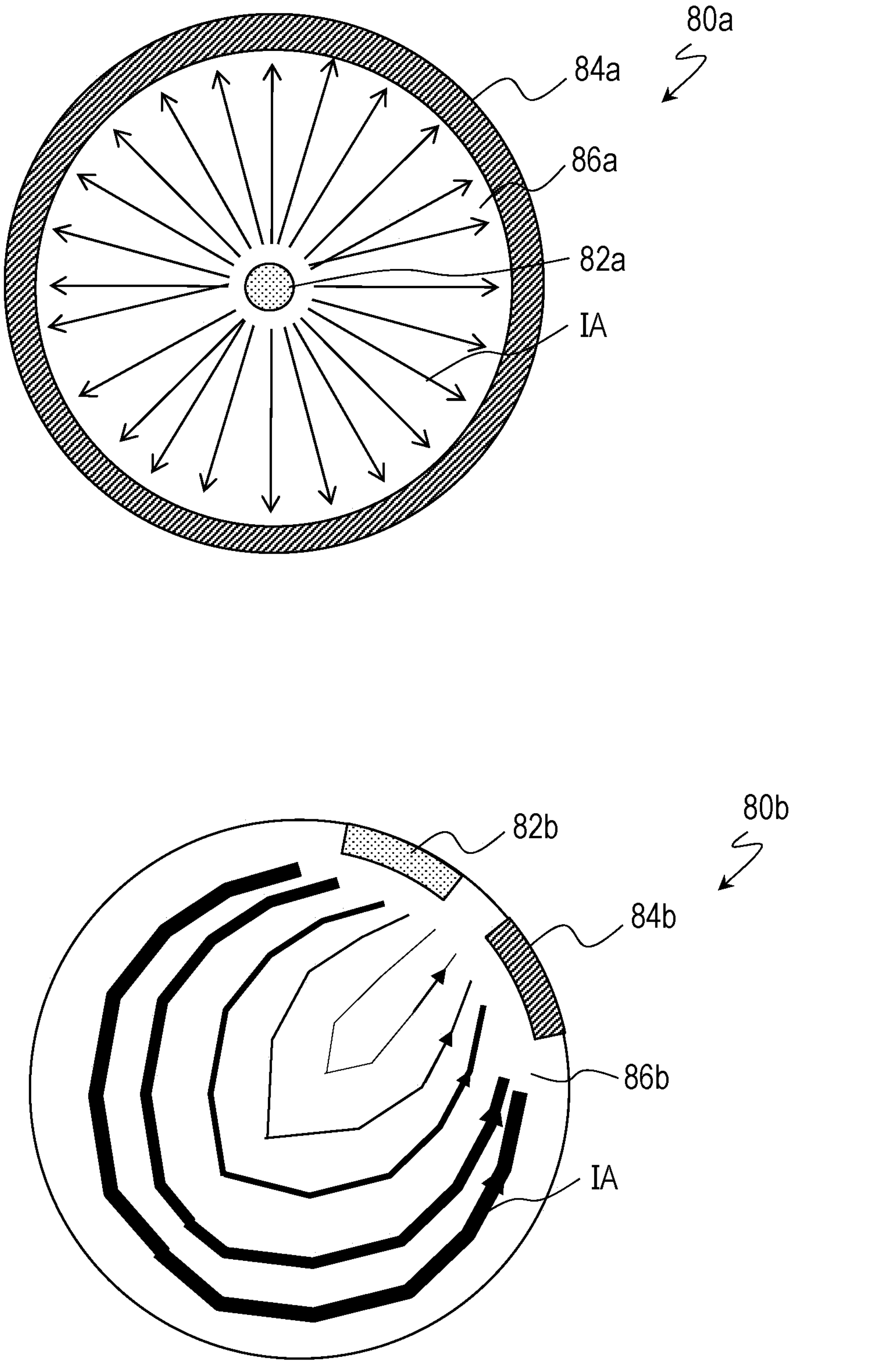
FIG. 14(*a*) and FIG. 14(*b*) are views showing schematic structures and current distributions of resistance heating structures 80*a* and 80*b*.

With reference to FIG. 14(*a*) and FIG. 14(*b*) and FIG. 15(*a*) to FIG. 15(*c*), a description will be given of the distribution of the resistance value in the resistance film. FIG. 14(*a*) and FIG. 14(*b*) and FIG. 15(*a*) to FIG. 15(*c*) show schematic structures of the resistance heating structures 80*a* to 80*e* and distribution of currents. The resistance heating structure is provided with a resistance film and a heater terminal.

The resistance heating structure 80*a* shown in FIG. 14(*a*) has a first terminal 82*a*, a second terminal 84*a*, and a resistance film 86*a* connected thereto. The first terminal 82*a* is arranged at the center of the circle and the second terminal 84*a* is arranged along the entire circumference. Here, the circle corresponds to the transmission/reception region R1. When a DC voltage is supplied between the first terminal 82*a* and the second terminal 84*a*, for example, the current IA flows radially from the first terminal 82*a* to the second terminal 84*a*. Accordingly, even when the in-plane resistance value is constant, it is possible for the resistance film 86*a* to uniformly generate heat. Naturally, the direction of current flow may be a direction from the second terminal 84*a* to the first terminal 82*a*.

In FIG. 14(*b*), the resistance heating structure 80*b* has a first terminal 82*b*, a second terminal 84*b*, and a resistance film 86*b* connected thereto. The first terminal 82*b* and the second terminal 84*b* are arranged to be adjacent to each other along the circumference. The resistance value of the resistance film 86*b* has an in-plane distribution such that the amount of heat generated per unit region generated by the current IA flowing between the first terminal 82*b* and the second terminal 84*b* in the resistance film 86*b* is constant. For example, in a case where the resistance film 86*b* is formed by a thin line, the in-plane distribution of the resistance value of the resistance film 86*b* may be adjusted by the thickness of the thin line and the density of the thin line.

Figure 15:
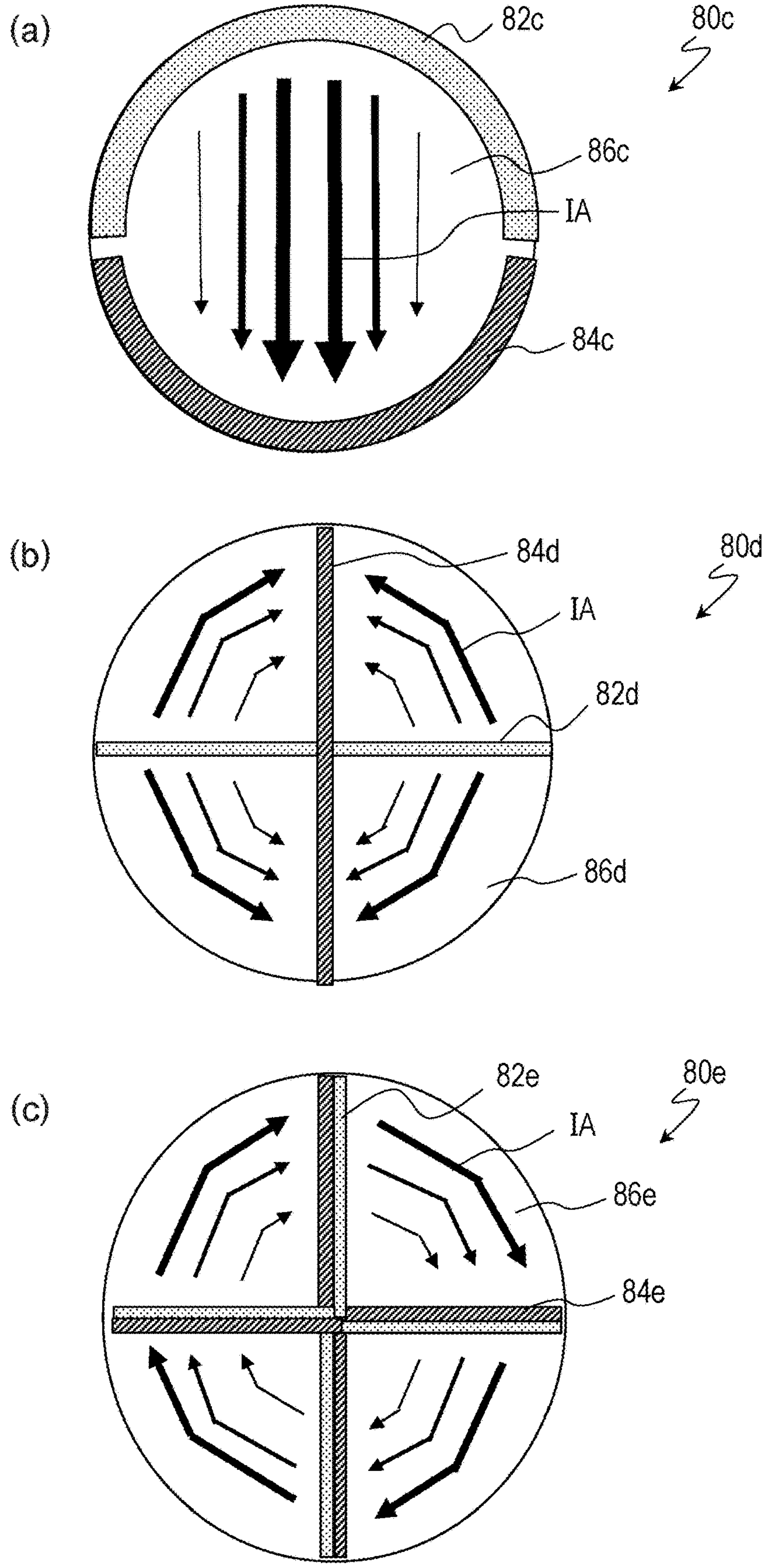
FIG. 15(*a*) to FIG. 15(*c*) are views showing schematic structures and current distributions of resistance heating structures 80*c* to 80*e*.

The resistance heating structure 80*c* shown in FIG. 15(*a*) has a first terminal 82*c*, a second terminal 84*c*, and a resistance film 86*c* connected thereto. The first terminal 82*c* is arranged along the circumference of the upper half of the circle and the second terminal 84*c* is arranged along the circumference of the lower half of the circle. For example, in a case where the resistance film 86*c* is formed by thin lines extending vertically between the first terminal 82*c* and the second terminal 84*c*, the resistance film 86*c* is adjusted such that the amount of heat generated per unit region by the current IA is constant in the plane, for example, the thickness and the density of the thin lines near the center are increased.

The resistance heating structure 80*d* shown in FIG. 15(*b*) has a first terminal 82*d*, a second terminal 84*d*, and a resistance film 86*d* connected thereto. The first terminal 82*d* and the second terminal 84*d* are provided so as to extend in the vertical direction and the horizontal direction along the diameters of the circle respectively. Although simplified in the drawing, the first terminal 82*d* and the second terminal 84*d* are insulated from each other.

In addition, the resistance heating structure 80*e* shown in FIG. 15(*c*) has a first terminal 82*e*, a second terminal 84*e*, and a resistance film 86*e* connected thereto. Unlike the resistance heating structure 80*d*, the resistance heating structure 80*e* has four portions extending from the center of the circles of both the first terminal 82*e* and the second terminal 84*e* in four directions of up, down, left, and right. The portion of the first terminal 82*e* and the portion of the second terminal 84*e* at 90 degrees to each other are arranged such that the current IA flows clockwise.

In order that the heat generation amount per unit region is uniform in the plane and that the current IA increases toward the circumference, both of the resistance heating structure 80*d* and the resistance heating structure 80*e* are adjusted such that the thin lines on the side close to the circumference are made thicker and the density is increased.

Such an internal heater structure may automatically operate, for example, when the temperature of the scanned antenna is detected and falls below a preset temperature. Naturally, the internal heater structure may be operated in response to user operations.

<External Heater Structure>

The scanned antenna according to the embodiment of the present invention may have an external heater structure instead of the internal heater structure or in addition to the internal heater structure described above. As the external heater, it is possible to use various known heaters, but a resistance heating type heater using Joule heat is preferable. In the heater, the portion which generates heat will be referred to as the heater portion. A description will be given below of an example of using a resistance film as the heater portion. Below, the resistance film is indicated by the reference numeral 68.

Figure 16:
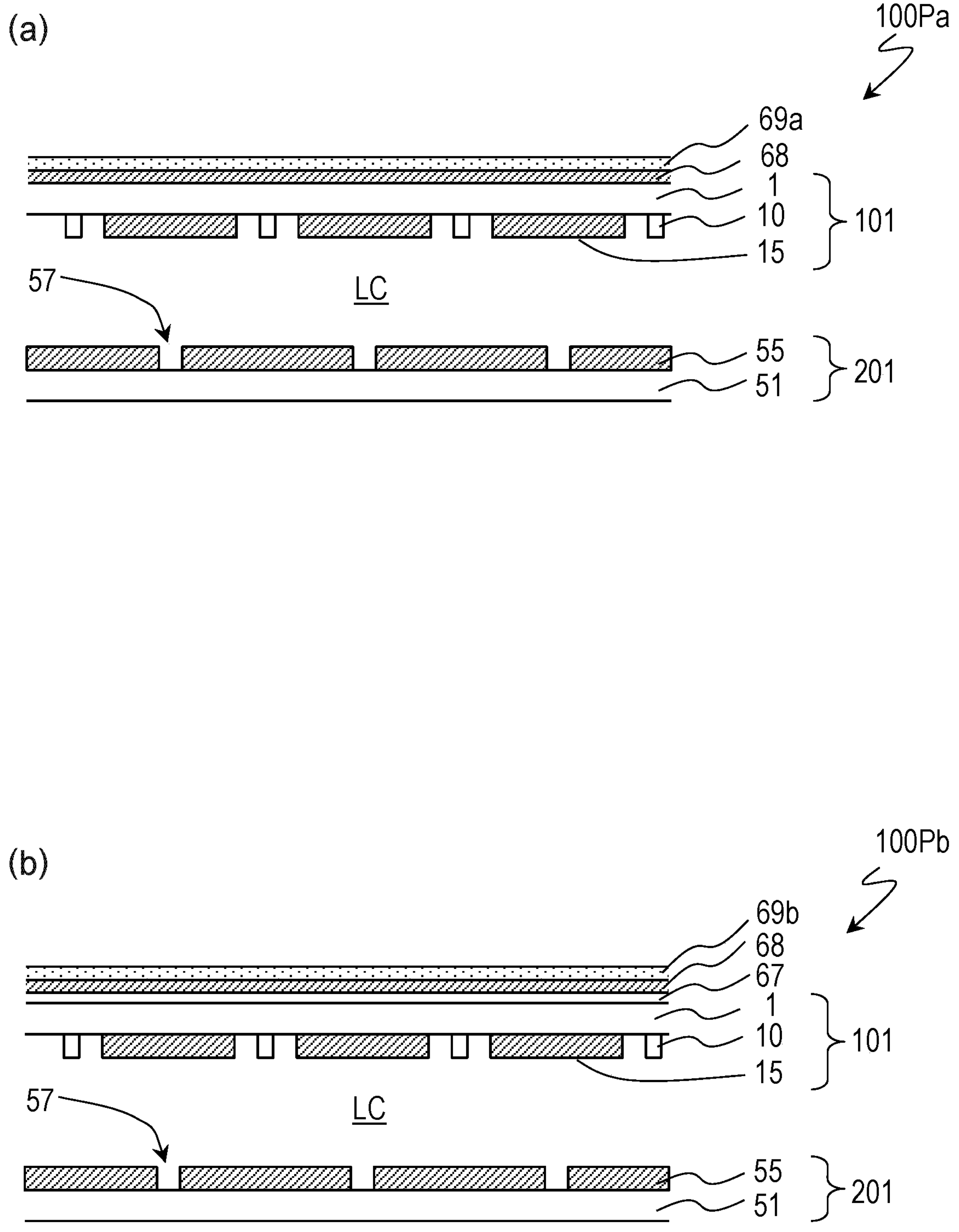
FIG. 16(*a*) is a schematic cross-sectional view of a liquid crystal panel 100Pa having the heater resistance film 68, and FIG. 16(*b*) is a schematic cross-sectional view of a liquid crystal panel 100Pb having the heater resistance film 68.

For example, it is preferable to arrange the heater resistance film 68 such as the liquid crystal panel 100Pa or 100Pb shown in FIG. 16(*a*) and FIG. 16(*b*). Here, the liquid crystal panels 100Pa and 100Pb have the TFT substrate 101 of the scanned antenna 1000 shown in FIG. 1, the slot substrate 201, and the liquid crystal layer LC provided therebetween, and further have a resistance heating structure including the resistance film 68 outside the TFT substrate 101. Although the resistance film 68 may be formed on the liquid crystal layer LC side of the dielectric substrate 1 of the TFT substrate 101, since the manufacturing process of the TFT substrate 101 becomes complicated, the resistance film 68 is preferably arranged on the outside of the TFT substrate 101 (the side opposite to the liquid crystal layer LC).

The liquid crystal panel 100Pa shown in FIG. 16(*a*) has the heater resistance film 68 formed on the outside surface of the dielectric substrate 1 of the TFT substrate 101 and a protective layer 69*a* covering the heater resistance film 68. The protective layer 69*a* may be omitted. Since the scanned antenna is accommodated in, for example, a plastic case, the user does not directly touch the resistance film 68.

It is possible to form the resistance film 68 on the outer surface of the dielectric substrate 1 by, for example, a known thin film deposition technique (for example, a sputtering method, a CVD method), a coating method, or a printing method. The resistance film 68 is patterned as necessary. The patterning is performed, for example, by a photolithography process.

As described above with respect to the internal heater structure, the material of the resistance film 68 for the heater is not particularly limited, and, for example, it is possible to use a conductive material having relatively high specific resistivity such as ITO or IZO. In addition, in order to adjust the resistance value, the resistance film 68 may be formed with thin lines or meshes of metal (for example, nichrome, titanium, chromium, platinum, nickel, aluminum, or copper). It is also possible to use thin lines or meshes of ITO, IZO, or the like. The resistance value may be set according to the required heat generation amount.

The protective layer 69*a* is formed of an insulating material and is formed so as to cover the resistance film 68. The protective layer 69*a* may not be formed in a portion where the resistance film 68 is patterned, and the dielectric substrate 1 is exposed. As will be described below, the resistance film 68 is patterned such that the performance of the antenna does not deteriorate. In a case where the performance of the antenna deteriorates due to the presence of the material forming the protective layer 69*a*, it is preferable to use the patterned protective layer 69*a* in the same manner as the resistance film 68.

The protective layer 69*a* may be formed by either a wet process or a dry process. For example, the protective layer 69*a* may be formed by applying a liquid curable resin (or a resin precursor) or a solution to the surface of the dielectric substrate 1 on which the resistance film 68 is formed and then curing the curable resin. The liquid resin or resin solution is applied to the surface of the dielectric substrate 1 so as to have a predetermined thickness by various coating methods (for example, using a slot coater, a spin coater, a spray) or various printing methods. Thereafter, depending on the type of the resin, it is possible to form the protective layer 69*a* with the insulating resin film by room temperature curing, heat curing, or photocuring. It is possible to pattern the insulating resin film by, for example, a photolithography process.

As a material for forming the protective layer 69*a*, it is possible to suitably use a curable resin material. Curable resin materials include a thermosetting type and a photocuring type. In addition, the thermosetting type includes thermal cross-linking type and thermal polymerization type.

Examples of the thermal cross-linking type resin material include a combination of an epoxy compound (for example, an epoxy resin) and an amine compound, a combination of an epoxy compound and a hydrazide compound, a combination of an epoxy compound and an alcohol compound (including a phenol resin, for example), a combination of an epoxy compound and a carboxylic acid compound (including, for example, an acid anhydride), a combination of an isocyanate compound and an amine compound, a combination of an isocyanate compound and a hydrazide compound, a combination of an isocyanate compound and an alcohol compound (including, for example, a urethane resin), and a combination of an isocyanate compound and a carboxylic acid compound. In addition, examples of the cationic polymerization type adhesive include a combination of an epoxy compound and a cationic polymerization initiator (representative cationic polymerization initiator, aromatic sulfonium salt). Examples of the radical polymerization type resin material include a combination of a monomer and/or oligomer including a vinyl group, such as various acrylic, methacrylic, urethane-modified acrylic (methacrylic) resins, and a radical polymerization initiator (representative radical polymerization initiator: an azo compound (for example, AIBN (azobisisobutyronitrile))), and examples of the ring-opening polymerization type resin material include an ethylene oxide compound, an ethylene imine compound, and a siloxane compound. In addition, it is possible to use a maleimide resin, a combination of a maleimide resin and an amine, a combination of a maleimide and a methacrylic compound, a bismaleimide-triazine resin, and a polyphenylene ether resin. In addition, it is also possible to suitably use polyimide. Here, “polyimide” is used with a meaning including polyamic acid which is a precursor of polyimide. The polyimide is used in combination with, for example, an epoxy compound or an isocyanate compound.

From the viewpoints of heat resistance, chemical stability, and mechanical properties, it is preferable to use a thermosetting type resin material. In particular, a resin material including an epoxy resin or a polyimide resin is preferable, and a resin material including a polyimide resin is preferable from the viewpoints of mechanical properties (particularly mechanical strength) and hygroscopicity. It is also possible to use a mix of a polyimide resin and an epoxy resin. In addition, a thermoplastic resin and/or an elastomer may be mixed with a polyimide resin and/or an epoxy resin. Furthermore, as a polyimide resin and/or an epoxy resin, rubber-modified resins may be mixed. Mixing a thermoplastic resin or elastomer therewith makes it possible to improve the flexibility and toughness. It is possible to obtain the same effect by using a rubber-modified resin.

The photocuring type causes a cross-linking reaction and/or a polymerization reaction due to ultraviolet light or visible light to be cured. Examples of the photocuring type include radical polymerization type and cationic polymerization type. As a radical polymerization type, a combination of an acrylic resin (epoxy-modified acrylic resin, urethane-modified acrylic resin, and silicone-modified acrylic resin) and a photopolymerization initiator is representative. Examples of the radical polymerization initiator for ultraviolet light include acetophenone type initiators and benzophenone type initiators. Examples of the radical polymerization initiator for visible light include benzyl type initiators and thioxanthone type initiators. As a cationic polymerization type initiator, a combination of an epoxy compound and a photo cationic polymerization initiator is representative. Examples of photo-cationic polymerization initiators include iodonium salt-based compounds. It is also possible to use a resin material having both photocurability and thermosetting property.

The liquid crystal panel 100Pb shown in FIG. 16(*b*) is different from the liquid crystal panel 100Pa in the point of further having an adhesive layer 67 between the resistance film 68 and the dielectric substrate 1. In addition, the difference is that a protective layer 69*b* is formed using a polymer film or a glass plate which is prepared in advance.

For example, the liquid crystal panel 100Pb in which the protective layer 69*b* is formed of a polymer film is manufactured as follows.

First, an insulating polymer film, which is to be the protective layer 69*b*, is prepared. As the polymer film, for example, a polyester film such as polyethylene terephthalate or polyethylene naphthalate, or a super engineering plastic film such as polyphenylsulfone, polyimide, or polyamide is used. The thickness of the polymer film (that is, the thickness of the protective layer 69 *b*) is, for example, 5 μm or more and 200 μm or less.

The resistance film 68 is formed on one surface of the polymer film. The resistance film 68 may be formed with the method described above. The resistance film 68 may be patterned, and the polymer film may also be patterned as necessary.

A polymer film (that is, a member in which the protective layer 69*b* and the resistance film 68 are integrally formed) on which the resistance film 68 is formed is attached to the dielectric substrate 1 using an adhesive. As the adhesive, it is possible to use the same curable resin as the curable resin used for forming the protective layer 69*a*. Furthermore, it is also possible to use a hot melt type resin material (adhesive material). A hot melt type resin material is mainly formed of a thermoplastic resin and is melted by heating and solidified by cooling. Examples thereof include polyolefin type resin materials (for example, polyethylene, polypropylene), polyamide type resin materials, and ethylene vinyl acetate type resin materials. In addition, urethane-based hot melt resin materials (adhesive materials) having reactivity are also commercially available. From the viewpoint of adhesiveness and durability, a reactive urethane type resin material is preferable.

In addition, the adhesive layer 67 may be patterned in the same manner as the resistance film 68 and the protective layer (polymer film) 69*b*. However, the adhesive layer 67 may be smaller than the resistance film 68 and the protective layer 69*b*, as long as it is possible to fix the resistance film 68 and the protective layer 69*b* to the dielectric substrate 1.

Instead of a polymer film, it is also possible to form the protective layer 69*b* using a glass plate. The manufacturing process may be the same as in the case of using a polymer film. The thickness of the glass plate is preferably 1 mm or less, and more preferably 0.7 mm or less. The lower limit of the thickness of the glass plate is not particularly limited, but from the viewpoint of the handling property, the thickness of the glass plate is preferably 0.3 mm or more.

In the liquid crystal panel 100Pb shown in FIG. 16(*b*), the resistance film 68 formed on the protective layer (polymer film or glass plate) 69*b* is fixed to the dielectric substrate 1 via the adhesive layer 67, but the resistance film 68 may be arranged so as to be in contact with the dielectric substrate 1, and it is not always necessary to fix (adhere) the resistance film 68 and the protective layer 69*b* to the dielectric substrate 1. That is, the adhesive layer 67 may be omitted. For example, a polymer film on which the resistance film 68 formed (that is, a member with which the protective layer 69*b* and the resistance film 68 are integrally formed) is arranged such that the resistance film 68 is in contact with the dielectric substrate 1, and the resistance film 68 may be pressed against the dielectric substrate 1 in a case which accommodates the scanned antenna. For example, since there is a concern that simply placing the polymer film on which the resistance film 68 is formed may increase the contact thermal resistance, it is preferable to lower the contact thermal resistance by pressing. Adopting such a configuration makes it possible to make a member in which the resistance film 68 and the protective layer (polymer film or glass plate) 69*b* are integrally formed removable.

In a case where the resistance film 68 (and the protective layer 69*b*) is patterned as described below, the resistance film 68 (and the protective layer 69*b*) are preferably fixed to such a degree that the position with respect to the TFT substrate does not shift so as not to lower the performance of the antenna.

The heater resistance film 68 may be provided anywhere as long as the operation of the scanned antenna is not affected, but in order to efficiently heat the liquid crystal material, the heater resistance film 68 is preferably provided near the liquid crystal layer. Accordingly, as shown in FIG. 16(*a*) and FIG. 16(*b*), the heater resistance film 68 is preferably provided outside the TFT substrate 101. In addition, as shown in FIG. 16(*a*), providing the resistance film 68 directly on the outside of the dielectric substrate 1 of the TFT substrate 101 is preferable since the energy efficiency is high and the temperature controllability is high in comparison with providing the resistance film 68 outside the dielectric substrate 1 via the adhesive layer 67 as shown in FIG. 16(*b*).

The resistance film 68 may be provided on almost the entire surface of the dielectric substrate 1, for example, with respect to the TFT substrate 104 shown in FIG. 13(*a*). As described above for the internal heater structure, the resistance film 68 preferably has the opening portions 68*a*, 68*b*, and 68*c*.

The protective layers 69*a* and 69*b* may be formed on the entire surface so as to cover the resistance film 68. As described above, in a case where the protective layer 69*a* or 69*b* adversely affects the antenna characteristics, opening portions corresponding to the opening portions 68*a*, 68*b*, and 68*c* of the resistance film 68 may be provided. In this case, the opening portions of the protective layer 69*a* or 69*b* are formed inside the opening portions 68*a*, 68*b*, and 68*c* of the resistance film 68.

In order to further reduce the influence of the electric field from the heater resistance film 68, a shield conductive layer may be formed. The shield conductive layer is formed, for example, on the dielectric substrate 1 side of the resistance film 68 via an insulating film. The shield conductive layer is formed on almost the entire surface of the dielectric substrate 1. It is not necessary to provide opening portions 68*a* and 68*b* in the shield conductive layer as in the resistance film 68, but it is preferable to provide the opening portion 68*c*. The shield conductive layer is formed of, for example, an aluminum layer and has a ground potential. In addition, it is preferable that the resistance value of the resistance film has a distribution such that it is possible to uniformly heat the liquid crystal layer. These are also as described above for the internal heater structure.

As long as it is possible for the resistance film to be able to heat the liquid crystal layer LC in the transmission/reception region R1, as illustrated, it is sufficient to provide a resistance film in a region corresponding to the transmission/reception region R1, without being limited thereto. For example, as shown in FIG. 2, in a case where the TFT substrate 101 has an outer shape such that it is possible to define a rectangular region including the transmission/reception region R1, a resistance film may be provided in a region corresponding to the rectangular region including the transmission/reception region R1. Naturally, the outer shape of the resistance film is not limited to a rectangular shape, and may be any shape including the transmission/reception region R1.

In the above example, the resistance film is arranged outside the TFT substrate 101, but a resistance film may be arranged outside (the opposite side to the liquid crystal layer LC) of the slot substrate 201. In this case as well, in the same manner as the liquid crystal panel 100Pa in FIG. 16(*a*), a resistance film may be directly formed on the dielectric substrate 51, or in the same manner as the liquid crystal panel 100Pb in FIG. 16(*b*), a resistance film formed on the protective layer (polymer film or glass plate) may be fixed to the dielectric substrate 51 via an adhesive layer. Alternatively, omitting the adhesive layer, the protective layer on which the resistance film is formed (that is, the member in which the protective layer and the resistance film are integrally formed) may be arranged such that the resistance film is in contact with the dielectric substrate 51. For example, since there is a concern that simply placing the polymer film with a resistance film formed thereon may increase the contact thermal resistance, it is preferable to lower the contact thermal resistance by pressing. When such a structure is adopted, it is possible to make a member in which the resistance film and the protective layer (polymer film or glass plate) are integrally formed removable. In a case where the resistance film (and the protective layer) is patterned, it is preferable to fix the resistance film (and protective layer) to such a degree that the position with respect to the slot substrate does not shift so as not to lower the performance of the antenna.

In a case where a resistance film is arranged outside the slot substrate 201, it is preferable to provide an opening portion at a position corresponding to the slot 57 of the resistance film. In addition, it is preferable that the resistance film has a thickness which is able to transmit microwaves sufficiently.

Although an example in which a resistance film is used as the heater portion is described here, other than this, for example, it is possible to use a nichrome wire (for example, winding), an infrared heater portion, or the like as the heater portion. In such a case, it is also preferable to arrange the heater portion so as not to lower the performance of the antenna.

Such an external heater structure may automatically operate, for example, when the temperature of the scanned antenna is detected and falls below a preset temperature. Naturally, the external heater structure may be operated in response to user operations.

As a temperature control device for automatically operating the external heater structure, for example, it is possible to use various known thermostats. For example, a thermostat using bimetal may be connected between one of the two terminals connected to the resistance film and the power supply. Naturally, a temperature control device may be used which supplies a current from a power source to the external heater structure such that the temperature does not fall below a preset temperature using a temperature detector.

<Driving Method>

Since the antenna unit array of the scanned antenna according to the embodiment of the present invention has a structure similar to the LCD panel, the antenna unit array performs line sequential driving in the same manner as the LCD panel. However, when a driving method for an LCD panel in the related art is applied, the following problem may occur. With reference to the equivalent circuit diagram of one antenna unit of the scanned antenna shown in FIG. 17, a description will be given of problems which may occur in the scanned antenna.

First, as described above, since the specific resistivity of the liquid crystal material having a large dielectric anisotropy $\Delta\varepsilon_M$ (birefringence index $\Delta n$ with respect to visible light) in the microwave region is low, when the driving method for the LCD panel is applied as it is, it is not possible to sufficiently hold the voltage applied to the liquid crystal layer. Thus, the effective voltage applied to the liquid crystal layer decreases, and the electrostatic capacitor value of the liquid crystal capacitor does not reach the target value.

When the voltage applied to the liquid crystal layer shifts from the predetermined value as described above, the direction in which the gain of the antenna becomes the maximum shifts from the desired direction. Thus, for example, it may be no longer possible to accurately track a communication satellite. In order to prevent this, a storage capacitor CS is provided electrically in parallel with the liquid crystal capacitor Clc to sufficiently increase the capacitor value C-Ccs of the storage capacitor CS. The capacitor value C-Ccs of the storage capacitor CS is preferably appropriately set such that the voltage holding ratio of the liquid crystal capacitor Clc is, for example, at least 30%, and preferably 55% or more. The capacitor value C-Ccs of the storage capacitor CS depends on the area of an electrode CSE1 and an electrode CSE2 and the thickness and the dielectric constant of the dielectric layer between the electrode CSE1 and the electrode CSE2. Typically, the same voltage as the patch electrode 15 is supplied to the electrode CSE1, and the same voltage as the slot electrode 55 is supplied to the electrode CSE2.

In addition, when a liquid crystal material having a low resistivity is used, a voltage reduction due to interfacial polarization and/or alignment polarization also occurs. In order to prevent a voltage reduction due to these polarizations, the application of a sufficiently high voltage in anticipation of a voltage reduction may be considered. However, when a high voltage is applied to a liquid crystal layer having a low specific resistivity, there is a concern that a dynamic scattering effect (DS effect) will occur. The DS effect is caused by the convection of ionic impurities in the liquid crystal layer, and the dielectric constant $\varepsilon_M$ of the liquid crystal layer approaches the average value $((\varepsilon_M /\!/ + 2\varepsilon_M \perp)/3)$. In addition, in order to control the dielectric constant $\varepsilon_M$ of the liquid crystal layer in multiple stages (multiple gradations), it is not always possible to apply a sufficiently high voltage.

In order to suppress the above-described DS effect and/or voltage reduction due to polarization, it is sufficient to sufficiently shorten the polarity inversion period of the voltage applied to the liquid crystal layer. As is well known, when the polarity inversion period of the applied voltage is shortened, the threshold voltage at which the DS effect occurs is high. Accordingly, the polarity inversion frequency may be determined such that the maximum value of the voltage (absolute value) applied to the liquid crystal layer is less than the threshold voltage at which the DS effect occurs. When the polarity inversion frequency is 300 Hz or more, for example, it is possible to ensure good operation even when a voltage with an absolute value of 10 V is applied to a liquid crystal layer having a specific resistivity of $1\times10^{10}$ $\Omega\cdot$cm and a dielectric anisotropy $\Delta\varepsilon$ (@1 kHz) of approximately −0.6. In addition, when the polarity inversion frequency (typically equal to twice the frame frequency) is 300 Hz or more, the voltage reduction due to the polarization is also suppressed. The upper limit of the polarity inversion period is preferably approximately 5 kHz or less from the viewpoint of power consumption and the like.

The polarity inversion frequency of the voltage applied to the liquid crystal layer naturally depends on the liquid crystal material (particularly resistivity). Accordingly, depending on the liquid crystal material, the above problem does not occur even if a voltage is applied with a polarity inversion period of less than 300 Hz. However, since the liquid crystal material used for the scanned antenna according to the embodiment of the present invention has a smaller resistivity than the liquid crystal material used for the LCD, the driving is preferably carried out at approximately 60 Hz or more.

As described above, since the viscosity of the liquid crystal material depends on the temperature, it is preferable to appropriately control the temperature of the liquid crystal layer. The physical properties and driving conditions of the liquid crystal material described here are values at the operating temperature of the liquid crystal layer. In other words, it is preferable to control the temperature of the liquid crystal layer such that driving is possible under the above conditions.

Figure 18:
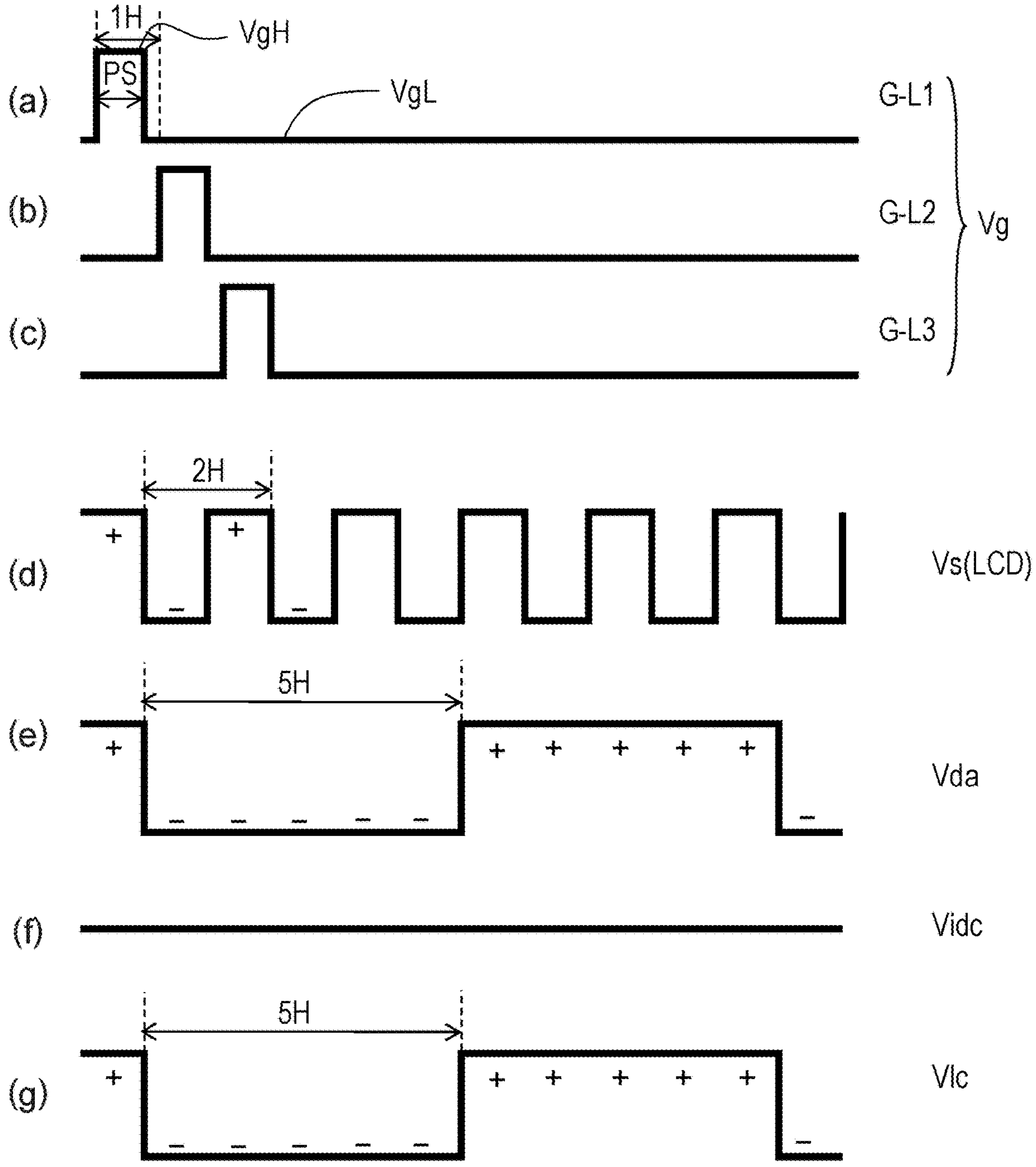
FIG. 18(*a*) to FIG. 18(*c*) and FIG. 18(*e*) to FIG. 18(*g*) are views showing examples of waveforms of each signal used for driving the scanned antenna of the embodiment and FIG. 18(*d*) is a diagram showing waveforms of display signals of an LCD panel performing dot inversion driving.

With reference to FIG. 18(*a*) to FIG. 18(*g*), a description will be given of examples of waveforms of signals used for driving the scanned antenna. For comparison, FIG. 18(*d*) shows the waveform of the display signal Vs (LCD) supplied to the source bus line of the LCD panel.

FIG. 18(*a*) shows the waveform of the scanning signal Vg supplied to the gate bus line G-L1, FIG. 18(*b*) shows the waveform of the scanning signal Vg supplied to the gate bus line G-L2, FIG. 18(*c*) shows the waveform of the scanning signal Vg supplied to the gate bus line G-L3, FIG. 18(*e*) shows the waveform of the data signal Vda supplied to the source bus line, FIG. 18(*f*) shows the waveform of the slot voltage Vidc supplied to the slot electrode (slot electrode) of the slot substrate, and FIG. 18(*g*) shows the waveform of the voltage applied to the liquid crystal layer of the antenna unit.

As shown in FIG. 18(*a*) to FIG. 18(*c*), the voltage of the scanning signal Vg supplied to the gate bus line sequentially switches from a low level (VgL) to a high level (VgH). It is possible to appropriately set VgL and VgH according to the characteristics of the TFT. For example, VgL=−5 V to 0 V, and Vgh=+20 V. In addition, VgL=−20 V and Vgh=+20 V may be used. The period from the time when the voltage of the scanning signal Vg of a certain gate bus line switches from the low level (VgL) to the high level (VgH), until the time when the voltage of the next gate bus line switches from VgL to VgH is defined as 1 horizontal scanning period (1 H). In addition, a period during which the voltage of each gate bus line is at a high level (VgH) is referred to as a selection period PS. In this selection period PS, the TFT connected to each gate bus line is turned on, and the voltage of the data signal Vda supplied to the source bus line at that time is supplied to the corresponding patch electrode. The data signal Vda is, for example, −15 V to +15 V (the absolute value is 15 V), and, for example, a data signal Vda is used which has different absolute values corresponding to 12 gradations, preferably 16 gradations.

Here, a case where an intermediate voltage is applied to all antenna units will be illustrated. That is, it is assumed that the voltage of the data signal Vda is constant with respect to all antenna units (assumed to be connected to m gate bus lines). This corresponds to a case where the halftone which is the whole surface is displayed on the LCD panel. At this time, in the LCD panel, dot inversion driving is performed. That is, in each frame, the display signal voltage is supplied such that the polarities of mutually adjacent pixels (dots) are opposite to each other.

FIG. 18(*d*) shows the waveform of the display signal of the LCD panel on which the dot inversion driving is performed. As shown in FIG. 18(*d*), the polarity of Vs (LCD) is inverted every 1 H. The polarity of Vs (LCD) supplied to the source bus line adjacent to the source bus line to which Vs (LCD) having this waveform is supplied is opposite to the polarity of Vs (LCD) shown in FIG. 18(*d*). In addition, the polarity of the display signal supplied to all the pixels is inverted every frame. In the LCD panel, it is difficult to completely match the magnitude of the effective voltage applied to the liquid crystal layer between the positive polarity and the negative polarity, and the difference in the effective voltage becomes a difference in brightness, which is observed as flickering. In order to make this flickering less visible, the pixels (dots) to which voltages with different polarities are applied are spatially dispersed in each frame. Typically, performing dot inversion driving arranges the pixels (dots) having different polarities in a checkered pattern.

On the other hand, in the scanned antenna, the flickering itself is not a problem. That is, it is sufficient if the electrostatic capacitor value of the liquid crystal capacitor is a desired value, and the spatial distribution of the polarity in each frame does not cause a problem. Accordingly, from the viewpoint of low power consumption and the like, it is preferable to reduce the number of times of polarity inversion of the data signal Vda supplied from the source bus line, that is, to lengthen the polarity inversion period. For example, as shown in FIG. 18(*e*), the polarity inversion period may be set to 10 H (polarity inversion every 5 H). Naturally, when the number of antenna units connected to each source bus line (typically equal to the number of gate bus lines) is m, the polarity inversion period of the data signal Vda may be set to 2 μm H (polarity inversion every m H). The polarity inversion period of the data signal Vda may be equal to 2 frames (polarity inversion every frame).

In addition, the polarities of the data signal Vda supplied from all the source bus lines may be the same. Accordingly, for example, in one frame, the positive polarity data signal Vda may be supplied from all source bus lines, and in the next frame, the negative polarity data signal Vda may be supplied from all source bus lines.

Alternatively, the polarities of the data signals Vda supplied from source bus lines adjacent to each other may be opposite polarities to each other. For example, in one frame, positive-polarity data signal Vda is supplied from odd-numbered source bus lines and negative-polarity data signal Vda is supplied from even-numbered source bus lines. Then, in the next frame, the negative-polarity data signal Vda is supplied from the odd-numbered source bus lines and the positive-polarity data signal Vda is supplied from the even-numbered source bus lines. Such a driving method in an LCD panel is called source line inversion driving. When the data signal Vda supplied from the adjacent source bus line is set to have the opposite polarity, connecting (shorting) the adjacent source bus lines to each other before inverting the polarity of the data signal Vda supplied between the frames makes it possible to cancel electric charges charged to the liquid crystal capacitor between adjacent columns. Accordingly, it is possible to obtain an advantage that it is possible to reduce the amount of electric charge supplied from the source bus line in each frame.

As shown in FIG. 18(*f*), the voltage Vidc of the slot electrode is, for example, a DC voltage and typically a ground potential. Since the capacitor value of the capacitor (liquid crystal capacitor and storage capacitor) of the antenna unit is larger than the capacitor value of the pixel capacitor of the LCD panel (for example, approximately 30 times as compared with an approximately 20 inch LCD panel), without being influenced by the pull-in voltage caused by the parasitic capacitor of the TFT, even when the voltage Vidc of the slot electrode is a ground potential and the data signal Vda is a positive or negative symmetrical voltage based on the ground potential, the voltage supplied to the patch electrode is a positive and negative symmetrical voltage. In the LCD panel, positive and negative symmetrical voltages are applied to the pixel electrode by adjusting the voltage (common voltage) of the counter electrode in consideration of the pull-in voltage of the TFT; however, this is not necessary for the slot voltage of the scanned antenna, which may be the ground potential. In addition, although not shown in FIG. 18, the same voltage as the slot voltage Vidc is supplied to the CS bus line.

Since the voltage applied to the liquid crystal capacitor of the antenna unit is the voltage of the patch electrode (that is, the voltage of the data signal Vda shown in FIG. 18(*e*)) with respect to the voltage Vidc (FIG. 18(*f*)) of the slot electrode, when the slot voltage Vidc is the ground potential, the voltage matches the waveform of the data signal Vda shown in FIG. 18(*e*) in the same manner as shown in FIG. 18(*g*).

The waveform of the signal used for driving the scanned antenna is not limited to the above example. For example, as will be described below with reference to FIG. 19 and FIG. 20, Viac having an oscillating waveform as the voltage of the slot electrode may be used.

Figure 19:
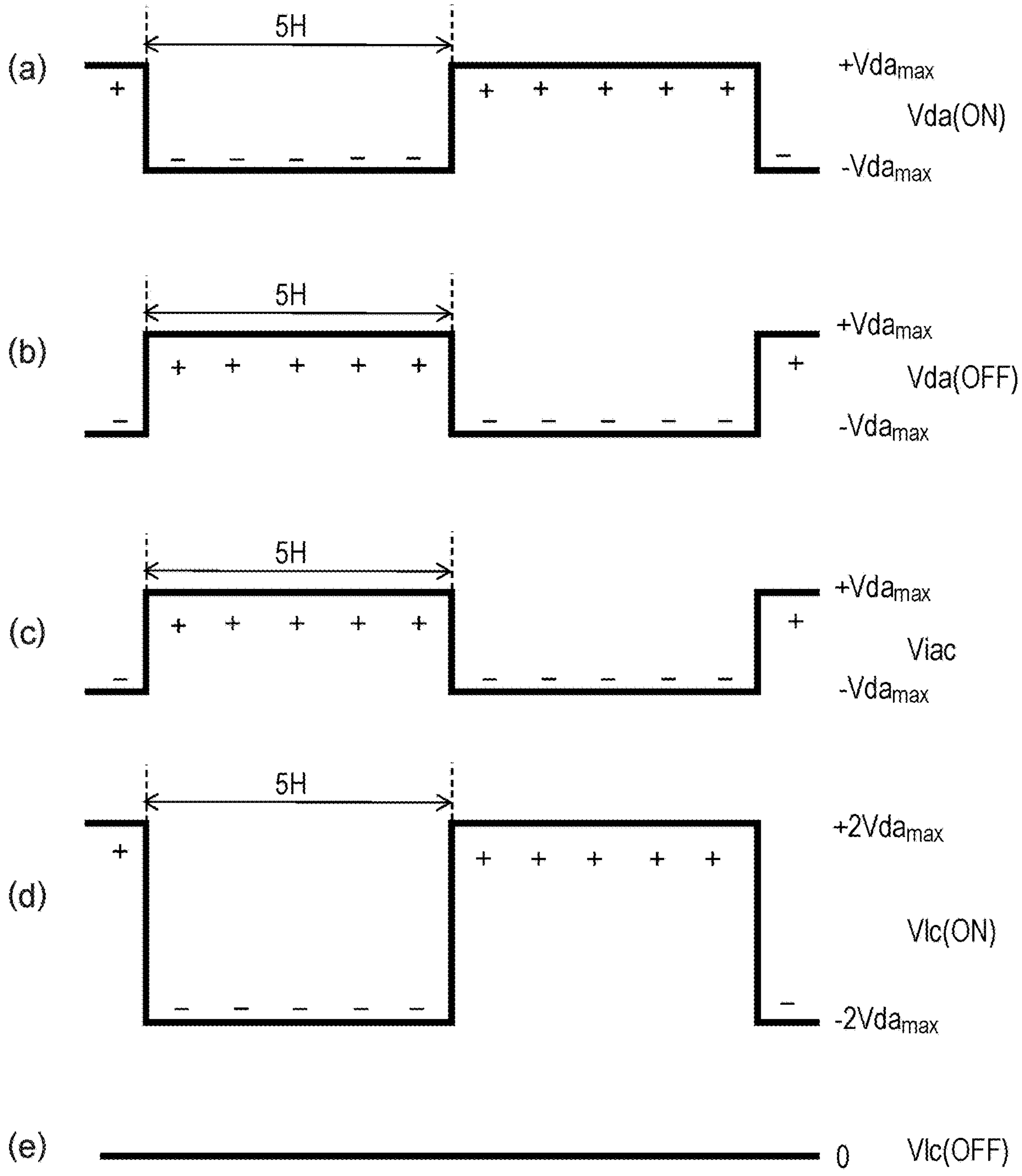
FIG. 19(*a*) to FIG. 19(*e*) are views showing other examples of the waveforms of each signal used for driving the scanned antenna of the embodiment.

For example, it is possible to use the signals as illustrated in FIG. 19(*a*) to FIG. 19(*e*). In FIG. 19, the waveform of the scanning signal Vg supplied to the gate bus line is omitted, but the scanning signal Vg described with reference to FIG. 18(*a*) to FIG. 18(*c*) is also used here.

As shown in FIG. 19(*a*), in the same manner as the case shown in FIG. 18(*e*), a case where the waveform of the data signal Vda is inverted in polarity at a 10 H period (every 5 H) will be illustrated. Here, as the data signal Vda, a case where the amplitude is the maximum value |Vda max| is shown. As described above, the waveform of the data signal Vda may be inverted in polarity at two frame periods (every frame).

Here, as shown in FIG. 19(*c*), the voltage Viac of the slot electrode is an oscillating voltage with the same oscillating period and the opposite polarity to the data signal Vda (ON). The amplitude of the voltage Viac of the slot electrode is equal to the maximum value Vda max of the amplitude of the data signal Vda. That is, the slot voltage Viac is set to a voltage oscillating between −Vda max and +Vda max at the same period as the polarity inversion of the data signal Vda (ON) and the polarity is opposite (the phase is different by 180°).

Since the voltage Vlc applied to the liquid crystal capacitor of the antenna unit is the voltage of the patch electrode with respect to the voltage Viac of the slot electrode (FIG. 19(*c*)) (that is, the voltage of the data signal Vda (ON) shown in FIG. 19(*a*), when the amplitude of the data signal Vda oscillates at ±Vda max, the voltage applied to the liquid crystal capacitor is a waveform which oscillates with an amplitude twice Vda max in the same manner as shown in FIG. 19(*d*). Accordingly, the maximum amplitude of the data signal Vda necessary to make the maximum amplitude of the voltage Vlc applied to the liquid crystal capacitor Vda max is ±Vda max/2.

Since it is possible to halve the maximum amplitude of the data signal Vda by using the slot voltage Viac, it is possible to obtain an advantage in that it is possible to use, for example, a general-purpose driver IC with a withstand pressure of 20 V or less, as a driving circuit which outputs the data signal Vda.

Here, as shown in FIG. 19(*e*), in order to set the voltage Vlc (OFF) applied to the liquid crystal capacitor of each antenna unit to zero, as shown in FIG. 19(*b*), it is sufficient to set the data signal Vda (OFF) to have the same waveform as the slot voltage Viac.

For example, a case where the maximum amplitude of the voltage Vlc applied to the liquid crystal capacitor is ±15 V may be considered. When Vidc shown in FIG. 18(*f*) is used as the slot voltage and Vidc=0 V, the maximum amplitude of Vda shown in FIG. 18(*e*) is ±15 V. On the other hand, when Viac shown in FIG. 19(*c*) is used as the slot voltage and the maximum amplitude of Viac is ±7.5 V, the maximum amplitude of Vda (ON) shown in FIG. 19(*a*) is ±7.5 V.

In a case where the voltage Vlc applied to the liquid crystal capacitor is 0 V, Vda shown in FIG. 18(*e*) may be 0 V and it is sufficient if the maximum amplitude of Vda (OFF) shown in FIG. 19(*b*) is ±7.5 V.

In a case of using Viac shown in FIG. 19(*c*), the amplitude of the voltage Vlc applied to the liquid crystal capacitor is different from the amplitude of Vda, thus, it is necessary to carry out conversion appropriately.

Figure 20:
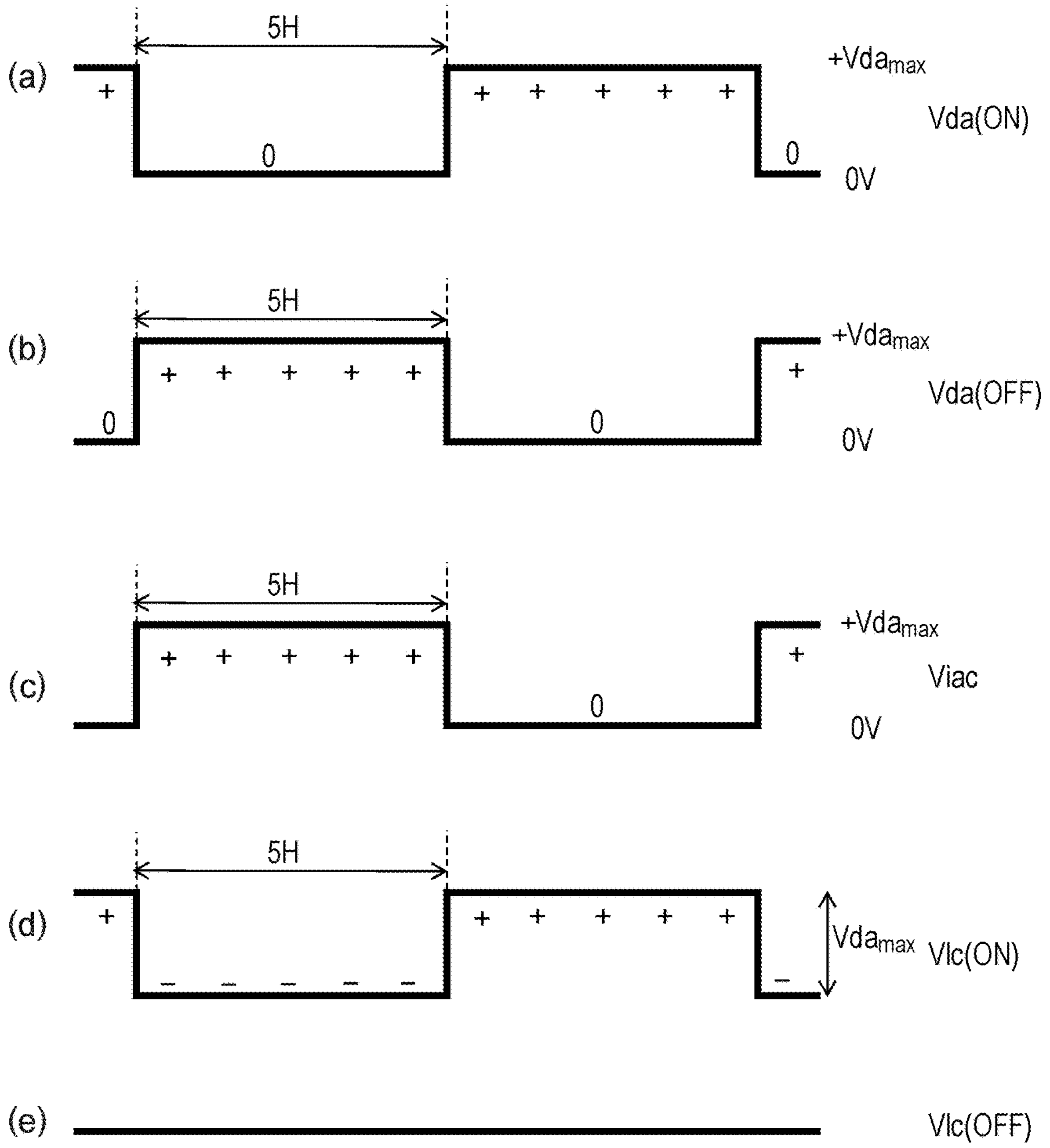
FIG. 20(*a*) to FIG. 20(*e*) are views showing other examples of the waveforms of each signal used for driving the scanned antenna of the embodiment.

It is also possible to use signals as illustrated in FIG. 20(*a*) to FIG. 20(*e*). In the same manner as the signals shown in FIG. 19(*a*) to FIG. 19(*e*), in the signals shown in FIG. 20(*a*) to FIG. 20(*e*), the voltage Viac of the slot electrode is an amplitude voltage in which the phase of the oscillation with the data signal Vda (ON) is shifted 1800 as shown in FIG. 20(*c*). However, as shown in each of FIG. 20(*a*) to FIG. 20(*c*), all of the data signals Vda (ON), Vda (OFF), and the slot voltage Viac are voltages oscillating between 0 V and a positive voltage. The amplitude of the voltage Viac of the slot electrode is equal to the maximum value Vda max of the amplitude of the data signal Vda.

When such a signal is used, it is sufficient if the driving circuit outputs only a positive voltage, which contributes to cost reduction. Even if a voltage oscillating between 0 V and a positive voltage is used as described above, the polarity of the voltage Vlc (ON) applied to the liquid crystal capacitor is inverted as shown in FIG. 20(*d*). In the voltage waveform shown in FIG. 20(*d*), + (positive) indicates that the voltage of the patch electrode is higher than the slot voltage and − (negative) indicates that the voltage of the patch electrode is lower than the slot voltage. That is, the direction (polarity) of the electric field applied to the liquid crystal layer is inverted as in the other examples. The amplitude of the voltage Vlc (ON) applied to the liquid crystal capacitor is Vda max.

As shown in FIG. 20(*e*), in order to set the voltage Vlc (OFF) applied to the liquid crystal capacitor of the antenna unit to zero, as shown in FIG. 20(*b*), it is sufficient if the data signal Vda (OFF) is the same waveform as the slot voltage Viac.

A driving method for oscillating (inverting) the voltage Viac of the slot electrode described with reference to FIG. 19 and FIG. 20 corresponds to a driving method for inverting the counter voltage in the driving method for the LCD panel (may be referred to as "common inversion driving"). In LCD panels, common inversion driving is not adopted since it is not possible to sufficiently suppress flickering. On the other hand, in scanned antennas, it is possible to invert the slot voltage since the flickering is not a problem. Oscillation (inversion) is, for example, performed for each frame, (in FIG. 19 and FIG. 20, 5 H is 1 V (vertical scanning period or frame)).

In the above description, a description was given of an example in which one voltage is applied as the voltage Viac of the slot electrode, that is, an example in which a common slot electrode is provided for all the patch electrodes; however, the slot electrode may be divided to correspond to one row or two or more rows of patch electrodes. Here, a row means a set of patch electrodes connected to one gate bus line via a TFT. By dividing the slot electrode into a plurality of row portions in this manner, it is possible to make the polarities of the voltages of the respective portions of the slot electrode independent from each other. For example, in any frame, it is possible to invert the polarity of the voltage applied to the patch electrode between patch electrodes connected to adjacent gate bus lines. In this manner, it is possible to perform not only row inversion (1 H inversion) in which the polarity is inverted for each row of the patch electrode but also m row inversion (mH inversion) in which the polarity is inverted for every two or more rows. Naturally, row inversion and frame inversion may be combined.

From the viewpoint of simplicity of driving, driving is preferable in which the polarities of the voltages applied to the patch electrodes are all the same in arbitrary frames and the polarities are inverted every frame.

<Examples of Antenna Unit Arrangement and Gate Bus Line and Source Bus Line Connection>

In the scanned antenna of the embodiment of the present invention, the antenna units are arranged, for example, in a concentric circle shape.

For example, in a case of being arranged in m concentric circles, one gate bus line is provided for each circle, for example, and a total of m gate bus lines are provided. For example, when the outer diameter of the transmission/reception region R1 is set as 800 mm, m is 200, for example. When the innermost gate bus line is the first line, n (for example, 30) antenna units are connected to the first gate bus line and nx (for example, 620) antenna units are connected to the m-th gate bus line.

In such an arrangement, the number of antenna units connected to each gate bus line is different. In addition, among the nx source bus lines connected to the nx antenna units forming the outermost circle, m antenna units are connected to the n source bus lines also connected to the antenna unit forming the innermost circle, but the number of antenna units connected to the other source bus lines is smaller than m.

As described above, the arrangement of antenna units in the scanned antenna is different from the arrangement of pixels (dots) in the LCD panel, and the number of connected antenna units is different according to the gate bus lines and/or the source bus lines. Accordingly, when the capacitances (liquid crystal capacitors+storage capacitances) of all the antenna units are set to be the same, the connected electrical loads are different depending on the gate bus lines and/or the source bus lines. In this manner, there is a problem that variations occur in the writing of the voltage to the antenna units.

Therefore, in order to prevent the above, for example, the electrical loads connected to each gate bus line and each source bus line are preferably made substantially equal by adjusting the capacitor value of the storage capacitor or by adjusting the number of antenna units connected to the gate bus lines and/or the source bus lines.

<Monitoring of Residual DC Voltage of Liquid Crystal Capacitor>

As described above, the scanned antenna according to the embodiment of the present invention uses a nematic liquid crystal material having a large dielectric anisotropy $\Delta\varepsilon_M$ (birefringence index $\Delta n$ with respect to visible light) with respect to microwaves. A liquid crystal material having a large dielectric anisotropy $\Delta\varepsilon_M$ in the microwave region includes, for example, an isothiocyanate group (—NCS) or a thiocyanate group (—SCN). For example, the liquid crystal material includes any atomic group shown by the following chemical formula (Formula 1).

[Formula 1]

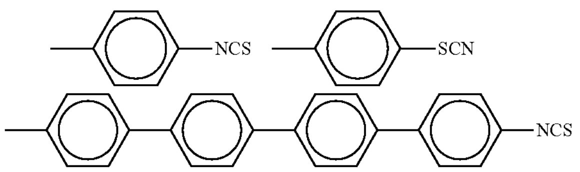

The specific resistivity of the liquid crystal material including the isothiocyanate group or the thiocyanate group is low and the value of the residual DC voltage generated in the liquid crystal capacitor (may be referred to as "rDC voltage") easily becomes larger than that of currently commercially available LCDs.

A liquid crystal material including an isothiocyanate group or thiocyanate group has a strong polarity and chemical stability is lower than that of liquid crystal materials currently used for LCDs. Since the isothiocyanate group and the thiocyanate group have strong polarity, the groups easily absorb moisture and may react with metal ions (for example, Cu ions in a case where the slot electrode has a Cu layer). In addition, when a DC voltage is continuously applied thereto, an electrical decomposition reaction may occur. Further, a liquid crystal material including an isothiocyanate group or a thiocyanate group absorbs light from the ultraviolet region to close to 430 nm and is easily photodegraded. In addition, liquid crystal materials including isothiocyanate groups or thiocyanate groups are also comparatively weak against heat. Due to these, since the specific resistivity of the liquid crystal material decreases and/or the ionic impurities increase, the rDC voltage of the liquid crystal capacitor increases. When the rDC voltage of the liquid crystal capacitor of each antenna unit increases, the characteristics of the scanned antenna deteriorate.

Figure 21:
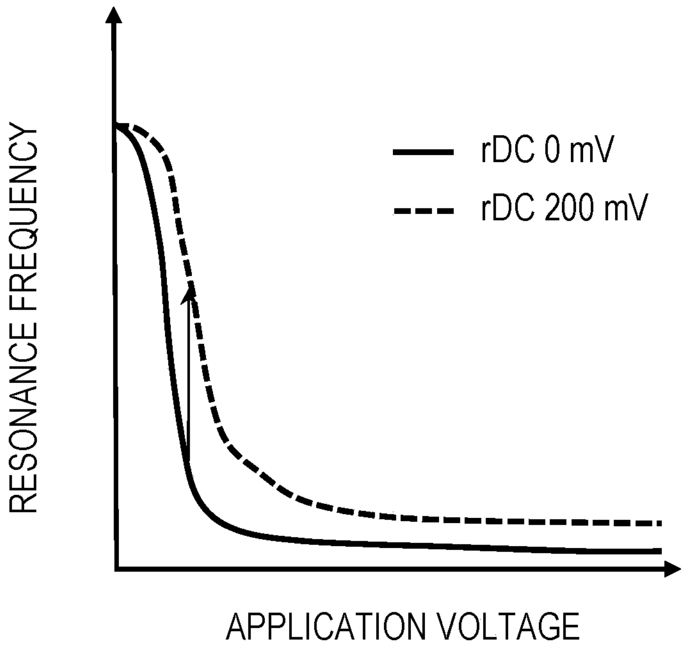
FIG. 21 is a graph for illustrating a relationship between an increase in rDC voltage and antenna characteristics, and is a conceptual graph in which the horizontal axis represents a voltage applied to a liquid crystal capacitor and the vertical axis represents a resonance frequency as an antenna characteristic.

With reference to FIG. 21, a description will be given of the relationship between the increase in the rDC voltage and the antenna characteristics. FIG. 21 is a conceptual graph in which the horizontal axis represents the voltage applied to the liquid crystal capacitor and the vertical axis represents the resonance frequency as the antenna characteristic. A case where the rDC voltage is 0 mV and a case of 200 mV are shown.

When the rDC voltage of the liquid crystal capacitor increases, the effective voltage applied to the liquid crystal layer decreases and the target voltage is not applied to the liquid crystal layer. As a result, the phase difference applied to the microwaves by the liquid crystal layer of the antenna unit is shifted from the predetermined value. When the phase difference shifts from the predetermined value, the antenna characteristics are deteriorated. It is possible to evaluate this deterioration of the antenna characteristic, for example, as a shift in the resonance frequency. In practice, since the scanned antenna is designed such that the gain becomes the maximum at a predetermined resonance frequency, an increase in the rDC voltage appears as a change in gain, for example.

In the scanned antenna according to an embodiment of the present invention, it is possible to adjust the slot voltage so as to monitor the rDC voltage increase and offset the rDC voltage. Accordingly, it is possible to suppress a change in the characteristics of the scanned antenna (for example, a change in the resonance frequency) accompanying an increase in the rDC voltage. In addition, since the DC voltage applied to the liquid crystal layer is lowered, it is possible to suppress electrolysis of the liquid crystal material.

The embodiment of the present invention is not limited to scanned antennas, but is able to be widely applied to liquid crystal devices having a liquid crystal capacitor connected to a TFT and is able to suppress deterioration in characteristics or reliability accompanying an increase in the residual DC voltage of the liquid crystal device. It is also possible to apply the embodiment of the present invention to, for example, an LCD panel. Although the value of the rDC voltage generated in the liquid crystal capacitor of the LCD panel and the changes over time thereof are smaller than the rDC voltage generated in the liquid crystal capacitor of the scanned antenna, by applying the embodiment of the present invention, it is possible to suppress the generation of problems caused by the rDC voltage. In particular, it is possible to suppress flickering in a negative type FFS mode LCD panel.

For liquid crystal devices including scanned antennas and LCD panels, the terms active region and non-active region will be used. The active region is a region in which the liquid crystal capacitors connected to the TFT for expressing the function of the liquid crystal device are arranged and the non-active region is a region positioned in a region outside the active region. The active region of the scanned antenna is a transmission/reception region, and the non-active region is a non-transmission/reception region. The active region of the LCD panel is the display region and the non-active region is the frame region.

The method for measuring the rDC voltage according to the embodiment of the present invention makes it possible to electrically quantitatively measure the residual DC voltage. Unlike flicker elimination methods of the related art, since light is not used, it is possible to measure the residual DC voltage of a liquid crystal device having a configuration in which light is not able to be transmitted through the liquid crystal layer in the same manner as the scanned antenna. A common voltage (for example, a slot voltage) may be set based on the determined residual DC voltage.

Further, since it is possible to electrically measure the residual DC voltage, it is possible to incorporate a circuit for measuring the rDC voltage and a circuit for adjusting the common voltage (for example, slot voltage) based thereon in the control circuit of the liquid crystal device, and incorporation into a driving method is possible. Furthermore, since the largest change in the residual DC voltage is immediately after the manufacture of the liquid crystal device, by introducing a step of stabilizing the residual DC voltage in the manufacturing process, it is possible to improve the operation stability and/or reliability of the liquid crystal device.

First, the present inventors examined a method for measuring an rDC voltage in a scanned antenna. As shown in FIG. 1, for example, the liquid crystal capacitor of each antenna unit of the scanned antenna is formed of the patch electrode 15, the slot electrode 55, and a liquid crystal layer. The patch electrode 15 and the slot electrode 55 are formed of a metal layer (for example, an Al layer or a Cu layer). Since the patch electrode 15 and the slot electrode 55 do not transmit light, it is not possible to measure the rDC voltage using the flicker elimination method as in the LCD. As is well known, a flicker elimination method is a method in which a positive and negative symmetrical signal voltage (for example, a voltage for displaying an intermediate tone) is applied to a pixel electrode of an LCD, flickering is observed while changing a common voltage, and a common voltage at which flickering is not observed is measured. A shift from the ground level of the common voltage where no flickering is observed is the rDC voltage. In the flicker elimination method, unless the rDC voltage of the pixel of the LCD is zero, since the magnitudes of the net voltages applied to the liquid crystal layer are different when applying the positive signal voltage and when applying the negative signal voltage, a phenomenon in which the transmittance of the pixel changes with the polarity change of the signal voltage (flickering is observed) is used.

The method for measuring the residual DC voltage according to the embodiment of the present invention includes a step of generating a V-I curve by applying a positive and negative symmetrical triangular wave voltage to one of the pair of electrodes of the liquid crystal capacitor and measuring the current flowing in the other electrode, a step of measuring a voltage Vmax having a maximum absolute value where a current value reaches a positive maximum value in the V-I curve and a voltage Vmin having a maximum absolute value where a current value reaches a negative minimum value, and a step of measuring one-half of the sum of the Vmax and Vmin as the residual DC voltage. The liquid crystal capacitor for measuring the rDC voltage is appropriately designed according to the magnitude of the current value.

Here, a liquid crystal device having a liquid crystal capacitor (for example, a scanned antenna and an LCD) may have a storage capacitor electrically connected in parallel to the liquid crystal capacitor. As described above, this is for increasing the voltage holding ratio of the liquid crystal capacitor. In a case where a storage capacitor is electrically provided in parallel to the liquid crystal capacitor is provided, the voltage applied to the liquid crystal capacitor is also applied to the storage capacitor, and the V-I curve described above is influenced not only by the liquid crystal capacitor but also by the storage capacitor. That is, the V-I curve described above is a characteristic of the combined capacitor of the liquid crystal capacitor and the storage capacitor. However, since the storage capacitor has an inorganic insulating layer (for example, an SiO2 layer) as a dielectric layer and interface polarization, alignment polarization, and ion conduction do not occur, the residual DC voltage is exclusively due to the liquid crystal capacitor. Therefore, in a case where the liquid crystal device has the storage capacitor, what is strictly the V-I curve of the combined capacity described above is referred to as the V-I curve of the liquid crystal capacitor and, below, for the sake of simplicity, a description will be given of a case of having only liquid crystal capacitor. Here, in a case of having a storage capacitor electrically connected in parallel to the liquid crystal capacitor, strictly, in the following description, a combined capacitor (liquid crystal capacitor+storage capacitor) may be used instead of the liquid crystal capacitor.

Figure 22:
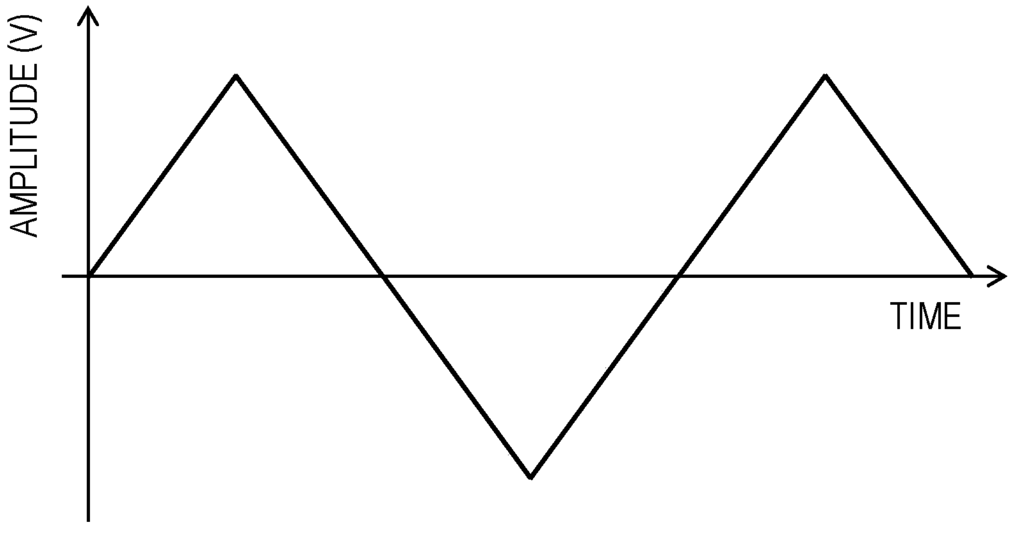
FIG. 22 is a diagram showing a waveform of a triangular wave voltage applied to a liquid crystal capacitor to generate a V-I curve.

FIG. 22 shows the waveform of the triangular wave voltage applied to the liquid crystal capacitor to generate the V-I curve. As shown in FIG. 22, for the triangular wave voltage, the amplitude changes over time in the shape of an isosceles triangle, and the amplitude in one period has the same ratio in a period of positive polarity and a period of negative polarity. The liquid crystal material (here, the nematic liquid crystal material) included in the liquid crystal layer of the liquid crystal capacitor is aligned according to the applied voltage. When the alignment of liquid crystal molecules changes, the capacitor value of the liquid crystal capacitor changes. When the voltage applied to the liquid crystal capacitor is increased, the liquid crystal molecules are aligned such that the axis having a large dielectric constant is parallel to the electric field. At this time, the capacitor value of the liquid crystal capacitor (may be written below as "C-Clc") increases. Here, the first "C" indicates the capacitor value (capacitance), and "Clc" indicates the liquid crystal capacitor. In the present specification, "Cls" and "Ccs" represent capacitors (capacitor elements), and the "C" before indicates a capacitor value. The capacitor value C-Clc of the liquid crystal capacitor Clc depends on time. The changes over time in the current flowing in the liquid crystal capacitor reflect the change in the capacitor value C-Clc and the behavior of the ionic impurities due to changes in the alignment of the liquid crystal molecules.

In general, the charge Q accumulated in the capacitor is represented by the product of the capacitor value C and the applied voltage V. Accordingly, the current I flowing through the capacitor is given by the time differentiation (partial differential) of Q. That is, the current I is given by the following equation.

$$I(t)=dQ/dt=CdV/dt+VdC/dt$$

As a result of various experiments by the present inventors, it was found that, in the V-I curve obtained by applying an appropriate triangular wave voltage, it is possible to measure the residual DC voltage as one half of the sum of a voltage Vmax having a maximum absolute value where a current value reaches a positive maximum value (vertical electric field mode) or minimum value (horizontal electric field mode), and a voltage Vmin having a maximum absolute value where a current value reaches a negative minimum value (vertical electric field mode) or maximum value (horizontal electric field mode).

The maximum value and the minimum value of the current flowing in the liquid crystal capacitor are attributable to the two items on the right side of the above equation. In a case of having the storage capacitor Cs parallel to the liquid crystal capacitor Clc, dC/dt in the above equation is d(C-Clc+C-Ccs)/dt. Since C-Ccs does not depend on time, dC/dt is dC-Clc/dt. That is, even in a case of having a storage capacitor, the maximum value and the minimum value of the V-I curve are attributable to the current flowing through the liquid crystal capacitor.

Below, the liquid crystal capacitor for measuring the rDC voltage may be referred to as the rDC monitoring capacitor or simply as the monitoring capacitor.

In a case of providing the monitoring storage capacitor $CS_{MVr}$, the capacitor value C-$CS_{MVr}$ is preferably set such that the ratio (C-$CS_{MVr}$/C-$C_{MVr}$) of the capacitor value C-$CS_{MVr}$ of the monitoring storage capacitor $CS_{MVr}$ with respect to the capacitor value C-$C_{MVr}$ of the monitoring capacitor $C_{MVr}$ is set to be equal to the ratio (C-Ccs/C-Clc) of the capacitor value C-Ccs of the storage capacitor CS with respect to the capacitor value C-Clc of the liquid crystal capacitor Clc in the antenna unit. In addition, the pair of electrodes of the monitoring storage capacitor $CS_{MVr}$ is preferably formed of the same material as the pair of electrodes of the storage capacitor CS, and more preferably formed from the same conductive film. Similarly, the dielectric layer of monitoring storage capacitor $CS_{MVr}$ is preferably formed of the same material as the dielectric layer of storage capacitor CS, and more preferably formed from the same dielectric film. In this manner, forming the rDC monitoring capacitor $C_{MVr}$ close to the liquid crystal capacitor Clc in the antenna unit makes it possible to set the rDC voltage of the rDC monitoring capacitor $C_{MVr}$ to a value directly comparable with the rDC voltage of the liquid crystal capacitor Clc.

Figure 23:
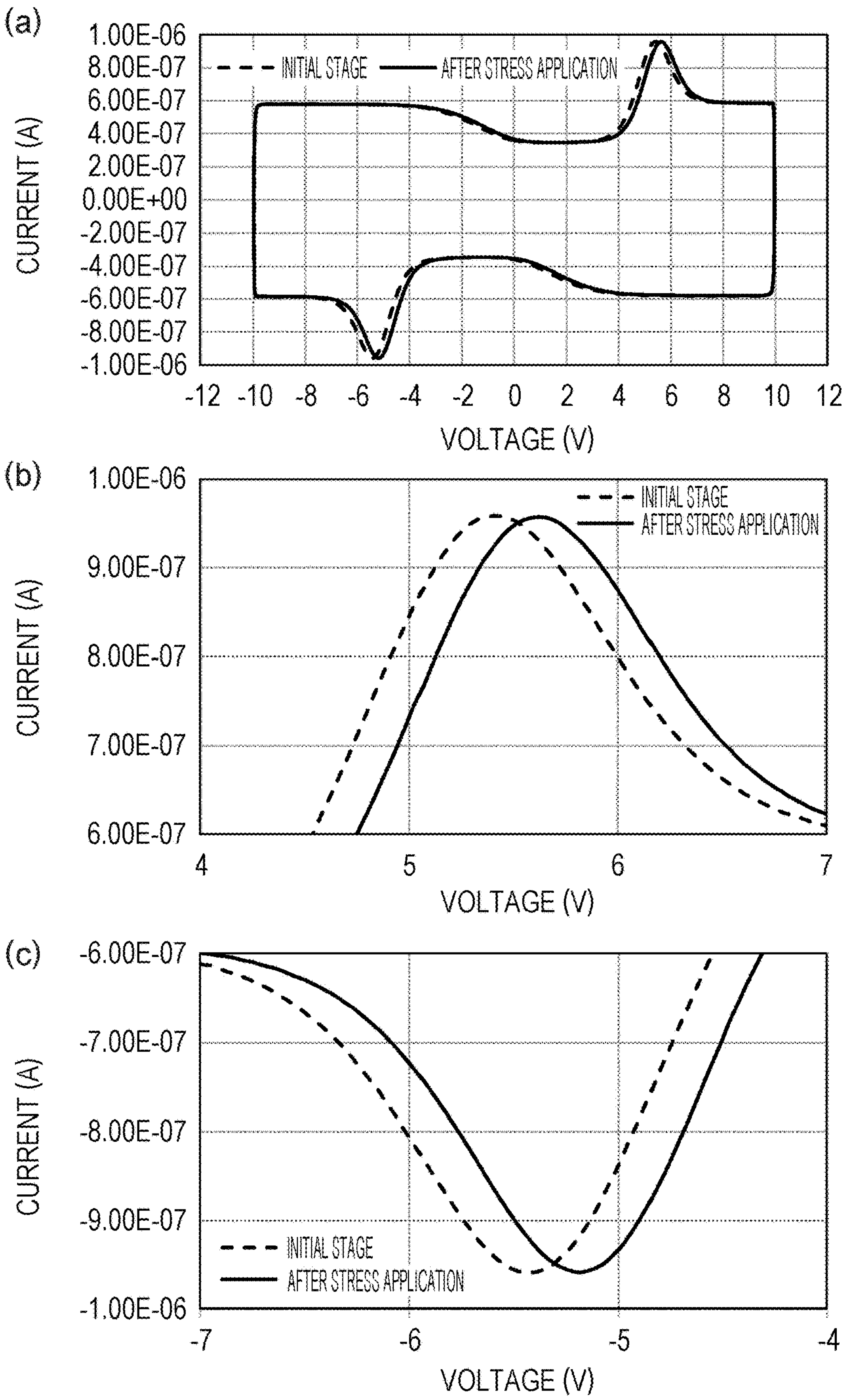
FIG. 23(*a*) is a diagram showing an example of a V-I curve of an ECB mode liquid crystal capacitor and FIG. 23(*b*) and FIG. 23(*c*) are views respectively showing the enlarged vicinity of a positive maximum value and the enlarged vicinity of a negative minimum value of the V-I curve of (a).

FIG. 23(*a*) to FIG. 23(*c*) show examples of the V-I curves of the liquid crystal capacitors in the ECB mode, which is one vertical electric field mode.

This monitoring capacitor has a liquid crystal layer (thickness: 3.0 μm) of a nematic liquid crystal material for a scanned antenna, between a pair of electrodes which are 1 $cm^2$. Each of the pair of electrodes was formed of a Cu layer. The frequency of the triangular wave voltage for generating the V-I curve was 10 Hz and the amplitude was ±10 V.

The monitoring capacitor was measured immediately after manufacturing (no voltage application) and after the stress application. Here, the stress application means applying a voltage having a DC component to the monitoring capacitor. Specifically, positive and negative symmetric AC voltages are applied to one electrode of a pair of electrodes of the monitoring capacitor, and a DC voltage is applied to the other electrode. In the scanned antenna, the data signal applied to the patch electrode is an AC voltage whose polarity is inverted at a constant period, and the signal applied to the slot electrode is a DC voltage. In the LCD, the display signal applied to the pixel electrode is an AC voltage whose polarity is inverted at a constant period, and the common voltage (counter voltage) applied to the common electrode (counter electrode) is a DC voltage. Here, a rectangular wave AC voltage with a 5 V DC voltage and amplitude of ±3 V and 60 Hz was applied for 2 hours.

The V-I curve in FIG. 23(*a*) shows a change in the current value during the application of the triangular wave voltage to the monitoring capacitor for one period (0 V→10 V→0 V→10 V→0 V). In the V-I curve of FIG. 23(*a*), the current value has a positive maximum value and a negative minimum value both at the initial stage and after the stress application. In the V-I curve, using a voltage Vmax having a maximum absolute value where a current value reaches a positive maximum value and a voltage Vmin having a maximum absolute value where a current value reaches a negative minimum value, one-half of the sum of Vmax and Vmin gives the rDC voltage. This was confirmed by comparison with the rDC voltage determined by the flicker elimination method as shown in the Examples below. The reason why the voltage having the largest absolute value among the maximum values (minimum value) is adopted is that, when the frequency of the triangular wave voltage is low (for example, 0.01 Hz), the maximum value and the minimum value are observed close to 0 V. A method for quantifying mobile ions using this maximum value and/or minimum value was proposed. Here, since peaks (maximum and minimum) derived from mobile ions are not found close to 0 V, these are simply referred to as a positive maximum value and a negative minimum value.

FIG. 23(*b*) and FIG. 23(*c*) show the vicinity of the positive maximum value and the vicinity of the negative minimum value of the V-I curve of FIG. 23(*a*), respectively, in an enlarged manner. From this V-I curve, the following values are obtained.

Voltage Vmax at which the current value is a positive maximum value in the initial V-I curve: 5.40 V Voltage Vmin at which the current value is a negative minimum value in the initial V-I curve: −5.43 V Voltage Vmax at which the current value is a positive maximum value in the V-I curve after stress application: 5.61 V Voltage Vmin at which the current value is a negative minimum value in the V-I curve after stress application: −5.17 V When the rDC voltage is determined based on the equation rDC=(Vmax+Vmin)/2, the following values are obtained for the initial stage and after the stress application.

Initial rDC voltage: (5.40−5.43)/2=−0.015 V rDC voltage after stress application: (5.61−5.17)/2=0.22 V In this manner, it was found that the rDC voltage of approximately 0.22 V is generated after the stress application, whereas the initial rDC voltage was approximately 0 V.

In order to make a comparison with a rDC voltage measured by the flicker elimination method of the related art, a horizontal electric field mode monitoring capacitor was manufactured and the V-I curve thereof was measured at the initial stage and after the stress application under the same conditions as above. A photoalignment film (horizontal alignment film) was used as the monitoring capacitor in a Fringe Field Switching (FFS) mode which is a horizontal electric field mode. The thickness of the photoalignment film was approximately 100 nm. As the liquid crystal material, a negative type nematic liquid crystal material having negative dielectric anisotropy was used. The thickness of the liquid crystal layer was approximately 3 μm. With a common electrode (lower) and a pixel electrode (liquid crystal layer side) laminated with an interlayer insulating film interposed therebetween, a slit having a width of approximately 4 μm was formed in the pixel electrode. In the liquid crystal layer of the monitoring capacitor, the area of the portion receiving the electric field from the pixel electrode and the common electrode was 1 $cm^2$.

Figure 24:
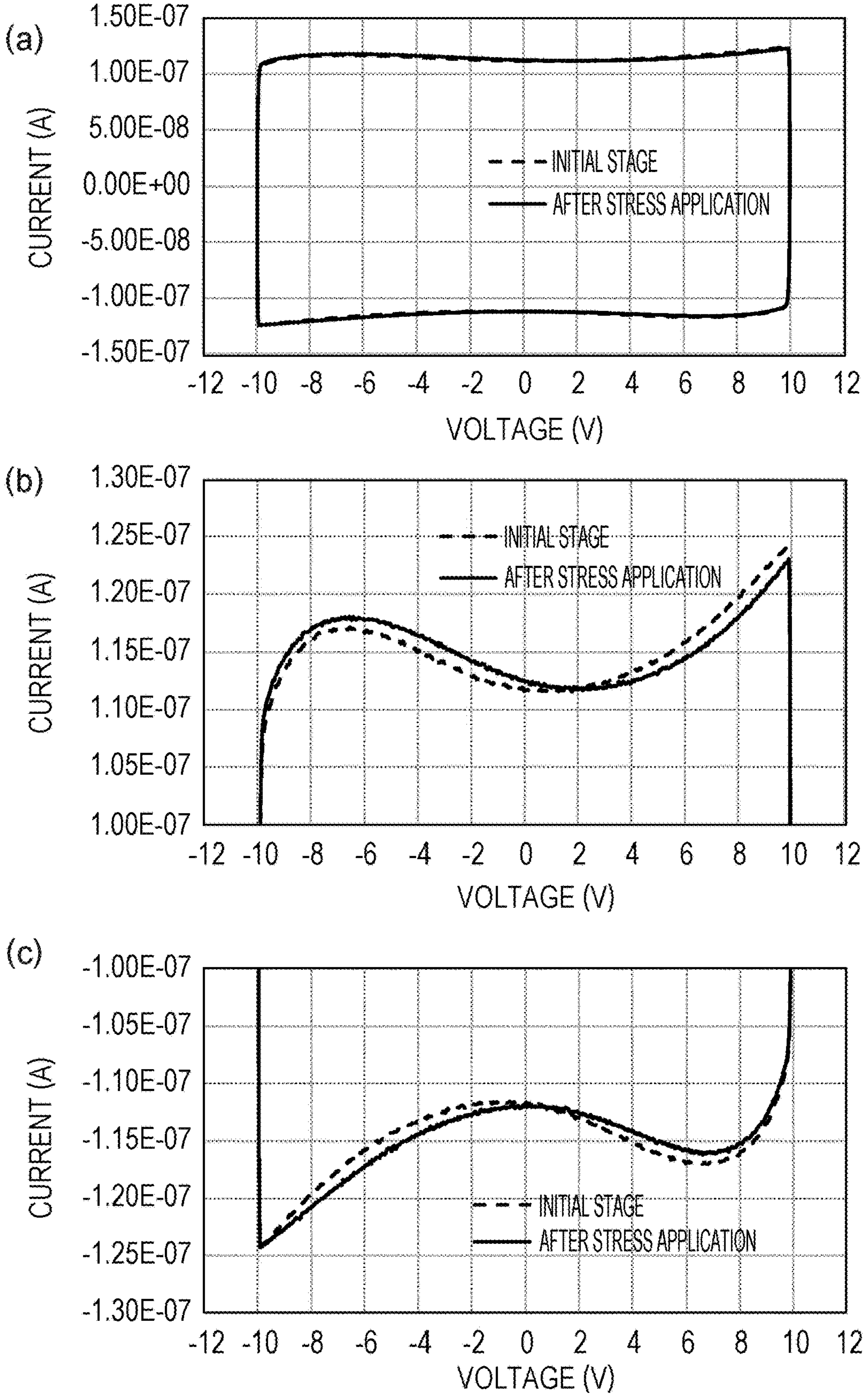
FIG. 24(*a*) is a diagram showing an example of a V-I curve of an FFS mode monitoring capacitor and FIG. 24(*b*) and FIG. 24(*c*) are views respectively showing the enlarged vicinity of a positive minimum value and the enlarged vicinity of a negative maximum value of the V-I curve of (a).

FIG. 24(*a*) to FIG. 24(*c*) show examples of the V-I curves of the monitoring capacitors of the FFS mode. FIG. 24(*a*) shows the entire V-I curve, and FIG. 24(*b*) and FIG. 24(*c*) each show the enlarged vicinity of the positive minimum value and vicinity of the negative maximum value of the V-I curve of FIG. 24(*a*).

Comparing FIG. 24(*a*) with FIG. 23(*a*), the maximum value or minimum value of the V-I curve of the monitoring capacitor of the horizontal electric field mode shown in FIG. 24(*a*) is not clear. In addition, in FIG. 24(*a*), a minimum value appears when the current value is positive, and a maximum value appears when the current value is negative. From this V-I curve, the following values are obtained.

Voltage Vmax at which the current value is a positive minimum value in the initial V-I curve: 0.65 V Voltage Vmin at which the current value is a negative maximum value in the initial V-I curve: −0.62 V Voltage Vmax at which the current value is a positive minimum value in the V-I curve after stress application: 2.67 V Voltage Vmin at which the current value is a negative maximum value in the V-I curve after stress application: 0.21 V When the rDC voltage is determined based on the equation rDC=(Vmax+Vmin)/2, the following values are determined for the initial stage and after the stress application.

Initial rDC voltage: (0.65−0.62)/2=0.015 V rDC voltage after stress application: (2.67+0.21)/2=1.44 V On the other hand, the rDC voltage of the monitoring capacitor after stress application was measured by the flicker elimination method, and was 1.43 V. The 1.44 V obtained by the method for measuring the rDC voltage according to the embodiment of the present invention matches well. From this, it was confirmed that it is possible to electrically and quantitatively measure the rDC voltage by the above method using the triangular wave voltage.

Since the method for measuring the rDC voltage according to the embodiment of the present invention is performed electrically, it is possible to determine the rDC voltage in a state where a liquid crystal device is used as illustrated in the embodiment below. Accordingly, it is possible to optimize the common voltage according to the measured rDC voltage. In addition, as a result, it is possible to suppress deterioration of characteristics or reliability of the liquid crystal device having a comparatively large change in the residual DC voltage of the scanned antenna, or the like.

The size of the monitoring capacitor may be set so as to obtain a sufficient current when determining the V-I curve, for example, the area of the liquid crystal layer portion included in the monitoring capacitor is preferably 25 $mm^2$ or more. The thickness of the liquid crystal layer is preferably the same as the thickness of the liquid crystal layer in the active region.

The monitoring capacitor may be arranged at a position closer to the seal portion than the active region. In addition, a plurality of monitoring capacitors may be provided. The plurality of monitoring capacitors may include two monitoring capacitors arranged to face each other with the active region in between. When a plurality of monitoring capacitors are provided, it is preferable to use an average value of rDC voltages measured using a plurality of monitoring capacitors.

Here, it is also possible to perform the method for measuring the rDC voltage according to the embodiment of the present invention using the liquid crystal capacitor of the active region without separately providing a monitoring capacitor. That is, with respect to a group of two or more liquid crystal capacitors adjacent to each other among a plurality of liquid crystal capacitors in the active region, the V-I curve may be measured by applying positive and negative symmetrical triangular wave voltages to all of one of the electrodes of two or more liquid crystal capacitors of the group and measuring the current flowing in the other electrodes. For example, when measuring a residual DC voltage of a liquid crystal device having a plurality of pixels (liquid crystal capacitors) arranged in a matrix as in an LCD panel, with respect to groups of two or more pixels adjacent to each other among a plurality of pixels, a V-I curve may be obtained by applying a positive and negative symmetrical triangular wave voltage to one electrode of one of the two or more pixels belonging to the group and measuring a current flowing through the other electrode.

For example, a V-I curve may be obtained using a group of pixels of, for example, 10 rows and 10 columns among a large number of pixels of the LCD panel. It is possible to select the group of pixels used to measure the V-I curve, for example, by supplying voltages to the gate bus line and the source bus line. The number of pixels included in the pixel group to be selected may be appropriately set so as to obtain a sufficient current when measuring the V-I curve. In addition, pixel groups of a plurality of different positions may be sequentially selected to obtain a V-I curve for each pixel group. At this time, in the same manner as in the case of using a plurality of monitoring capacitors, the common voltage may be set using the average value of the rDC voltages obtained for the plurality of pixel groups. In the step of generating the V-I curve, the triangular wave voltage is supplied from the source bus line to the pixel electrode via the TFT, and the current is measured from the common electrode (counter electrode).

A number of antenna units (liquid crystal capacitors) of the scanned antenna may not be arranged in a matrix, but, similarly to the LCD panel, it is possible to generate the V-I curves for a group including a plurality of antenna units adjacent to each other. At this time, the triangular wave voltage is supplied from the source bus line to the patch electrode via the TFT, and the current is measured from the slot electrode.

The frequency of the triangular wave voltage is, for example, 0.01 Hz or more and 100 Hz or less. In the low frequency region where the frequency of the triangular wave voltage is less than 0.01 Hz, the current peak due to the movement of the ionic impurities in the liquid crystal layer appears on the V-I curve, and it may be difficult to specify the maximum value or the minimum value resulting from the change in the capacitance of the liquid crystal capacitor due to the changes in alignment of the liquid crystal molecules. In addition, in a high frequency region higher than 100 Hz, the alignment change of the liquid crystal molecules is not able to follow the changes in the voltage, the capacitance of the liquid crystal capacitor does not change sufficiently, and the maximum value or the minimum value may not appear on the V-I curve. In addition, it is sufficient if the absolute value of the amplitude of the triangular wave voltage is able to sufficiently change the alignment of the liquid crystal molecules, for example, 1 V or more and 10 V or less.

A description will be given below of an example of an embodiment according to the present invention with respect to a scanned antenna which is able to obtain the effect of the present invention remarkably well.

Figure 25:
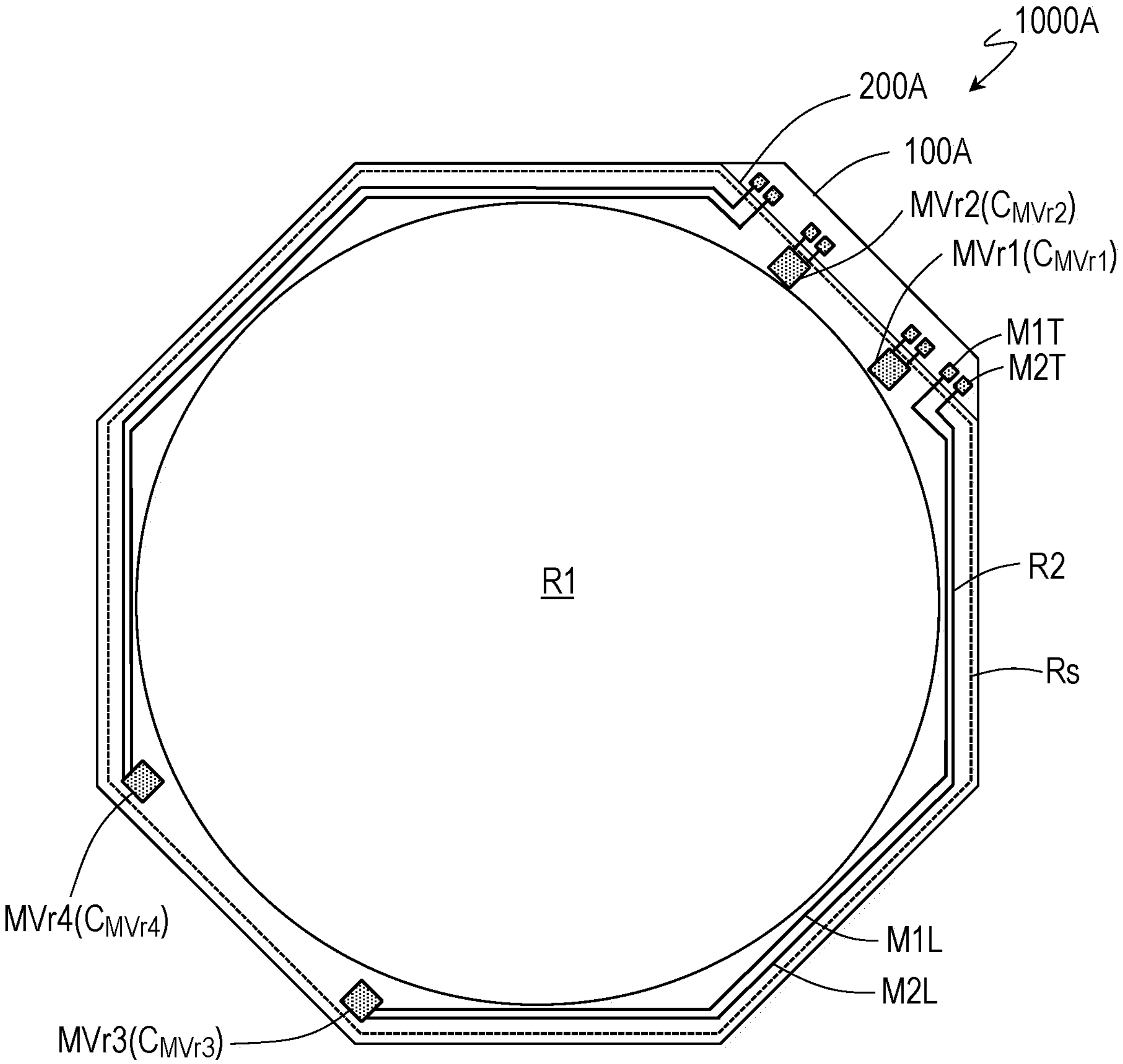
FIG. 25 is a schematic plan view showing a scanned antenna 1000A according to an embodiment of the present invention.

A description will be given of the structure of the scanned antenna 1000A according to the embodiment of the present invention with reference to FIG. 25 to FIG. 28. FIG. 25 is a schematic plan view showing the scanned antenna 1000A.

As shown in FIG. 25, the scanned antenna 1000A has four rDC monitoring capacitor portions (referred to below as "monitoring capacitor portions") MVr1, MVr2, MVr3, and MVr4 in the non-transmission/reception region R2 outside the transmission/reception region R1. Each of the monitoring capacitor portions MVr1, MVr2, MVr3, and MVr4 has an rDC monitoring capacitor (referred to below as "monitoring capacitor") $C_{MVr1}$, $C_{MVr2}$, $C_{MVr3}$, and $C_{MVr4}$ having the same configuration as the liquid crystal capacitor Clc of each of the antenna units. In general, in addition to the monitoring capacitor, the monitoring capacitor portion may have a storage capacitor electrically connected in parallel to the monitoring capacitor.

Each of the monitoring capacitors $C_{MVr1}$, $C_{MVr2}$, $C_{MVr3}$, and $C_{MVr4}$ has a pair of electrodes and a liquid crystal layer arranged between the pair of electrodes, and the pair of electrodes is preferably formed of the same material as the pair of electrodes of the liquid crystal capacitor Clc, and more preferably formed from the same conductive film. In addition, the liquid crystal layer of each of the monitoring capacitors $C_{MVr1}$, $C_{MVr2}$, $C_{MVr3}$, and $C_{MVr4}$ is one liquid crystal layer continuous with the liquid crystal layer LC of the transmission/reception region R1, and the thicknesses of the liquid crystal layers are also controlled to be substantially the same. In addition, a pair of alignment films in contact with the respective liquid crystal layers of the monitoring capacitors $C_{MVr1}$, $C_{MVr2}$, $C_{MVr3}$, and $C_{MVr4}$ are also common to the pair of alignment films formed in the transmission/reception region R1.

Although the scanned antenna 1000A has four monitoring capacitors $C_{MVr1}$, $C_{MVr2}$, $C_{MVr3}$, and $C_{MVr4}$, the scanned antenna 1000A may have at least one monitoring capacitor. Since the degree of deterioration of the liquid crystal material of the liquid crystal layer may vary depending on the place, a plurality of monitoring capacitors may be arranged at different positions, and the average value of the rDC voltages measured for each of the plurality of monitoring capacitors may be used. The plurality of monitoring capacitors may include two monitoring capacitors arranged to face each other with the active region in between. The monitoring capacitors $C_{MVr1}$ and $C_{MVr2}$ and the monitoring capacitors $C_{MVr3}$ and $C_{MVr4}$ of the scanned antenna 1000A are arranged to face each other with the transmission/reception region R1 in between. The pair of electrodes of each of the monitoring capacitors $C_{MVr1}$, $C_{MVr2}$, $C_{MVr3}$, and $C_{MVr4}$ are connected to the corresponding terminal electrodes M1T and M2T via connection wires M1L and M2L. A detailed description will be given below of the connection structure.

The configuration in the transmission/reception region R1 of the scanned antenna 1000A may be the same as the structure in the transmission/reception region R1 of the scanned antenna 1000 described with reference to FIG. 2, for example. Below, description and/or illustration of the structure common to the scanned antenna 1000 may be omitted. FIG. 25 shows the structure of the scanned antenna 1000A in a simplified manner. In addition, in the diagrams below, a reflective conductive plate or the like (the air layer 54, the reflective conductive plate 65, and the like in FIG. 1) arranged so as to face the air layer and the dielectric substrate of the slot substrate 200A via the air layer in the scanned antenna 1000A may be omitted.

Figure 26:
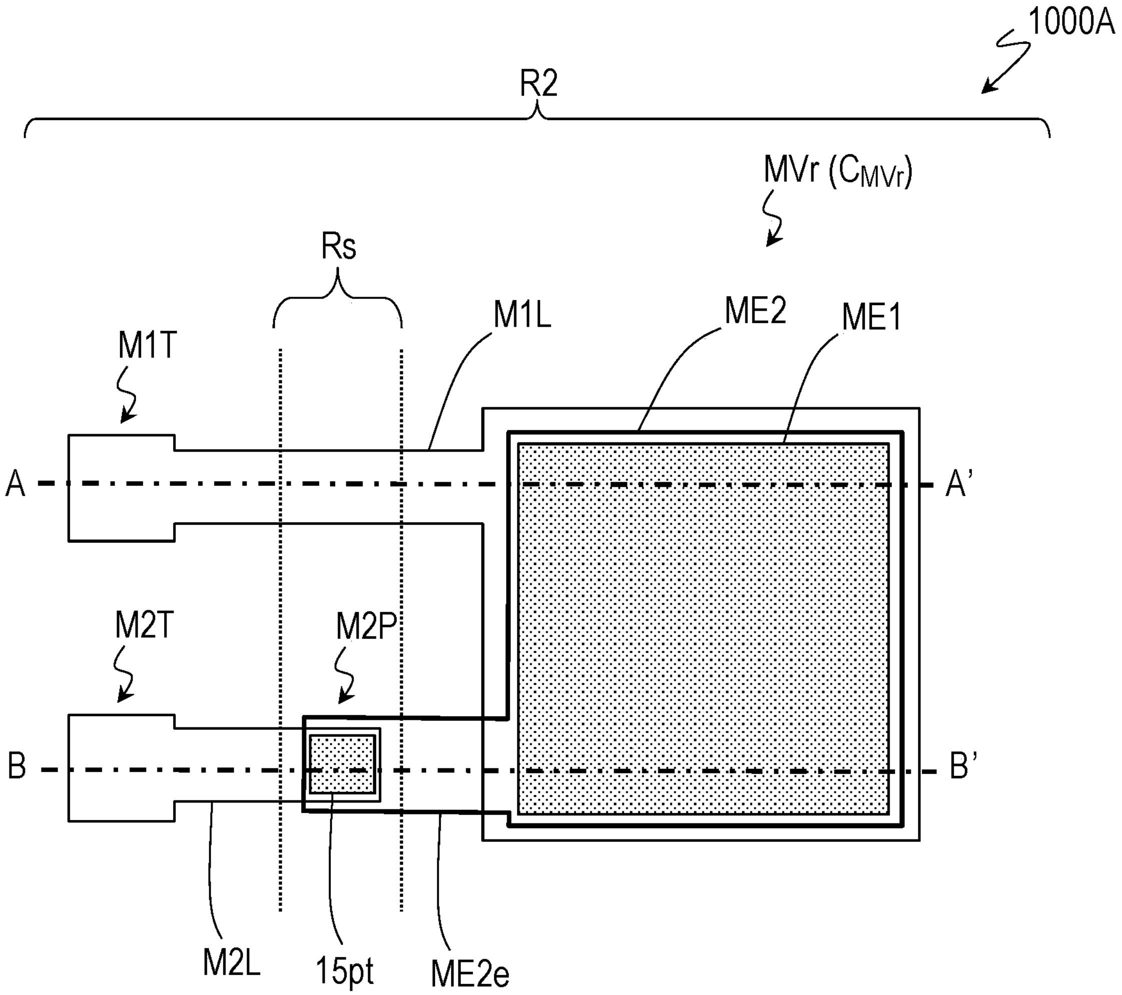
FIG. 26 is a schematic plan view showing a non-transmission/reception region R2 of the scanned antenna 1000A.

As shown in FIG. 26, the scanned antenna 1000A further has a measurement electrode transfer portion M2P, a first measurement electrode terminal portion M1T, and a second measurement electrode terminal portion M2T in the non-transmission/reception region R2.

Figure 27:
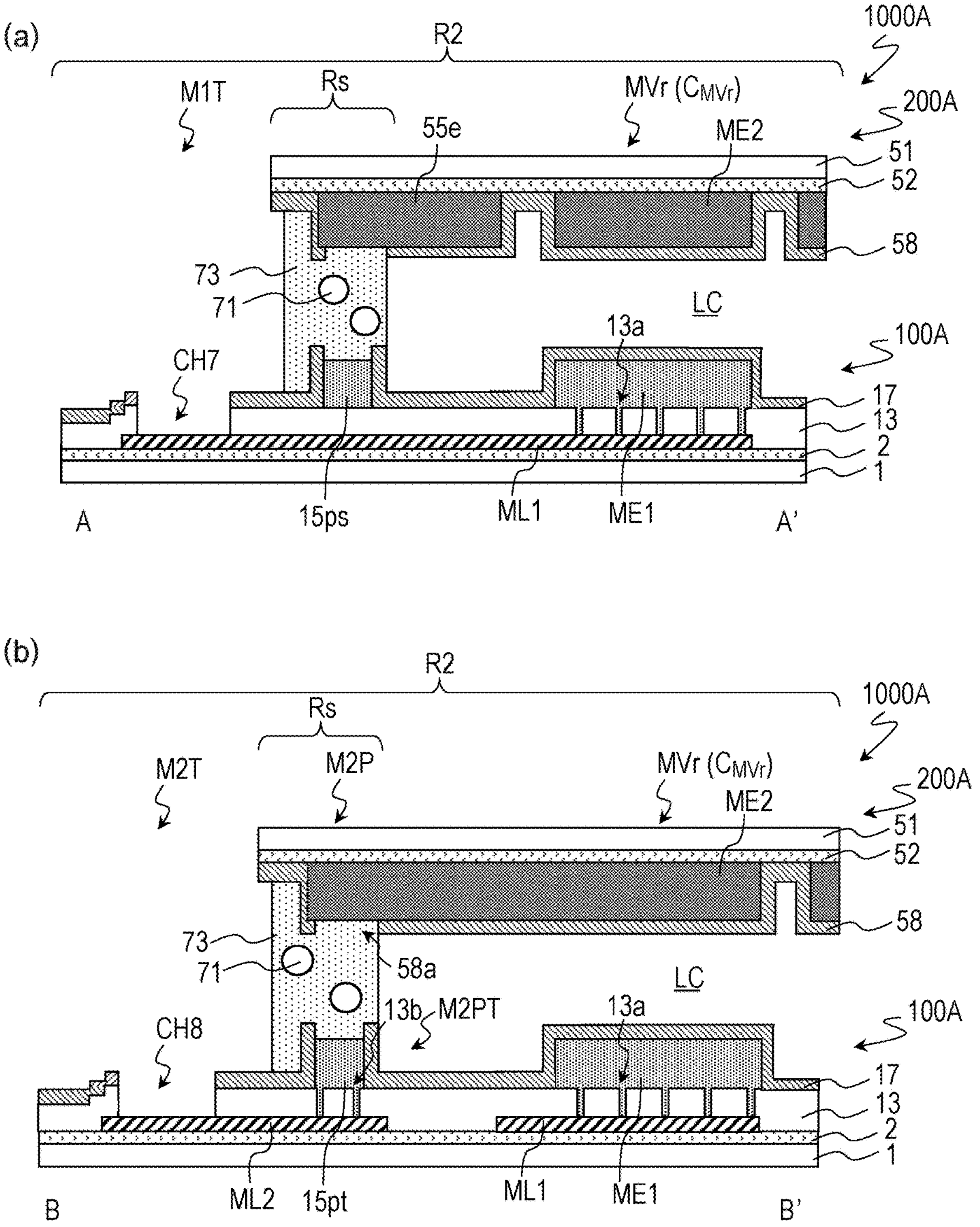
FIG. 27(*a*) and FIG. 27(*b*) are schematic cross-sectional views showing the non-transmission/reception region R2 of the scanned antenna 1000A along lines A-A' and B-B' in FIG. 26, respectively.
Figure 28:
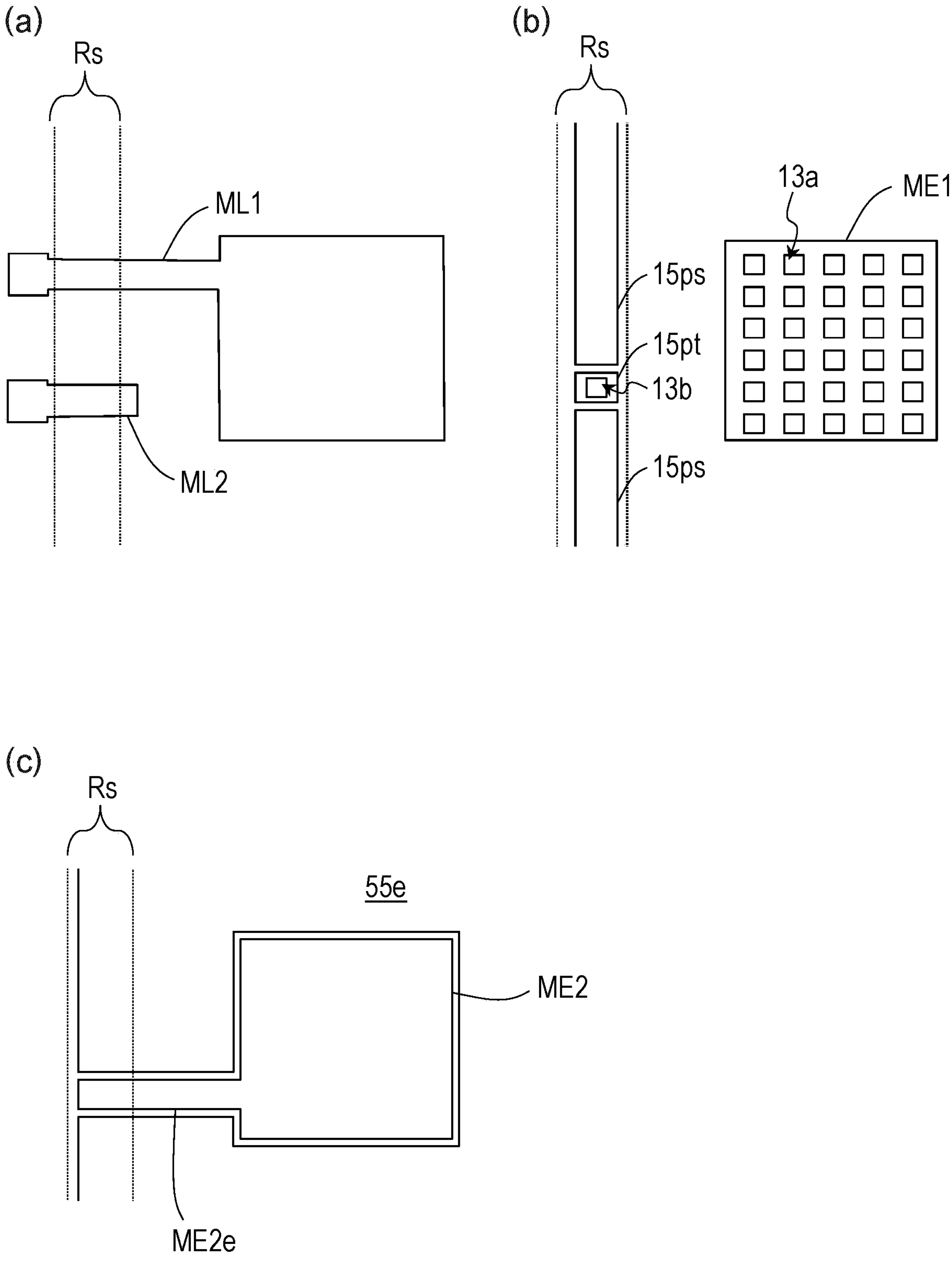
FIG. 28(*a*) and FIG. 28(*b*) are schematic plan views of a TFT substrate 100A of the scanned antenna 1000A, and FIG. 28(*c*) is a schematic plan view of a slot substrate 200A of the scanned antenna 1000A.

With reference to FIG. 26 to FIG. 28, a description will be given of the structures of the rDC monitoring capacitor portion MVr, the measurement electrode transfer portion M2P, the first measurement electrode terminal portion M1T, and the second measurement electrode terminal portion M 2 T.

FIG. 26 is a schematic plan view showing the non-transmission/reception region R2 of the scanned antenna 1000A. FIG. 27(*a*) and FIG. 27(*b*) are schematic cross-sectional views showing the non-transmission/reception region R2 of the scanned antenna 1000A along the line A-A' and the line B-B' in FIG. 26, respectively. FIG. 28(*a*) to FIG. 28(*c*) are schematic plan views showing regions corresponding to the non-transmission/reception region R2 of the scanned antenna 1000A shown in FIG. 26, FIG. 28(*a*) and FIG. 28(*b*) are schematic plan views of the TFT substrate 100A of the scanned antenna 1000A, and FIG. 28(*c*) is a schematic plan view of the slot substrate 200A of the scanned antenna 1000A. FIG. 28(*a*) shows the gate metal layer, FIG. 28(*b*) shows the patch metal layer, and FIG. 28(*c*) shows a layer including the slot electrode 55.

FIG. 27 shows the structure of the liquid crystal panel of the scanned antenna, and illustration of the dielectric layer (air layer) 54 and the reflective conductive plate 65 in FIG. 1 is omitted.

In the following description, the monitoring capacitor portion MVr represents any one of the above monitoring capacitor portions MVr1, MVr2, MVr3, and MVr4, and the monitoring capacitor $C_{MVr}$ similarly represents any one of the above monitoring capacitors $C_{MVr1}$, $C_{MVr2}$, $C_{MVr3}$, and $C_{MVr4}$. However, it is possible to set the sizes and the like of the monitoring capacitor portions MVr1, MVr2, MVr3, and MVr4 independently of each other, and in the same manner, it is possible to set the sizes and the like of the monitoring capacitors $C_{MVr1}$, $C_{MVr2}$, $C_{MVr3}$, and $C_{MVr4}$ independently of each other. However, the sizes and the like of the monitoring capacitors MVr1, MVr2, MVr3, and MVr4, and the sizes and the like of the monitoring capacitors $C_{MVr1}$, $C_{MVr2}$, $C_{MVr3}$, and $C_{MVr4}$, are preferably set such that the capacitor values are equal to each other.

rDC Monitoring Capacitor Portion MVr

As shown in FIG. 26 and FIG. 27, the rDC monitoring capacitor portion MVr has an rDC monitoring capacitor $C_{MVr}$. The rDC monitoring capacitor portion MVr illustrated here does not have a storage capacitor.

The rDC monitoring capacitor $C_{MVr}$ has a liquid crystal layer LC, and a first measurement electrode ME1 and a second measurement electrode ME2 which face each other with the liquid crystal layer LC interposed therebetween. Strictly speaking, an alignment film is provided between the first measurement electrode ME1 and the liquid crystal layer LC and between the second measurement electrode ME2 and the liquid crystal layer LC, respectively. The first measurement electrode ME1 and the second measurement electrode ME2 are arranged inside the seal region Rs (closer to the transmission/reception region R1 than the seal region Rs).

Having the rDC monitoring capacitor portion MVr makes it possible for the scanned antenna 1000A to measure the rDC voltage of the rDC monitoring capacitor $C_{MVr}$.

The position of the rDC monitoring capacitor $C_{MVr}$, that is, the positions of the first measurement electrode ME1 and the second measurement electrode ME2 are preferably separated from the seal region Rs by 10 mm or more. That is, the first measurement electrode ME1 and the second measurement electrode ME2 are preferably arranged so as not to overlap the region which is less than 10 mm from the seal region Rs. This is to prevent the influence of ionic impurities eluted (for example, derived from the uncured component) from the seal resin forming the seal region Rs into the liquid crystal layer LC.

Since many antenna unit regions are separated further from the seal region Rs than the rDC monitoring capacitor $C_{MVr}$r, the liquid crystal layer LC of the liquid crystal capacitor $C_{lc}$ in the antenna unit region in the transmission/reception region R1 tends to be less easily influenced by the resin forming the seal region Rs than the liquid crystal layer LC of the rDC monitoring capacitor $C_{MVr}$ of the non-transmission/reception region R2. When the liquid crystal layer LC of the rDC monitoring capacitor $C_{MVr}$ is influenced by the resin forming the seal region Rs, the rDC voltage of the rDC monitoring capacitor $C_{Mvr}$ and the rDC voltage of the liquid crystal capacitor in the antenna unit region are greatly different. In this case, it may be difficult to estimate the rDC voltage of the liquid crystal capacitor $C_{lc}$ of the antenna unit region from the measured value of the rDC voltage of the rDC monitoring capacitor $C_{MVr}$. Arranging the first measurement electrode ME1 and the second measurement electrode ME2 at a distance of 10 mm or more separated from the seal region Rs makes it possible to suppress the occurrence of such a problem.

As shown in FIG. 27(*a*), the rDC monitoring capacitor portion MVr has the first measurement electrode connection portion (also referred to as "connection wire") M1L, an insulating layer 13 covering the first measurement electrode connection portion M1L, and the first measurement electrode ME1 formed on the insulating layer 13, on the TFT substrate 100A. The first measurement electrode connection portion M1L is formed from the same conductive film (gate metal layer) as the gate electrode 3. The insulating layer 13 has at least one opening portion 13*a* reaching the first measurement electrode connection portion M1L. The first measurement electrode ME1 is formed from the same conductive film (patch metal layer) as the patch electrode 15. The first measurement electrode ME1 is formed on the insulating layer 13 and in the opening portion 13*a* and is in contact with the first measurement electrode connection portion M1L in the opening portion 13*a*.

The insulating layer 13 includes, for example, the gate insulating layer 4 and the first insulating layer 11 (refer to FIG. 3).

The rDC monitoring capacitor portion MVr may further have the second insulating layer 17 covering the first measurement electrode ME1.

As shown in FIG. 27(*a*), the rDC monitoring capacitor portion MVr has the second measurement electrode ME2 having a portion facing the first measurement electrode ME1 via the liquid crystal layer LC in the slot substrate 200A. The second measurement electrode ME2 is formed of the same conductive film as the slot electrode 55 and is electrically separated from an extended portion 55*e* of the slot electrode 55. The "extended portion 55*e* of the slot electrode 55" is a portion extending from the slot electrode 55 to the non-transmission/reception region R2. It is possible to omit the extended portion 55*e* of the slot electrode 55.

The rDC monitoring capacitor portion MVr may further have the fourth insulating layer 58 covering the second measurement electrode ME2.

Each of the first measurement electrode ME1 and the second measurement electrode ME2 is, for example, a rectangular shape of approximately 1 cm square. Here, the shape and the size of the first measurement electrode ME1 refer to those viewed from the normal direction of the TFT substrate 100A, and the shape and the size of the second measurement electrode ME2 refer to those viewed from the normal direction of the slot substrate 200A. The shapes and sizes of the first measurement electrode ME1 and the second measurement electrode ME2 are not particularly limited as long as the first measurement electrode ME1 and the second measurement electrode ME2 have portions facing each other via the liquid crystal layer LC. The first measurement electrode ME1 and the second measurement electrode ME2 may have the same shape and size, or may differ in shape and/or size. In order to more accurately measure the rDC voltage of the rDC monitoring capacitor portion MVr, the first measurement electrode ME1 and the second measurement electrode ME2 preferably have the same shape and size.

The structure of the rDC monitoring capacitor portion MVr is not limited to the illustrated structure. For example, the first measurement electrode connection portion M1L may not be formed using the same conductive film as the gate electrode 3. The transfer terminal connection portion 15*pt* may not be formed using the same conductive film as the patch electrode 15. However, it is preferable to form these in any of the conductive layers of the conductive layers (including the gate metal layer, the source metal layer, and the patch metal layer) of the TFT substrate 100A, respectively. In this case, it is possible to form the rDC monitoring capacitor portion without increasing the number of manufacturing steps of the scanned antenna (for example, the number of photomasks).

The insulating layer 13 may have one opening portion 13*a* or a plurality thereof. In this example, since the insulating layer 13 has a plurality of the opening portions 13*a*, it is possible to improve the stability of the electrical connection between the first measurement electrode ME1 and the first measurement electrode connection portion M1L. The opening portion 13*a* may not be provided in the rDC monitoring capacitor portion MVr. For example, the insulating layer 13 may have at least one opening portion in a region other than the rDC monitoring capacitor portion MVr, the extended portion of the first measurement electrode ME1 may be formed on the insulating layer 13 and in the opening portion, and the extended portion of the first measurement electrode ME1 may be in contact with the first measurement electrode connection portion M1L in the opening portion.

Measurement Electrode Transfer Portion M2P and Measurement Electrode Transfer Terminal Portion M2PT As shown in FIG. 26 and FIG. 27, the measurement electrode transfer portion M2P is a connection portion between the measurement electrode transfer terminal portion M2PT of the TFT substrate 100A and the second measurement electrode ME2. In this example, the measurement electrode transfer portion M2P is arranged in the seal region Rs. For example, the measurement electrode transfer terminal portion M2PT and the second measurement electrode ME2 are connected via the resin (seal resin) 73 (also referred to as "seal portion 73") including the conductive beads 71, similarly to the transfer portion described with reference to FIG. 7. By having the conductive beads 71, the seal portion 73 has conductivity only in the vertical direction in FIG. 27 and does not have conductivity in the direction orthogonal to the paper surface.

In the measurement electrode transfer portion M2P, the TFT substrate 100A has a measurement electrode transfer terminal portion M2PT.

The measurement electrode transfer terminal portion M2PT has a second measurement electrode connection portion (also referred to as "connection wire") M2L, the insulating layer 13 covering the second measurement electrode connection portion M2L, a transfer terminal connection portion 15*pt* formed on the insulating layer 13. The second measurement electrode connection portion M2L is formed using the same conductive film as the first measurement electrode connection portion M1L and is electrically separated from the first measurement electrode connection portion M1L. The insulating layer 13 has at least one opening portion 13*b* reaching the second measurement electrode connection portion M2L. The transfer terminal connection portion 15*pt* is formed using the same conductive film as the patch electrode 15. The transfer terminal connection portion 15*pt* is formed on the insulating layer 13 and in the opening portion 13*b* and is in contact with the second measurement electrode connection portion M2L in the opening portion 13*b*.

The measurement electrode transfer terminal portion M2PT preferably has the same laminated structure as, for example, the transfer terminal portion PT (refer to FIG. 4(*c*), for example).

In the measurement electrode transfer portion M2P, the slot substrate 200A has an extended portion ME2*e* of the second measurement electrode ME2 and the fourth insulating layer 58 covering the extended portion ME2*e* of the second measurement electrode ME2, and the fourth insulating layer 58 has at least one opening portion 58*a* exposing a part of the extended portion ME2*e* of the second measurement electrode ME2.

In the measurement electrode transfer portion M2P, the second measurement electrode ME2 is electrically connected to the second measurement electrode connection portion M2L of the TFT substrate 100A.

Here, the measurement electrode transfer portion M2P (measurement electrode transfer terminal portion M2PT) may not be arranged in the seal region Rs. For example, the measurement electrode transfer portion M2P may be arranged outside the seal region Rs in the non-transmission/reception region R2.

The structure of the measurement electrode transfer terminal portion M2PT is not limited to the illustrated structure. For example, the second measurement electrode connection portion M2L may not be formed using the same conductive film as the first measurement electrode connection portion M1L. The transfer terminal connection portion 15*pt* may not be formed using the same conductive film as the patch electrode 15. From the viewpoint of suppressing an increase in the number of manufacturing steps of the scanned antenna (the number of photomasks), these are preferably formed in any of the conductive layers of the conductive layers (including the gate metal layer, the source metal layer, and the patch metal layer) of the TFT substrate 100A.

As shown in FIG. 28(*b*), the patch metal layer may have a seal region portion 15*ps* electrically separated from the transfer terminal connection portion 15*pt* in the seal region Rs. For example, the TFT substrate 100A preferably has the same laminated structure as the transfer terminal portion PT (refer to FIG. 4(*c*), for example) in the seal region Rs. Due to this, in the seal region Rs, it is possible to form a transfer portion which connects the electrode or terminal of the TFT substrate 100A and the electrode or terminal of the slot substrate 200A.

First Measurement Electrode Terminal Portion M1T and Second Measurement Electrode Terminal Portion M2T As shown in FIG. 26 and FIG. 27, the first measurement electrode terminal portion M1T and the second measurement electrode terminal portion M2T are provided on the TFT substrate 100A outside the seal region Rs (the opposite side of the seal region Rs to the liquid crystal layer LC side) in the non-transmission/reception region R2 of the scanned antenna 1000A. The first measurement electrode terminal portion M1T and the second measurement electrode terminal portion M2T do not have the liquid crystal layer LC and the slot substrate 200A. That is, in the first measurement electrode terminal portion M1T and the second measurement electrode terminal portion M2T, the TFT substrate 100A is exposed.

As shown in FIG. 27(*a*), the first measurement electrode terminal portion M1T has a first measurement electrode connection portion M1L, and the insulating layer 13 and the second insulating layer 17 covering the first measurement electrode connection portion M1L. The insulating layer 13 and the second insulating layer 17 have a contact hole CH7 reaching the first measurement electrode connection portion M1L.

The contact hole CH7 may be covered with a transparent conductive layer (not shown). That is, the first measurement electrode terminal portion M1T further has a transparent conductive layer formed on the second insulating layer 17 and in the contact hole CH7, and the transparent conductive layer may be in contact with the first measurement electrode connection portion M1L in the contact hole CH7.

As shown in FIG. 27(*b*), the second measurement electrode terminal portion M2T has a second measurement electrode connection portion M2L, and the insulating layer 13 and the second insulating layer 17 covering the second measurement electrode connection portion M2L. The insulating layer 13 and the second insulating layer 17 have a contact hole CH8 reaching the second measurement electrode connection portion M2L.

The contact hole CH8 may be covered with a transparent conductive layer (not shown). That is, the second measurement electrode terminal portion M2T further has a transparent conductive layer formed on the second insulating layer 17 and in the contact hole CH8, and the transparent conductive layer may be in contact with the second measurement electrode connection portion M2L in the contact hole CH8.

As shown in FIG. 28(*a*), in this example, the first measurement electrode connection portion M1L includes a portion overlapping with the first measurement electrode ME1, a portion forming the first measurement electrode terminal portion M1T, and a portion extending between the two sides over the seal region Rs. As shown in FIG. 28(*a*), the second measurement electrode connection portion M2L includes a portion forming the second measurement electrode terminal portion M2T, a portion forming the measurement electrode transfer terminal portion M2PT, and a portion extending between the two.

Method for Manufacturing Scanned Antenna 1000A

A description will be given of an example of a method for manufacturing the scanned antenna 1000A.

First, a description will be given below of the method for manufacturing the TFT substrate 100A. Here, descriptions of matters which are the same as the method for manufacturing the TFT substrate 101 described with reference to FIG. 5 may be omitted.

A gate conductive film is formed on the dielectric substrate 1 and the base insulating film 2, and the gate conductive film is patterned to form a gate metal layer. The gate metal layer includes the gate electrode 3 and the gate bus line GL in the transmission/reception region R1, and includes the first measurement electrode connection portion M1L and the second measurement electrode connection portion M2L in the non-transmission/reception region R2.

On the gate metal layer, the gate insulating layer 4, the semiconductor layer 5, the source metal layer, and the first insulating layer 11 are formed in this order.

Thereafter, the gate insulating layer 4 and the first insulating layer 11 (that is, the insulating layer 13) are collectively etched to form the opening portion 13*a* reaching the first measurement electrode connection portion M1L in the gate insulating layer 4 and the first insulating layer 11. In this step, in the gate insulating layer 4 and the first insulating layer 11, the opening portion 13*b* reaching the second measurement electrode connection portion M2L may be further formed.

Next, a patch conductive film is formed on the first insulating layer 11, in the opening portion 13*a*, and in the opening portion 13*b*, and the patch conductive film is patterned to form a patch metal layer. The patch metal layer includes the patch electrode 15 in the transmission/reception region R1, and includes the first measurement electrode ME1 in the rDC monitoring capacitor portion MVr of the non-transmission/reception region R2. The first measurement electrode ME1 is formed on the first insulating layer 11 and in the opening portion 13*a* and is in contact with the first measurement electrode connection portion M1L in the opening portion 13*a*. The patch metal layer may further include a seal region portion 15*ps* in the seal region Rs of the non-transmission/reception region R2. The seal region portion 15*ps* is formed on the first insulating layer 11 and in the opening portion 13*b* and is in contact with the second measurement electrode connection portion M2L in the opening portion 13*b*.

Next, the second insulating layer 17 is formed on the patch metal layer and on the first insulating layer 11.

Thereafter, the second insulating layer 17, the first insulating layer 11, and the gate insulating layer 4 (that is, the second insulating layer 17 and the insulating layer 13) are collectively etched to form the contact hole CH7 reaching the first measurement electrode connection portion M1L and the contact hole CH8 reaching the second measurement electrode connection portion M2L in the second insulating layer 17, the first insulating layer 11, and the gate insulating layer 4.

Thereafter, a transparent conductive film is formed on the second insulating layer 17, and the transparent conductive film is patterned. In this manner, the TFT substrate 100A is formed.

Subsequently, a description will be given of a method for manufacturing the slot substrate 200A. Here, description of matters which are the same as the method for manufacturing the slot substrate 201 described above may be omitted.

A metal film is formed on the dielectric substrate 51 and the third insulating layer 52 and patterned to form a layer including the slot electrode 55. A layer including the slot electrode 55 may be referred to as a "slot metal layer". The slot metal layer includes the slot electrode 55, the extended portion 55*e* of the slot electrode, and the second measurement electrode ME2 in the rDC monitoring capacitor portion MVr of the non-transmission/reception region R2.

Next, the fourth insulating layer 58 is formed on the slot metal layer. Thereafter, in the seal region Rs of the non-transmission/reception region R2, an opening portion 58*a* which exposes a part of the extended portion ME2*e* of the second measurement electrode ME2 is formed.

Thereafter, a transparent conductive film is formed on the fourth insulating layer 58, and the transparent conductive film is patterned. In this manner, the slot substrate 200A is formed.

An alignment film is applied to the surfaces of the TFT substrate 100A and the slot substrate 200A obtained as described above which are arranged on the liquid crystal layer side and subjected to a predetermined alignment treatment. The alignment treatment is, for example, a rubbing treatment or a photo alignment treatment. After a sealant with a predetermined pattern is applied to the surfaces of the TFT substrate 100A and the slot substrate 200A and bonded, the liquid crystal material is injected, for example, by a vacuum injection method. As necessary, a driving circuit is mounted or connected thereon. In this manner, a liquid crystal panel for the scanned antenna 1000A according to an embodiment of the present invention is obtained. Below, the liquid crystal panel of the scanned antenna 1000A will be referred to as a liquid crystal panel 100PA. A reflective conductive plate 65 is arranged so as to face the slot substrate 200A of the liquid crystal panel 100PA via an air layer, and a control circuit (which may include a driving circuit for the liquid crystal panel) for the scanned antenna is connected thereto to obtain the scanned antenna 1000A.

Here, a step of stabilizing the residual DC voltage described below may be performed on the liquid crystal panel 100PA manufactured as described above. The step of stabilizing the residual DC voltage may be performed until the driving circuit is mounted or connected to the liquid crystal panel 100PA, or may be performed after the mounting and connecting is completed. Naturally, after the scanned antenna 1000A is finally manufactured, a step of stabilizing the residual DC voltage may be performed.

Figure 29:
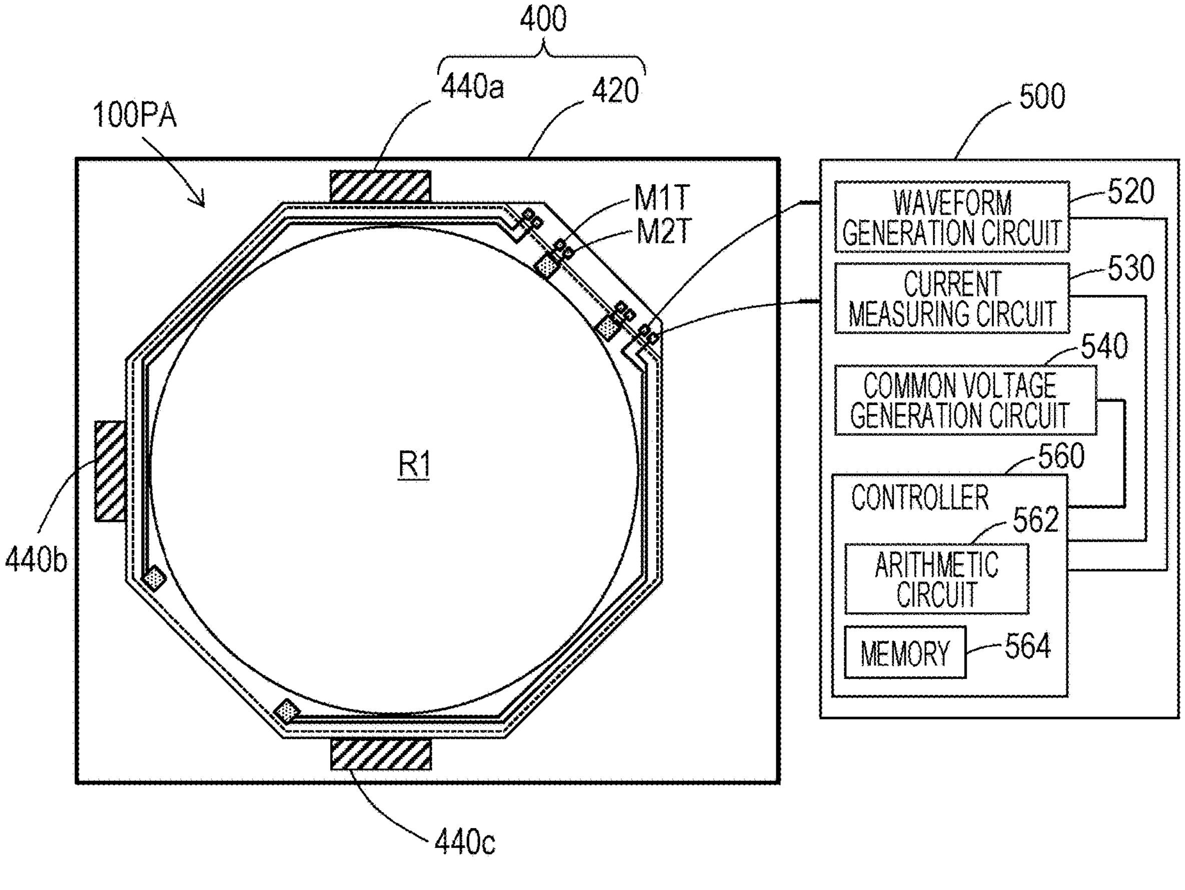
FIG. 29 is a schematic diagram showing the entire system for measuring the rDC voltage.

With reference to FIG. 29, a more detailed description will be given of the method for measuring the residual DC voltage of the scanned antenna 1000A. Below, a description will be given of an example of determining the rDC voltage in the state of the liquid crystal panel 100PA of the scanned antenna 1000A; however, the present invention is not limited thereto, and the method may be performed at an arbitrary stage after the liquid crystal panel 100PA is manufactured. In addition, it is possible to measure the rDC voltage not only for the liquid crystal panel 100PA but also for other liquid crystal devices.

FIG. 29 is a schematic view showing the entire system for determining the rDC voltage. This system has a stage 400 for receiving and stably fixing the liquid crystal panel 100PA and an rDC voltage measurement device 500. The stage 400 has a support plate 420 and a plurality of fixing jigs 440*a*, 440*b*, and 440*c* arranged at predetermined positions of the support plate 420. The plurality of fixing jigs 440*a*, 440*b*, and 440*c* are appropriately arranged according to the size of the liquid crystal panel 100PA, and the positions thereof may be movable. For example, the liquid crystal panel 100PA may be interposed between the fixing jigs 440*a* and 440*c* such that it is possible to move at least one of the fixing jigs 440*a* and 440*c* arranged so as to face each other via the liquid crystal panel 100PA. Alternatively, by omitting one of the fixing jigs 440*a* and 440*c*, the fixing jigs 440*a* or 440*c* and 440*b* which contact two sides extending in different directions of the liquid crystal panel 100PA may be used.

The rDC voltage measurement device 500 is able to apply a predetermined voltage and/or measure current in the first measurement electrode terminal portion M1T and the second measurement electrode terminal portion M2T of the monitoring capacitor portion MVr (here, each of the four monitoring capacitor portions MVr1 to MVr4) of the liquid crystal panel 100PA stably fixed at a predetermined position of the stage 400.

The rDC voltage measurement device 500 has a waveform generation circuit 520, a current measuring circuit 530, a common voltage generation circuit 540, and a controller (control circuit) 560. The controller 560 has an arithmetic circuit 562 and a memory 564, and controls the waveform generation circuit 520, the current measuring circuit 530, and the common voltage generation circuit 540.

The controller 560 may be, for example, a general-purpose computer (for example, a personal computer), and may be formed by an arithmetic circuit (processor) 562 and the memory 564 in which a program is installed so as to execute a flow (algorithm) including the steps below. The waveform generation circuit 520 may be, for example, a function generator, and the current measuring circuit 530 may be, for example, an ammeter. The common voltage generation circuit 540 is, for example, a circuit able to generate a slot voltage in a scanned antenna and a common voltage (counter voltage) for an LCD panel. The common voltage generation circuit 540 may be a DC voltage generation circuit or an oscillating voltage generation circuit.

The V-I curves of the liquid crystal capacitors shown in FIG. 23 and FIG. 24 are measured as follows, for example, using the rDC voltage measurement device 500. FIG. 23 and FIG. 24 show V-I curves measured immediately after the manufacturing of the monitoring capacitor (no voltage application) and after stress application.

It is possible for the rDC voltage measurement device 500 to apply stress and measure the rDC voltage. For example, with respect to the monitoring capacitor $C_{MVr1}$ of the liquid crystal panel 100PA, a V-I curve is generated as follows.

First, while applying a positive and negative symmetrical triangular wave voltage to one electrode (first measurement electrode ME1) of a pair of electrodes (the first measurement electrode ME1 and the second measurement electrode ME2) of the monitoring capacitor $C_{MVr1}$, the current flowing in the other electrode (the second measurement electrode ME2) is measured. The rDC voltage measurement device 500 supplies the triangular wave voltage output from the waveform generation circuit 520 to the first measurement electrode terminal portion M1T and measures the current flowing through the second measurement electrode terminal portion M2T with the current measuring circuit 530. The controller 560 controls the connection (switching) between the two terminals of the measurement device 500 and the output of the waveform generation circuit 520 and the input of the current measuring circuit 530, the waveform (frequency, amplitude) of the triangular wave voltage output from the waveform generation circuit 520, and the output timing.

The arithmetic circuit 562 generates a V-I curve from the voltage of the triangular wave voltage output from the waveform generation circuit 520 and the current value measured by the current measuring circuit 530. Here, "generates a V-I curve" means acquiring the relationship between the voltage of the triangular wave voltage and the current value over one period of the triangular wave voltage, and it is not necessary to create the V-I curve itself. As described below, it is sufficient to measure a voltage Vmax having a maximum absolute value where a current value reaches a positive maximum value or minimum value and a voltage Vmin having a maximum absolute value where a current value reaches a negative minimum value or maximum value.

In the obtained V-I curve, the arithmetic circuit 562 measures the voltage Vmax having a maximum absolute value where a current value reaches a positive maximum value or minimum value and the voltage Vmin having a maximum absolute value where a current value reaches a negative minimum value or maximum value. It is possible to carry out this step, for example, using known algorithms for measuring extreme values and known algorithms for measuring the maximum value and/or minimum value. Vmax and Vmin are temporarily stored in the memory 564, for example. Here, Vmax and Vmin may take either a positive value or a negative value.

The arithmetic circuit 562 further measures one-half of the sum of Vmax and Vmin as the residual DC voltage. The addition and division are performed using known algorithms.

The measurement device 500 may further be provided with a circuit for outputting the rDC voltage. For example, the measurement device 500 may further have a display device, and the rDC voltage may be displayed on the display device or the V-I curve may be displayed. Naturally, the above may be output to a printer or outputted to another storage device.

Figure 30:
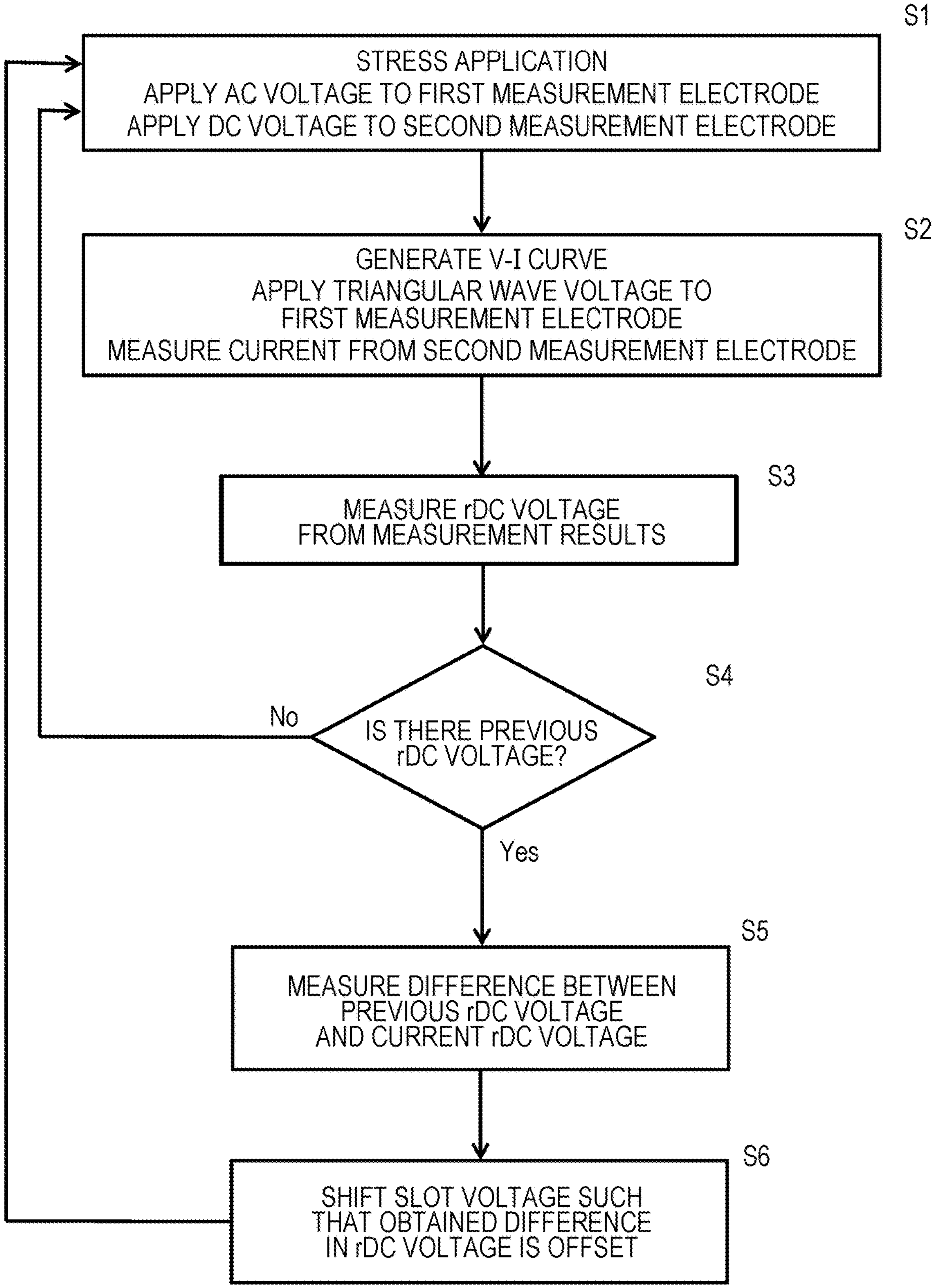
FIG. 30 is a flowchart showing an example of a flow for setting a slot voltage according to an increase in rDC voltage after stress application, using an rDC voltage measurement device 500.

It is possible to set the slot voltage according to the increase of the rDC voltage after stress application according to the flow (algorithm) shown in the flowchart of FIG. 30, for example, using the rDC voltage measurement device 500.

Immediately after the manufacturing of the monitoring capacitor, starting from step S2 of FIG. 30, the initial rDC voltage is measured. As described above, for the rDC voltage, a triangular wave voltage is applied to the first measurement electrode and the current from the second measurement electrode is measured. In step S2, the relationship between the voltage of the triangular wave voltage and the current value over one period of the triangular wave voltage is acquired (that is, a V-I curve is generated). Subsequently, in step S3, as described above, the rDC voltage is measured based on the V-I curve.

In step S4, the presence or absence of the previous rDC voltage is determined, and in the case of "no", the stress application step S1 is performed. In step S1, a voltage simulating the voltage applied to the liquid crystal layer is applied to the operation of the liquid crystal element. For example, in a case where the liquid crystal device is a scanned antenna, an AC voltage (for example, an oscillating voltage whose polarity inverts at 60 Hz) is applied to the first measurement electrode (corresponding to the patch electrode), and, for example, a DC voltage is applied to the second measurement electrode (corresponding to the slot electrode). Setting an AC voltage to a positive and negative symmetrical voltage and superimposing a DC voltage simulates a state in which a DC component is included in the voltage applied to a liquid crystal layer of an actual liquid crystal device. The times of applying the stress and/or the DC voltage are appropriately set.

After applying the stress (step S1), the rDC voltage is measured through the above steps S2 and S3. Next, in step S4, it is determined that the previous rDC voltage is "present", and in step S5, the difference between the previous rDC voltage and the current rDC voltage is measured. In step S6, the slot voltage is shifted so as to offset the difference in the obtained rDC voltages.

Thereafter, with respect to the newly set slot voltage, a DC voltage to be applied to the second measurement electrode is set. Typically, the DC voltage is shifted by as much as the slot voltage is shifted. Thereafter, steps S1 to S6 are repeated.

In this manner, it is possible to measure changes over time in the rDC voltage. For example, it is possible to evaluate the difference in the magnitude of the rDC voltage and the difference in the changes over time due to the difference in liquid crystal material.

Figure 31:
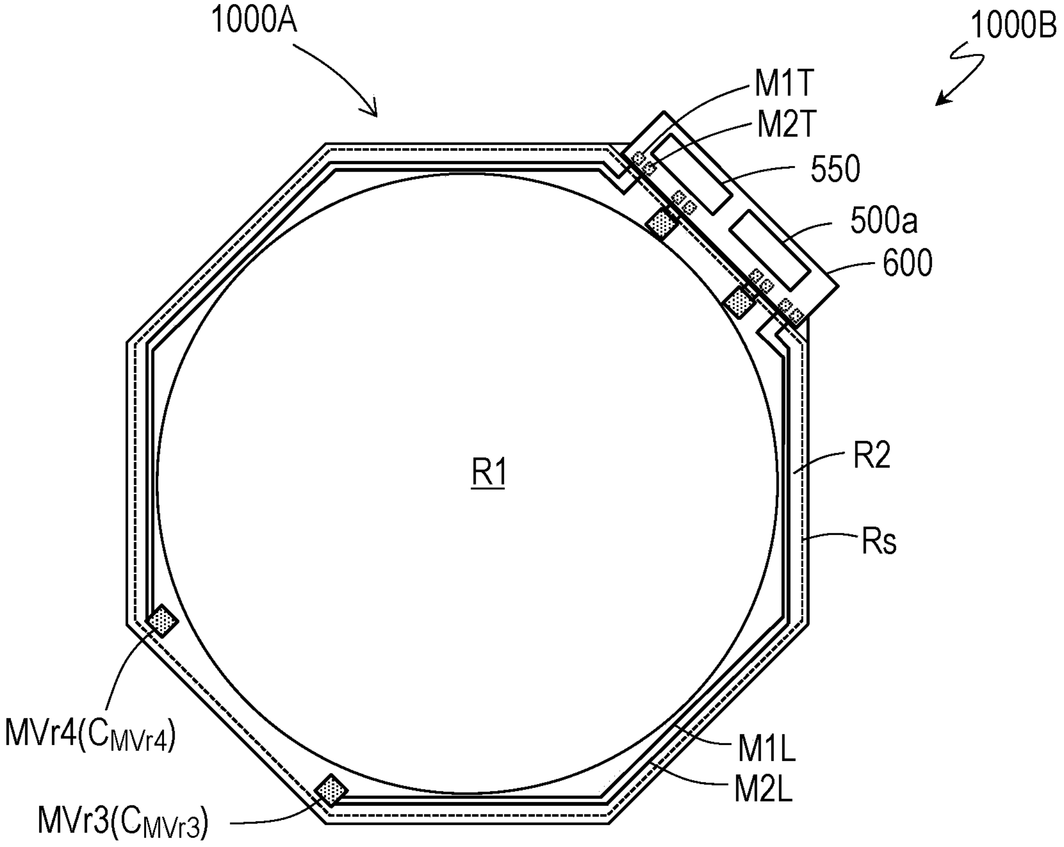
FIG. 31 is a schematic plan view showing another scanned antenna 1000B according to an embodiment of the present invention.

An rDC voltage measurement circuit having substantially the same function as the rDC voltage measurement device 500 shown in FIG. 29 may be mounted or formed on a circuit substrate 600 shown in FIG. 31, for example.

The scanned antenna 1000B shown in FIG. 31 has the scanned antenna 1000A and the circuit substrate 600. The circuit substrate 600 has a scanned antenna driving circuit 550 and an rDC voltage measurement circuit 500*a*. The rDC voltage measurement circuit 500*a* of the circuit substrate 600 has substantially the same configuration as the rDC voltage measurement device 500 shown in FIG. 29. That is, the circuit substrate 600 has the driving circuit (including a gate driver, a source driver, and a common voltage adjusting circuit (slot voltage adjusting circuit)) for supplying predetermined signals to be supplied to the source bus line, the gate bus line, and the slot electrode of the scanned antenna) 550, and an rDC voltage measurement circuit 500*a* including the waveform generation circuit 520, the current measuring circuit 530 and the common voltage generation circuit 540 described above, and the controller (control circuit) 560. These circuits may be implemented, for example, as ICs. Each circuit may be a known circuit. For example, the current measuring circuit 530 may be a known current measuring circuit using a shunt resistor. Although an example in which the circuit substrate 600 has the driving circuit 550 and the rDC voltage measurement circuit 500*a* was illustrated, the above may be provided separately in a plurality of circuit substrates. In addition, a part of these circuits may be monolithically formed on, for example, a TFT substrate of the scanned antenna 1000A.

Since the scanned antenna 1000B shown in FIG. 31 has the rDC voltage measurement circuit 500*a*, it is possible to optimize the slot voltage according to the change in the rDC voltage.

That is, the scanned antenna 1000B is further provided with a driving circuit 550 and an rDC voltage measurement circuit 500*a*, and the driving circuit 550 and the rDC voltage measurement circuit 500*a* are formed so as to execute a step of generating a V-I curve by applying a positive and negative symmetrical triangular wave voltage to one electrode of the pair of electrodes of the monitoring capacitor and measuring the current flowing in the other electrode, a step of measuring a voltage Vmax having a maximum absolute value where a current value reaches a positive maximum value or minimum value in the V-I curve and a voltage Vmin having a maximum absolute value where a current value reaches a negative minimum value or maximum value, a step of measuring one-half of the sum of the Vmax and Vmin as the residual DC voltage, and a step of setting a common voltage (slot voltage) to be supplied to the plurality of liquid crystal capacitors in the active region so as to offset the residual DC voltage.

A description will be given of a method for driving the scanned antenna 1000B with reference to the flowchart of FIG. 32. The arithmetic circuit (processor) 562 of the controller (control circuit) 560 executes the process of each step or controls the driving circuit 550 and the rDC voltage measurement circuit 500*a* according to the flow (algorithm) shown in the flowchart of FIG. 32.

First, the scanned antenna 1000B stores the rDC voltage measured by the above-described method as the initial rDC voltage (step S11). The slot voltage is set so as to offset this rDC voltage. If the difference between the rDC voltage and the slot voltage is set to 100 mV or less, the rDC voltage is substantially offset. If the difference between the rDC voltage and the common voltage in the LCD panel is 100 mV or less, since flickering is not visually recognized with driving at 60 Hz, it may be considered that 100 mV is the upper limit of the difference between the rDC voltage and the common voltage. However, since the liquid crystal material used for the scanned antenna 1000B deteriorates more easily than the liquid crystal material used for the LCD panel, the difference between the rDC voltage and the slot voltage is preferably 50 mV or less, and more preferably 20 mV or less. Typically, the slot voltage is set to a DC voltage having the same value as the rDC voltage. This step is the same as for the LCD and the like of the related art except for the method for measuring the rDC voltage.

The initially set scanned antenna 1000B performs a normal operation (step S12). That is, the scanned antenna 1000B is driven by a normal driving method. During this time, the liquid crystal material deteriorates and the rDC voltage rises. Therefore, in the driving method according to the present embodiment, the V-I curve is generated (step S13) by the above method, and the rDC voltage is measured based on the measurement result (step S14).

Next, the difference between the stored rDC voltage and the currently obtained rDC voltage is measured, and the rDC voltage obtained this time is stored (step S15). At this time, the initially set rDC voltage may be overwritten or the new rDC voltage may be separately stored. In addition, the step of storing a new rDC voltage may be performed in step S16 as described below.

Next, the slot voltage is shifted so as to offset the difference in the obtained rDC voltages (step S16). For example, the slot voltage is shifted by the same value as the difference between the obtained rDC voltages. Here, other processes may be used as long as it is possible to set the value of the slot voltage such that the difference between the rDC voltage and the value of the slot voltage at this point is 100 mV or less.

Figure 32:
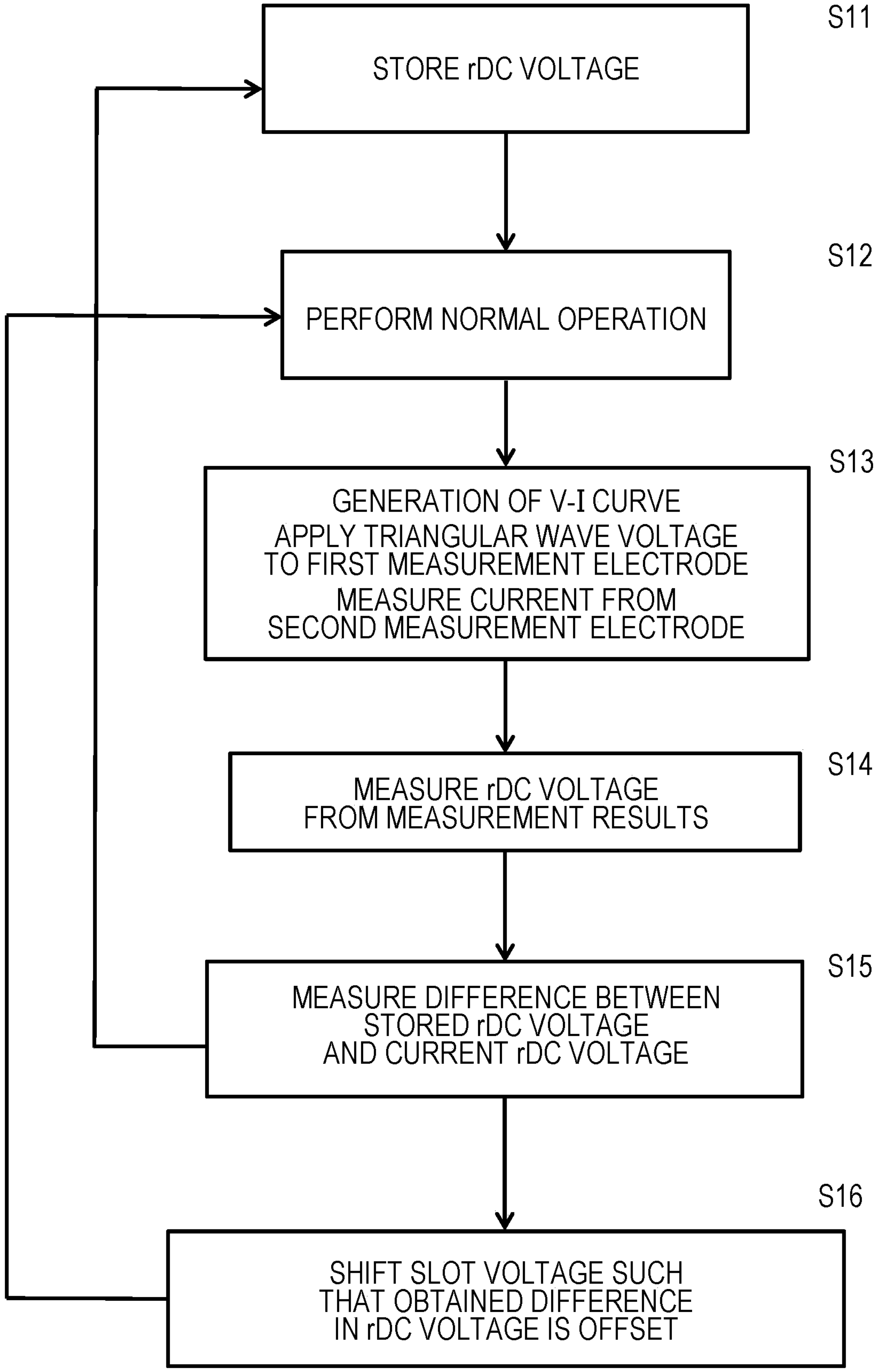
FIG. 32 is a flowchart for illustrating a driving method for the scanned antenna 1000B.

The flow shown in FIG. 32 is repeated as necessary. It is possible to set the timing of the repetition, that is, the timing at which step S13 is performed as appropriate. For example, changes in the rDC voltage in the scanned antenna 1000B are measured in advance, for example, the time of the normal operation (step S12) may be set such that the absolute value of the rDC voltage does not increase by more than 10 mV (such that the difference in the rDC voltage measured in step S15 does not exceed 10 mV). Alternatively, in consideration of safety, step S13 may be performed every time a relatively short time passes (for example, one hour). In this case, the scanned antenna 1000B has, for example, a circuit for measuring and/or integrating the time during which the normal operation is performed, or a circuit for counting and/or integrating the number of frames when performing the normal operation.

Measurement of the rDC voltage may be performed using a separately provided monitoring capacitor or may be performed using the liquid crystal capacitor of the active region. That is, with respect to a group of two or more liquid crystal capacitors adjacent to each other among the liquid crystal capacitors of the plurality of antenna units in the active region of the scanned antenna, the V-I curve may be generated by applying a positive and negative symmetrical triangular wave voltage to one electrode (patch electrode) of all of the two or more liquid crystal capacitors of the group and measuring the current flowing in the other electrode (slot electrode). Here, in a case of measuring the rDC voltage using the liquid crystal capacitor in the active region, it is necessary to stop the normal operation while performing step S13 in FIG. 32.

On the other hand, in a case where a separately provided monitoring capacitor is used, it is possible to generate a V-I curve without stopping the normal operation. However, during the period in which the step of generating the V-I curve is not performed with respect to the monitoring capacitor, while the voltage is applied to any of the plurality of liquid crystal capacitors of the active region, it is preferable to further include a step of applying a voltage of an average value or a voltage of a maximum value applied to the plurality of liquid crystal capacitors of the active regions in the monitoring capacitor. Since the degree of deterioration of the liquid crystal material and the degree of increase in the rDC voltage change depending on the magnitude and time of the voltage applied to the liquid crystal layer, it is preferable to apply the same voltage application history as the liquid crystal layer of the liquid crystal capacitor of the active region, to the liquid crystal layer of the monitoring capacitor. It is possible to set whether to use the average value or the maximum value as appropriate. The average value or the maximum value voltage of the voltages applied to the plurality of liquid crystal capacitors is measured by the arithmetic circuit 562 according to a known algorithm. In a case of using the average value, it is possible to obtain an advantage in that it is possible to determine a condition close to the optimum condition at that point in time, and, in a case of using the maximum value, since the condition is close to the optimum in the long-term use, it is possible to obtain an advantage in that deterioration in the antenna characteristic is not conspicuous.

Adopting the driving method according to the above embodiment of the present invention makes it possible to suppress a change in the characteristics of the scanned antenna (for example, a change in resonance frequency) accompanying an increase in the rDC voltage. In addition, since the DC voltage applied to the liquid crystal layer is lowered, it is possible to suppress electrolysis of the liquid crystal material. That is, it is possible to improve the reliability of the scanned antenna.

Figure 33:
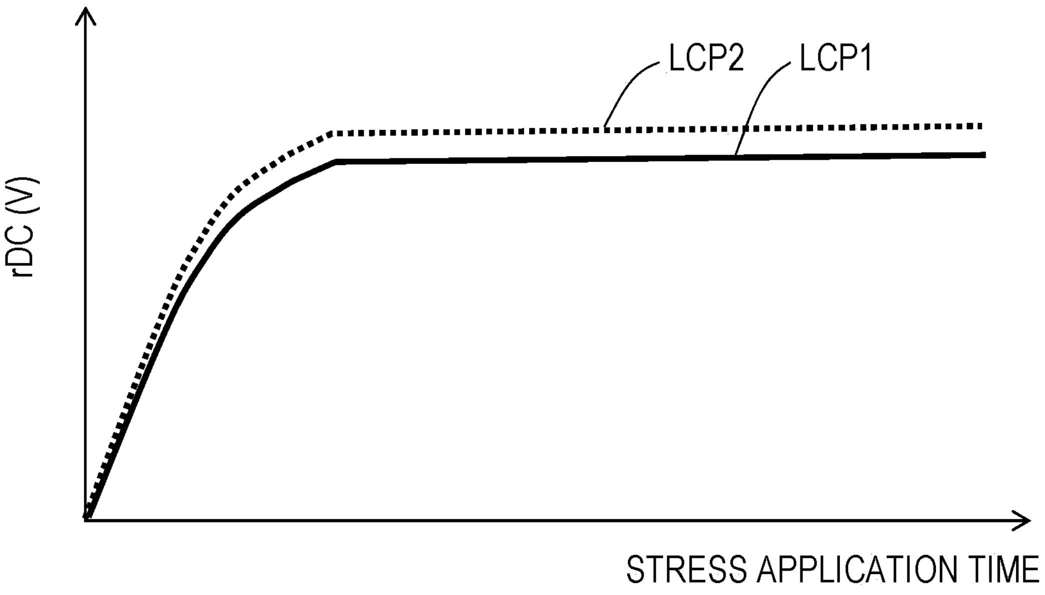
FIG. 33 is a graph schematically showing the stress application time dependence of rDC voltages of liquid crystal panels LCP 1 and LCP 2 used in a scanned antenna.

FIG. 33 is a graph schematically showing the stress application time dependence of the rDC voltages of the liquid crystal panels LCP 1 and LCP 2 used for the scanned antenna. The horizontal axis represents the stress application time, and the vertical axis represents the rDC voltage. The liquid crystal panels LCP 1 and LCP 2 have different types of liquid crystal materials used therein. For the stress, for example, in the same manner as the description with reference to FIG. 23, a 60 Hz rectangular wave AC voltage of 5 V DC voltage and amplitude of ±3 V is applied to a pair of electrodes. The frequency of the triangular wave voltage used for measuring the rDC voltage is, for example, 10 Hz and the amplitude is ±10 V, for example.

The types of liquid crystal materials used for the scanned antenna are different, and as shown generally in FIG. 33, the rDC voltage initially increases greatly and reaches the saturation value in a comparatively short time. For example, under the above stress conditions, saturation reaches approximately 2 hours regardless of the liquid crystal material.

Using the fact that the rDC voltage of the liquid crystal material used for the scanned antenna reaches the saturation value in a comparatively short time, the step of stabilizing the residual DC voltage may be performed after manufacturing the liquid crystal panel 100 for the scanned antenna (before product shipment).

Figure 34:
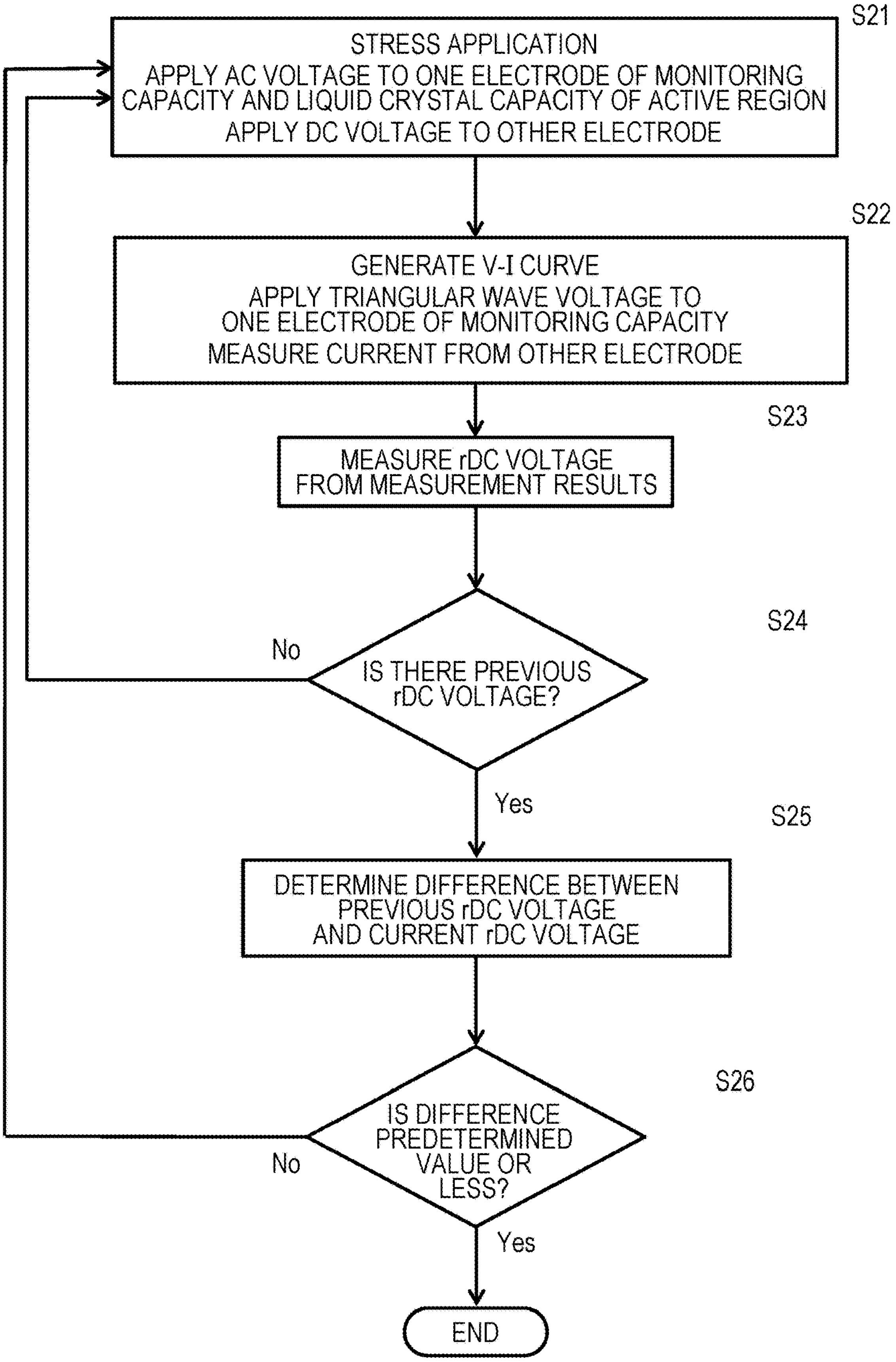
FIG. 34 is a flowchart showing an example of a flow of steps for stabilizing the residual DC voltage.

The stabilization step may be executed according to the flow (algorithm) shown in the flowchart of FIG. 34, for example.

First, while applying an AC voltage whose polarity is inverted to one electrode of a pair of electrodes of each of the monitoring capacitor and the plurality of liquid crystal capacitors of the active region, a DC voltage is applied to the other electrode (step S21). Thereafter, a V-I curve is generated by applying positive and negative symmetrical triangular wave voltages to one electrode of the monitoring capacitor and measuring the current flowing in the other electrode (step S22). In the V-I curve, the voltage Vmax having a maximum absolute value where a current value reaches a positive maximum value or a minimum value and a voltage Vmin having a maximum absolute value where a current value reaches a negative minimum value or a maximum value are measured, and one half of the sum of Vmax and Vmin is measured as the residual DC voltage (step S23). Next, the presence or absence of the previous rDC voltage is determined, and in the case of "absence", the stress application step S21 is performed (step S24). When the previous rDC voltage is "present", the difference between the previous residual DC voltage and the current residual DC voltage is determined (step S25). Next, it is determined whether or not the difference is a predetermined value or less (step S26). The above steps S21 to S26 are repeated until this determination result becomes positive. The predetermined value is set, for example, such that the difference in the rDC voltage determined in step S25 is 10 mV or less. The DC voltage applied in the stress application step S21 may be constant for a plurality of times of repetition or may be changed such that substantially the same DC voltage is applied in accordance with the change in the rDC voltage.

Naturally, it is also possible to determine in advance a stress applying condition at which the rDC voltage reaches saturation by using the monitoring capacitor and the stress of the condition may be applied to the liquid crystal capacitor of the active region of the scanned antenna liquid crystal panel. In this case, it is not always necessary to provide a monitoring capacitor on the scanned antenna liquid crystal panel. That is, as shown in FIG. 23, if it is known beforehand through an experiment using a monitoring capacitor prepared separately from the scanned antenna liquid crystal panel that the rDC voltage reaches saturation under certain stress application conditions, the stress of the same conditions may be applied to the liquid crystal capacitor of the active region of the scanned antenna liquid crystal panel. At this time, the scanned antenna liquid crystal panel may be so-called static driving. A signal voltage for turning on TFTs may be applied to all the gate bus lines, a predetermined AC voltage may be supplied from the source bus line, and a predetermined DC voltage may be supplied to the slot electrodes.

The scanned antenna according to the embodiment of the present invention is accommodated in a housing made of plastic, for example, as necessary. It is preferable to use a material having a small dielectric constant $\varepsilon_M$ which does not influence the microwave transmission/reception in the housing. In addition, a through hole may be provided in a portion corresponding to the transmission/reception region R1 of the housing. Furthermore, a light shielding structure may be provided such that the liquid crystal material is not exposed to light. The light shielding structure is provided, for example, so as to shield light propagating through the inside of the dielectric substrate 1 and/or 51 from the side surface of the dielectric substrate 1 of the TFT substrate 101 and/or the dielectric substrate 51 of the slot substrate 201 to be incident on the liquid crystal layer. A liquid crystal material having a large dielectric anisotropy $\Delta\varepsilon_M$ is prone to photodegradation, and it is preferable to shield not only ultraviolet rays but also short-wavelength blue light in visible light. It is possible to easily form the light shielding structure at a required position by using a light shielding tape such as a black adhesive tape, for example.

The liquid crystal capacitor of the active region of the scanned antenna and the monitoring capacitor are preferably the same not only for the application history of the voltage but also for the history of exposure to light. Naturally, it is preferable that not only the active region of the scanned antenna but also the monitoring capacitor be shielded.

INDUSTRIAL APPLICABILITY

Embodiments according to the present invention are used for, for example, a liquid crystal device such as a scanned antenna for satellite communication or satellite broadcasting to be mounted on a moving body (for example, a ship, an airplane, or an automobile), a method for measuring a residual DC voltage in a liquid crystal device, a method for driving a liquid crystal device, and a method for manufacturing a liquid crystal device.

REFERENCE SIGNS LIST

1 DIELECTRIC SUBSTRATE
2 BASE INSULATING FILM
3 GATE ELECTRODE
4 GATE INSULATING LAYER
5 SEMICONDUCTOR LAYER
6D DRAIN CONTACT LAYER
6S SOURCE CONTACT LAYER
7D DRAIN ELECTRODE
7S SOURCE ELECTRODE
7*p* SOURCE CONNECTION WIRING
11 FIRST INSULATING LAYER
15 PATCH ELECTRODE
15*p* PATCH CONNECTION PORTION
15*pt* TRANSFER TERMINAL CONNECTION PORTION
17 SECOND INSULATING LAYER
18*g*, 18*s*, 18*p* OPENING PORTION
19*g* GATE TERMINAL UPPER CONNECTION PORTION
19*p* TRANSFER TERMINAL UPPER CONNECTION PORTION
19*s* SOURCE TERMINAL UPPER CONNECTION PORTION
21 ALIGNMENT MARK
23 PROTECTIVE CONDUCTIVE LAYER
51 DIELECTRIC SUBSTRATE
52 THIRD INSULATING LAYER
54 DIELECTRIC LAYER (AIR LAYER)
55 SLOT ELECTRODE
55L LOWER LAYER
55M MAIN LAYER
55U UPPER LAYER
55*c* CONTACT SURFACE
57 SLOT
58 FOURTH INSULATING LAYER
60 UPPER CONNECTION PORTION
65 REFLECTIVE CONDUCTIVE PLATE
67 ADHESIVE LAYER
68 HEATER RESISTANCE FILM
70 POWER SUPPLY DEVICE
71 CONDUCTIVE BEAD
72 POWER SUPPLY PIN
73 SEAL PORTION
100PA, 100Pa, 100Pb LIQUID CRYSTAL PANEL
101, 102, 103, 104 TFT SUBSTRATE
201, 203 SLOT SUBSTRATE
400 STAGE
420 SUPPORT PLATE
440*a*, 440*b* FIXING JIG
500 rDC VOLTAGE MEASUREMENT DEVICE
500*a* rDC VOLTAGE MEASUREMENT CIRCUIT
520 WAVEFORM GENERATION CIRCUIT
530 CURRENT MEASURING CIRCUIT
540 COMMON VOLTAGE GENERATION CIRCUIT
550 DRIVING CIRCUIT
560 CONTROLLER
562 ARITHMETIC CIRCUIT
564 MEMORY
600 CIRCUIT SUBSTRATE
1000, 1000A, 1000B SCANNED ANTENNA
CH1, CH2, CH3, CH4, CH5, CH6 CONTACT HOLE
CMVr, CMVr1, CMVr2, CMVr3, CMVr4 MONITORING CAPACITOR
GD GATE DRIVER
GL GATE BUS LINE
GT GATE TERMINAL PORTION
M1L FIRST MEASUREMENT ELECTRODE CONNECTION PORTION (CONNECTION WIRE)
M2L SECOND MEASUREMENT ELECTRODE CONNECTION PORTION (CONNECTION WIRE)

M1T FIRST MEASUREMENT ELECTRODE TERMINAL PORTION
M2T SECOND MEASUREMENT ELECTRODE TERMINAL PORTION
M2P MEASUREMENT ELECTRODE TRANSFER PORTION
M2PT MEASUREMENT ELECTRODE TRANSFER TERMINAL PORTION
M2T SECOND MEASUREMENT ELECTRODE TERMINAL PORTION
ME1 FIRST MEASUREMENT ELECTRODE
ME2 SECOND MEASUREMENT ELECTRODE
ME2*e* EXTENDED PORTION
MVr, MVr1, MVr2, MVr3, MVr4 rDC MONITORING CAPACITOR PORTION
SD SOURCE DRIVER
SL SOURCE BUS LINE
ST SOURCE TERMINAL PORTION
PT TRANSFER TERMINAL PORTION
IT TERMINAL PORTION
LC LIQUID CRYSTAL LAYER
R1 TRANSMISSION/RECEPTION REGION
R2 NON-TRANSMISSION/RECEPTION REGION
Rs SEAL REGION
U, U1, U2 ANTENNA UNIT, ANTENNA UNIT REGION

The invention claimed is:

1. A method for measuring a residual DC voltage in a liquid crystal device including a first substrate, a second substrate, a liquid crystal layer provided between the first substrate and the second substrate, a seal portion surrounding the liquid crystal layer, an active region having a plurality of liquid crystal capacitors and a plurality of TFTs each connected to one of the plurality of liquid crystal capacitors, and a non-active region positioned in a region outside the active region and having at least one monitoring capacitor, the plurality of liquid crystal capacitors and the at least one monitoring capacitor including the liquid crystal layer, the method comprising:

a step of generating a V-I curve by applying a positive and negative symmetrical triangular wave voltage to one of a pair of electrodes of the at least one monitoring capacitor and measuring a current flowing through the other of the pair of electrodes;

a step of measuring, in the V-I curve, a voltage Vmax having a maximum absolute value where a current value reaches a positive maximum value or minimum value, and a voltage Vmin having a maximum absolute value where a current value reaches a negative minimum value or maximum value; and a step of measuring one-half of a sum of the voltage Vmax and the voltage Vmin as the residual DC voltage.

2. The method for measuring a residual DC voltage according to claim 1, wherein an area of a portion of the liquid crystal layer included in the at least one monitoring capacitor is 25 $mm^2$ or more.

3. The method for measuring a residual DC voltage according to claim 1, wherein the at least one monitoring capacitor is arranged at a position closer to the seal portion than the active region.

4. The method for measuring a residual DC voltage according to claim 1, wherein the at least one monitoring capacitor includes two monitoring capacitors arranged to face each other with the active region in between.

5. The method for measuring a residual DC voltage according to claim 1, wherein the liquid crystal device is a scanned antenna, the scanned antenna has a plurality of antenna units, and each of the plurality of antenna units has one corresponding liquid crystal capacitor in the plurality of liquid crystal capacitors.

6. The method for measuring a residual DC voltage according to claim 1, wherein a frequency of the triangular wave voltage is 0.01 Hz or more and 100 Hz or less.

7. The method for measuring a residual DC voltage according to claim 1, wherein an absolute value of an amplitude of the triangular wave voltage is 1 V or more and 10 V or less.

8. A method for measuring a residual DC voltage in a liquid crystal device including a first substrate, a second substrate, a liquid crystal layer provided between the first substrate and the second substrate, a seal portion surrounding the liquid crystal layer, a plurality of liquid crystal capacitors, and a plurality of TFTs each connected to one of the plurality of liquid crystal capacitors, the plurality of liquid crystal capacitors including the liquid crystal layer, the method comprising:

a step of generating a V-I curve for a group of two or more liquid crystal capacitors adjacent to each other out of the plurality of liquid crystal capacitors by applying positive and negative symmetrical triangular wave voltages to all of one of electrodes of the two or more liquid crystal capacitors of the group and measuring a current flowing through the other of the electrodes;

a step of measuring, in the V-I curve, a voltage Vmax having a maximum absolute value where a current value reaches a positive maximum value or minimum value, and a voltage Vmin having a maximum absolute value where a current value reaches a negative minimum value or maximum value; and a step of measuring one-half of a sum of the voltage Vmax and the voltage Vmin as the residual DC voltage.

* * * * *